United States Patent
Shibata et al.

[11] Patent Number: 5,970,238
[45] Date of Patent: Oct. 19, 1999

[54] METHOD AND APPARATUS FOR GENERATING PLANARIZING PATTERN AND SEMICONDUCTOR INTEGRATED CIRCUIT DEVICE

[75] Inventors: Hidenori Shibata; Kazuo Tsuzuki, both of Osaka, Japan

[73] Assignee: Matsushita Electric Industrial Co., Ltd., Osaka, Japan

[21] Appl. No.: 08/816,536

[22] Filed: Mar. 13, 1997

[30] Foreign Application Priority Data

Mar. 14, 1996 [JP] Japan .................................. 8-057243

[51] Int. Cl.$^6$ ....................................... G06F 17/50
[52] U.S. Cl. ................ 395/500.09; 395/500.14; 438/626; 438/631; 438/645; 438/697
[58] Field of Search ..................... 364/488–491, 364/578; 438/626, 631, 645, 697; 395/500.09, 500.1, 500.11, 500.2, 500.21, 500.22, 500.14

[56] References Cited

U.S. PATENT DOCUMENTS

| | | | |
|---|---|---|---|
| 5,341,310 | 8/1994 | Gould et al. | 364/491 |
| 5,459,093 | 10/1995 | Kuroda et al. | 437/47 |
| 5,488,007 | 1/1996 | Kim et al. | 437/47 |
| 5,798,298 | 8/1998 | Yang et al. | 438/622 |

FOREIGN PATENT DOCUMENTS

| | | | |
|---|---|---|---|
| 5-267460 | 10/1993 | Japan | H01L 21/82 |
| 6-061230 | 3/1994 | Japan | H01L 21/3205 |
| 6-61230 | 3/1994 | Japan | H01L 21/3205 |
| 8-160590 | 6/1996 | Japan | G03F 1/00 |

OTHER PUBLICATIONS

PTO 99–0312 (Translation of Japanese Patent Publication, Document No. 5–267,460, invented by Kitsukawa, published Oct. 15, 1993, translated Nov. 1998 by Schreiber Translations, Inc., 12 pages).

PTO 99–0311 (Translation of Japanese Patent, Document No. 8–160590, invented by Motoyama et al., published Jun. 21, 1996, translated by Schreiber Translations, Inc., 37 pages), Nov. 1998.

PTO 99–0391 (Translation of Japanese Published Unexamined (Kokai) Patent Application No. 6–61230, invented by Yamawaki, published Mar. 4, 1994, translated by Chisato Morohashi, USPTO Translation Branch, 7 pages), Nov. 5, 1998.

*Primary Examiner*—Kevin J. Teska
*Assistant Examiner*—Phallaka Kik
*Attorney, Agent, or Firm*—McDermott, Will & Emery

[57] ABSTRACT

A dummy pattern is generated by enlarging a wiring pattern by a specified amount to generate an enlarged wiring pattern and deleting the overlapping portion of a first dummy original pattern composed of a group of squares with the enlarged wiring pattern. The dummy pattern is reduced by the specified amount to generate a reduced dummy pattern, which is enlarged by the specified amount to generate a planarizing pattern. The planarizing pattern is combined with the wiring pattern to generate a final pattern.

23 Claims, 43 Drawing Sheets

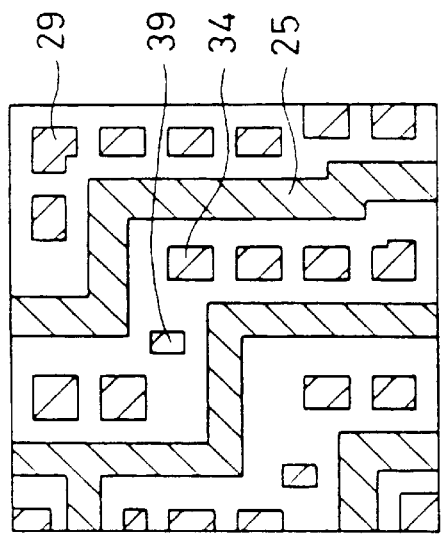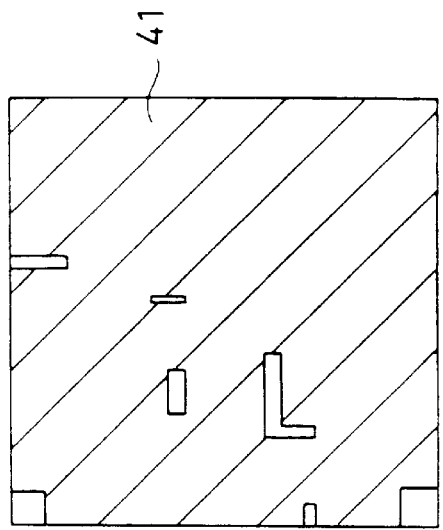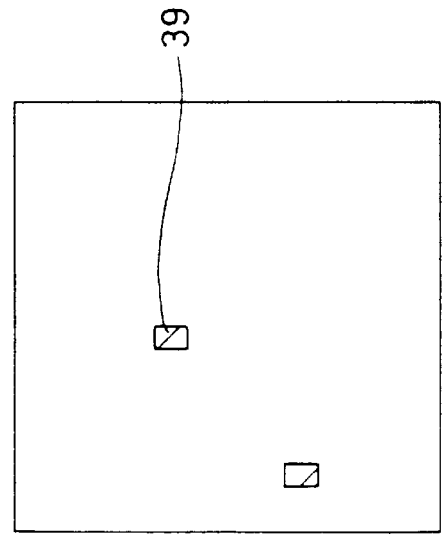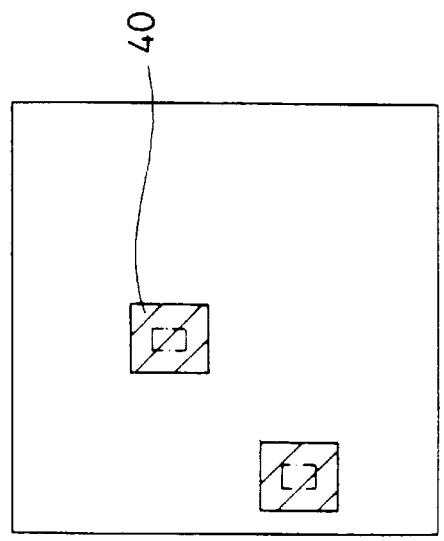

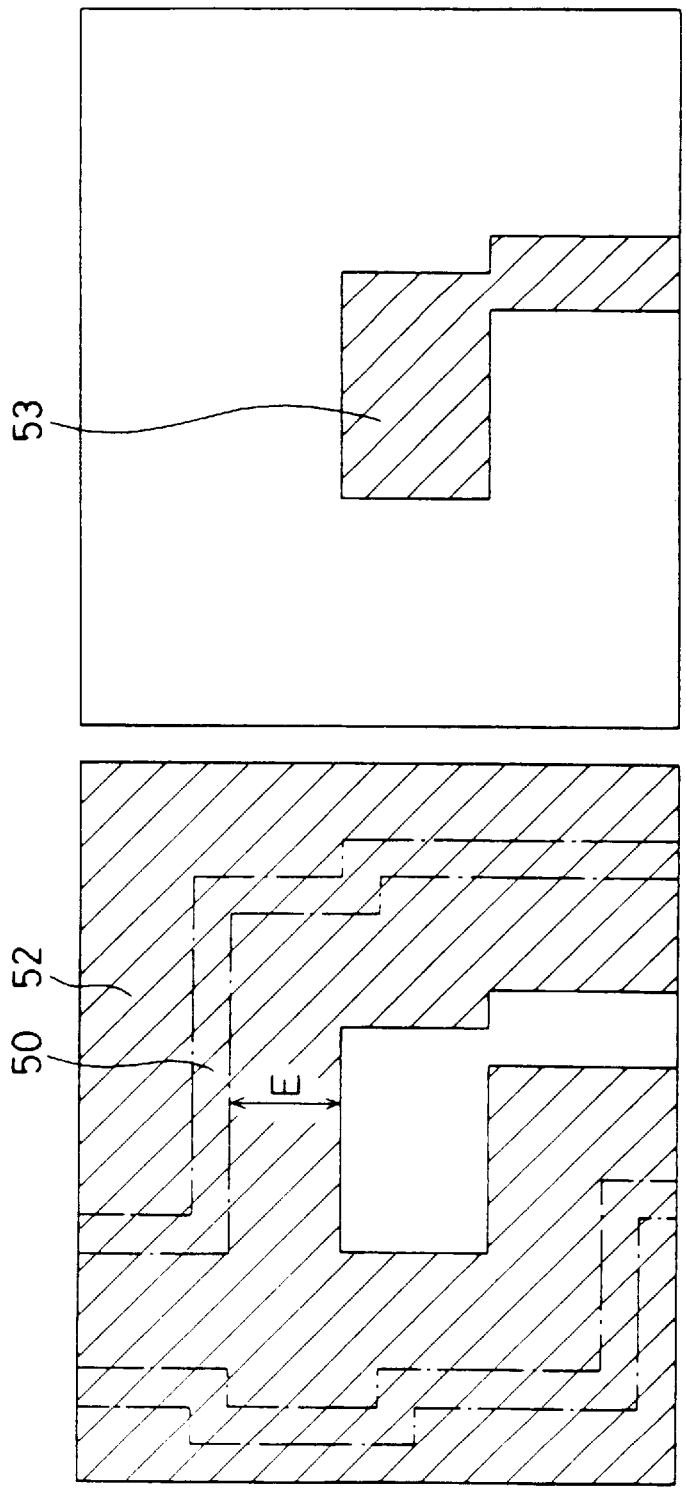

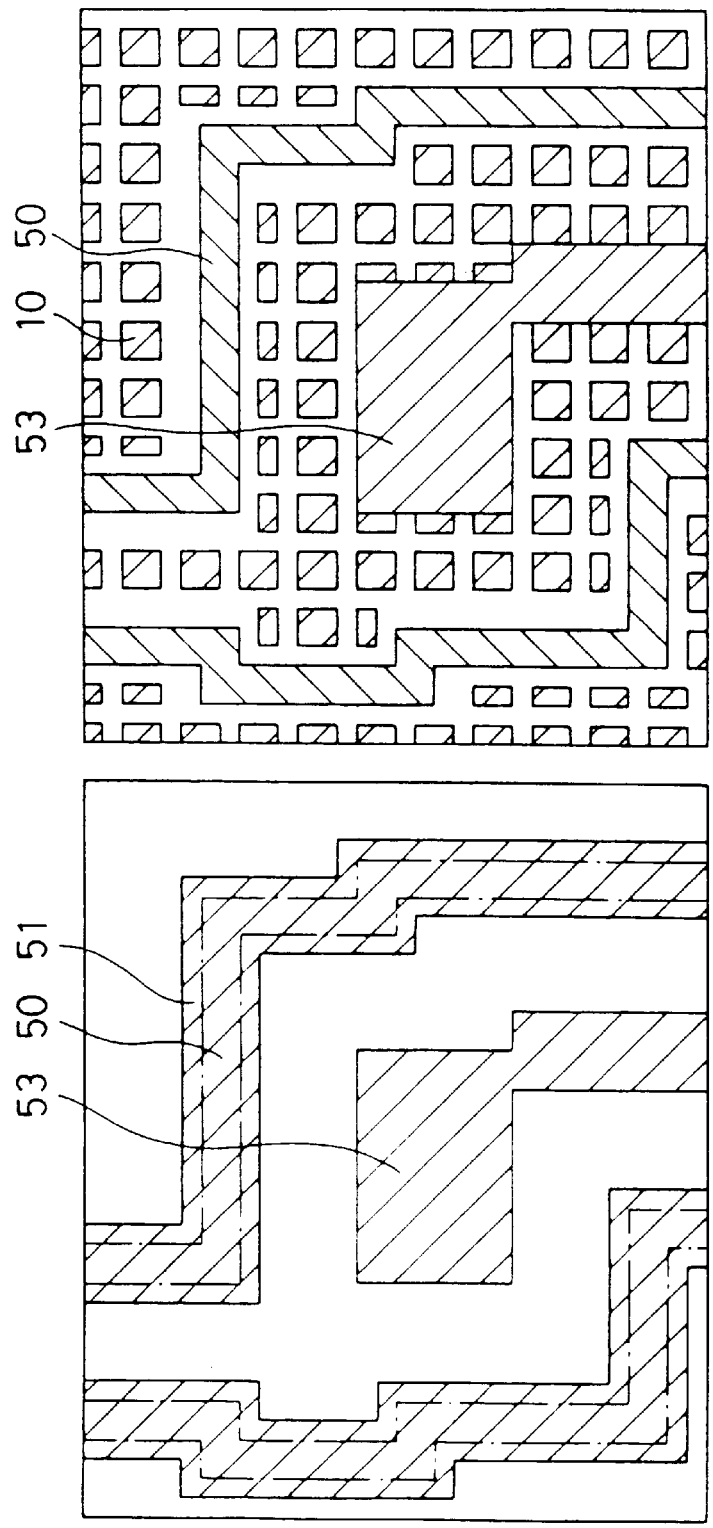

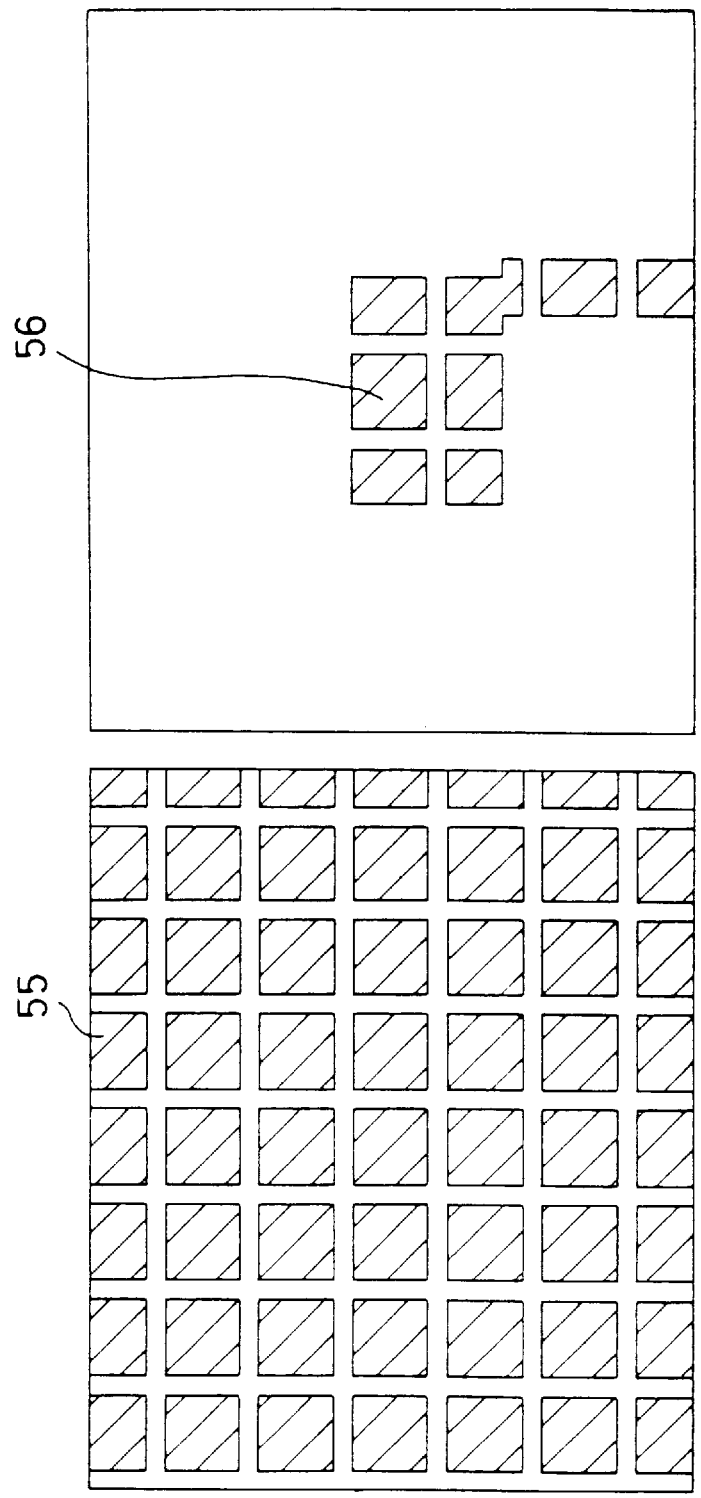

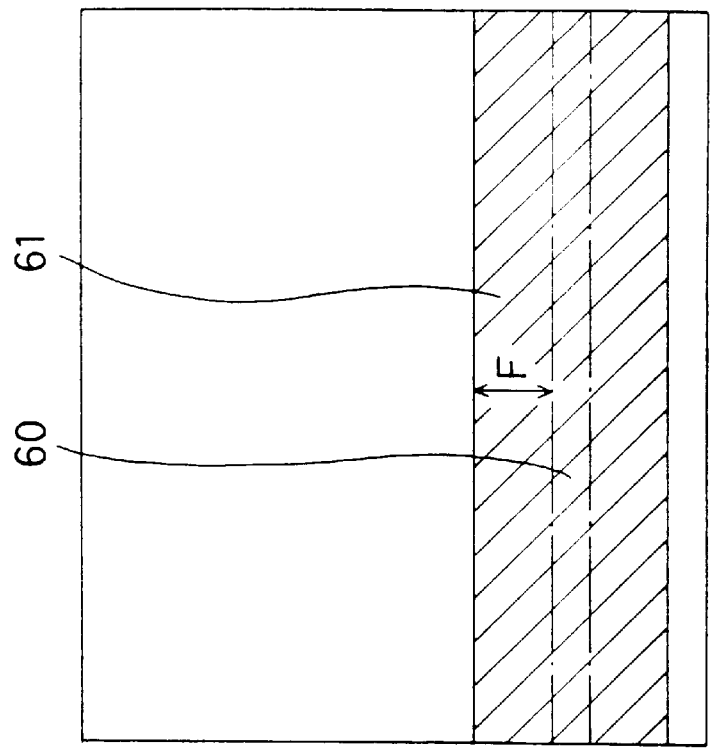
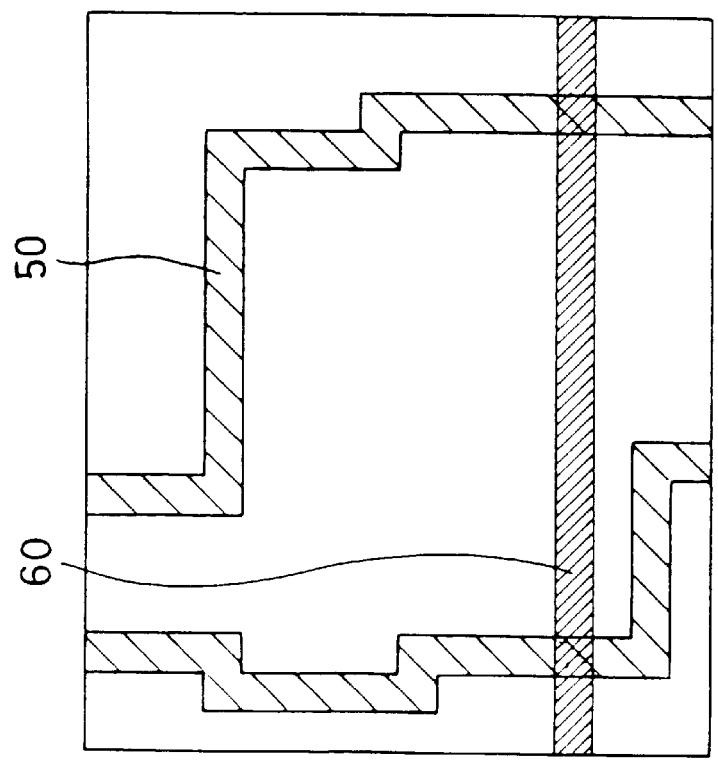

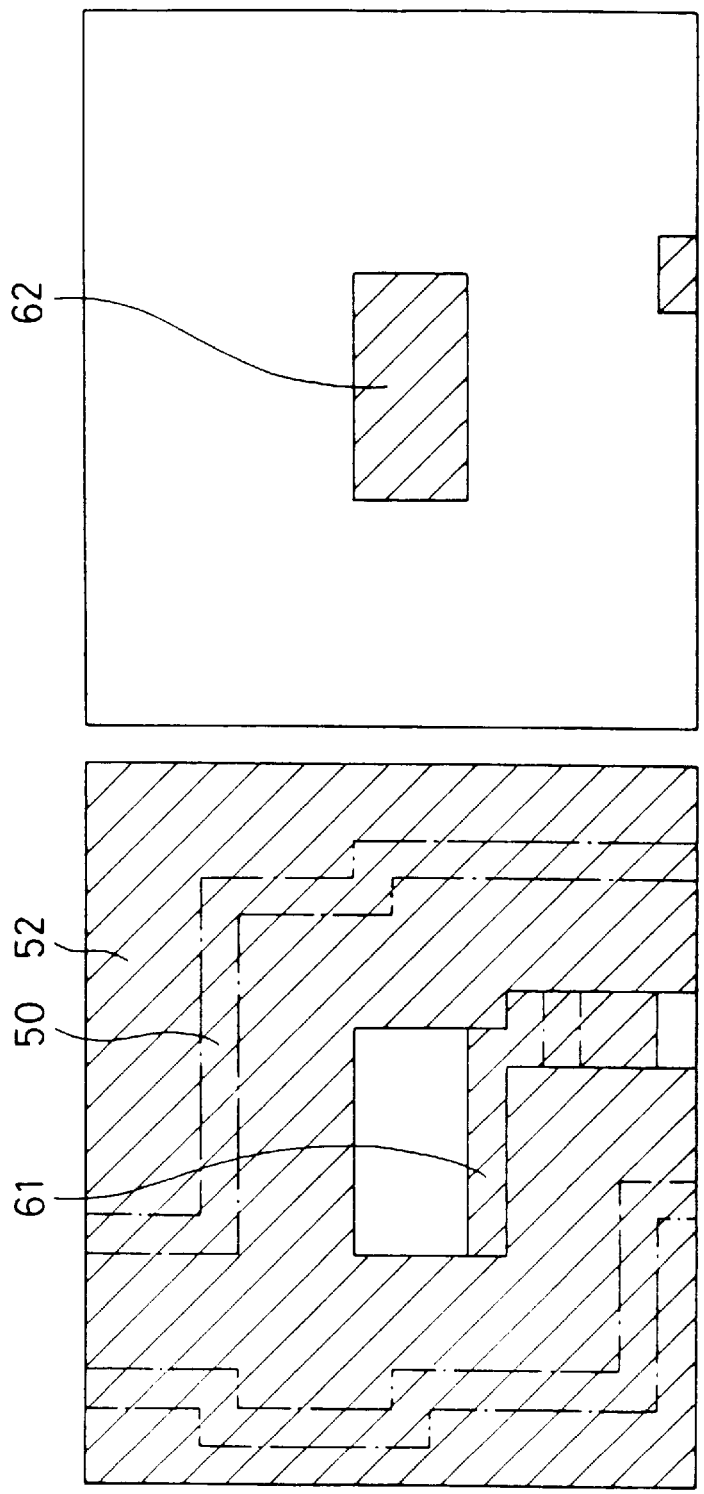

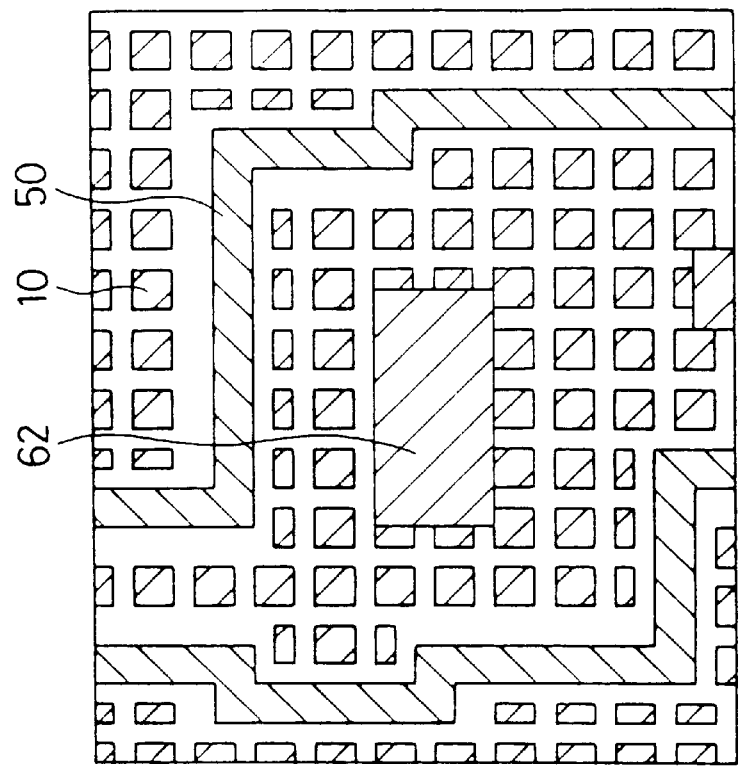
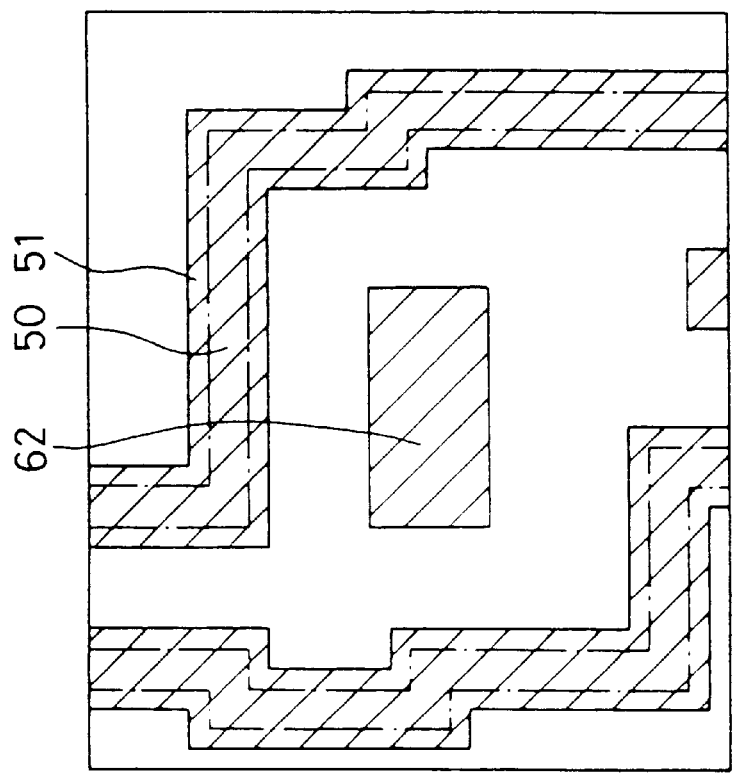
Fig. 17(b)
Fig. 17(a)

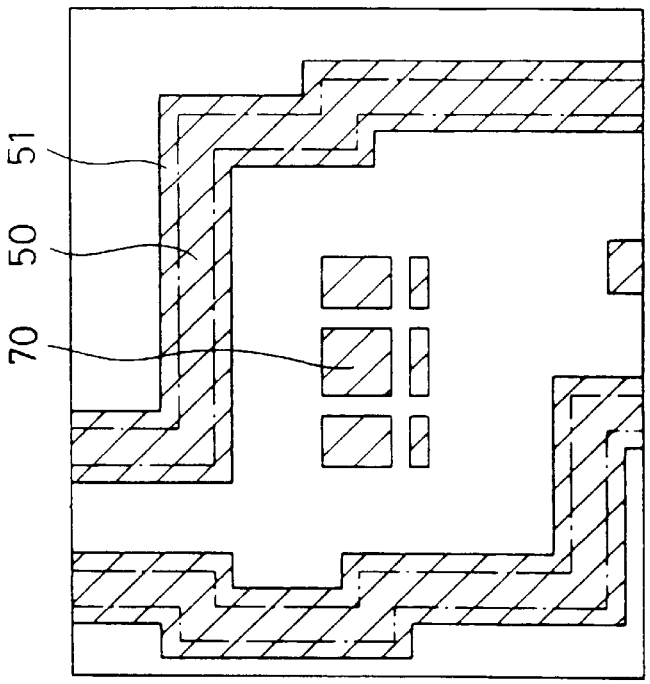
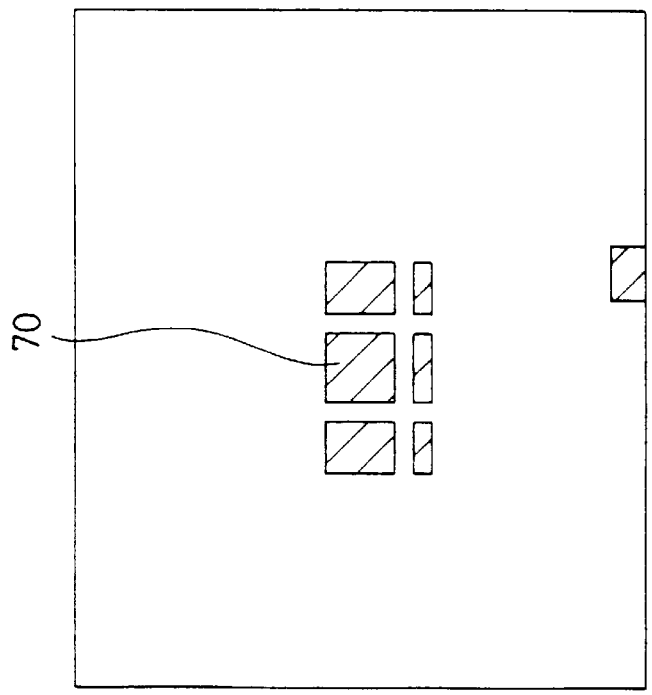
Fig. 18(b)
Fig. 18(a)

METHOD AND APPARATUS FOR GENERATING PLANARIZING PATTERN AND SEMICONDUCTOR INTEGRATED CIRCUIT DEVICE

BACKGROUND OF THE INVENTION

The present invention relates to a method and apparatus for simply and easily generating a planarizing pattern which is used to planarize multilevel wiring layers formed in a semiconductor integrated circuit device, such as an LSI, and to a semiconductor integrated circuit device manufactured by using the method of generating a planarizing pattern.

To achieve higher-degree integration in an ultralarge-scale integrated circuit, recent interconnections have been implemented in multilevel wiring layers.

In the multilevel wiring layers, however, undulations of a wiring pattern formed in a lower-level layer exert an influence on an interlayer insulating film formed over the lower-level layer, so that undulations are also produced on the interlayer insulating film. The undulations of the interlayer insulating film cause a step coverage failure (an exposure failure during pattern transfer using a mask owing to a level difference equal to or larger than the depth of focus produced on a wafer), resulting in a broken wire and a defective wire in the wiring layer. Planarization of the surface of the interlayer insulating film is therefore essential technology for implementing a reliable multilayer wiring structure.

As typical technology for planarizing the interlayer insulating film, a resin coating method or the like has been used conventionally. However, the method is disadvantageous in that a sufficient degree of planarity cannot be achieved thereby. To eliminate the disadvantage, there has been proposed a method of planarizing the interlayer insulating film whereby a planarizing pattern (auxiliary pattern) is generated by using a CVD technique to be filled in the gap between adjacent wires.

As the method of generating a planarizing pattern using a CVD technique, there has been known one disclosed in Japanese Laid-Open Patent Publication HEI 5-267460.

A description will be given to the conventional method of generating a planarizing pattern with reference to the drawings. FIGS. 41(a) to 41(d) and FIGS. 42(a) and 42(b) illustrate the process of generating a planarizing pattern in the vicinity of a wiring pattern for propagating an LSI signal in accordance with the conventional method of generating a planarizing pattern.

First, a wiring pattern 1 shown in FIG. 41(a) is inverted to generate a wiring pattern 2 shown in FIG. 41(b), followed by a graphic reducing process of reducing the inverted wiring pattern 2 to generate a reduced inverted wiring pattern 3 as shown in FIG. 41(c). In this case, the inverted wiring pattern 2 is reduced by an amount corresponding to the minimum spacing between the adjacent wiring patterns I on the surface of a chip shown in FIG. 41(a).

Next, a dummy original pattern 5 as shown in FIG. 41(d) is generated. The dummy original pattern 5 is a geometric pattern composed of an array of identical simple geometric figures. Then, figure logical-MINUS operation (subtraction) is performed between the reduced inverted wiring pattern 3 and the dummy original pattern 5 to generate a planarizing pattern 6 as shown in FIG. 42(a). Thereafter, figure logical-OR operation is performed between the wiring pattern 1 and the planarizing pattern 6 to generate a final pattern as shown in FIG. 42(b).

In accordance with the foregoing method of generating a planarizing pattern, however, the planarizing pattern 6 generated in the vicinity of the wiring pattern 1 does not necessarily maintain the initial configuration of the dummy original pattern 5 because of a positional relationship between the wiring pattern 1 and the dummy original pattern 5. There may be cases where extremely small planarizing patterns 6a much smaller in size than the dummy original pattern 5 are generated, leading to the problem that some of the extremely small planarizing patterns 6a are smaller than layout design rules for the wiring pattern 1.

On the other hand, the number of the geometric figures composing the resulting planarizing pattern 6 is excessively increased, leading to the problem of an increased amount of data on the planarizing pattern 6.

SUMMARY OF THE INVENTION

In view of the foregoing, an object of the present invention is to provide a method and apparatus for generating a planarizing pattern and a semiconductor integrated circuit device wherein a generated planarizing pattern satisfies layout design rules for a wiring pattern and the number of the geometric figures composing the planarizing pattern as well as the amount of data on the planarizing pattern is reduced.

A first method of generating a planarizing pattern according to the present invention comprises: a dummy-pattern generating step of generating a dummy pattern composed of a group of identical simple geometric figures in a region of a wiring layer lying at a specified distance or further away from a wiring-pattern formation region of the wiring layer in which a wiring pattern is to be formed; and a planarizing-pattern generating step of reducing the dummy pattern and enlarging a geometric pattern left by reducing the dummy pattern to generate a planarizing pattern.

In accordance with the first method of generating a planarizing pattern, the planarizing pattern is generated by reducing the dummy pattern composed of the group of identical simple geometric figures and enlarging the geometric pattern left by reducing the dummy pattern, so that the simple geometric figures smaller than a specified size are extinguished by the reducing step. Consequently, the planarizing pattern is composed only of the simple geometric figures each having a specified or larger size. By adjusting the amount of reduction in the reducing step, planarizing patterns smaller than design rules for a wiring pattern in accordance with a semiconductor manufacturing process are no more generated, while the number of the simple geometric figures composing the planarizing pattern and the amount of data on the planarizing pattern can be reduced.

In the first method of generating a planarizing pattern, the dummy-pattern generating step preferably includes the steps of: enlarging the wiring pattern by a first specified amount to generate an enlarged wiring pattern; consecutively placing the simple geometric figures to generate a dummy original pattern; and generating the dummy pattern by figure logical-MINUS operation for deleting an overlapping portion of the dummy original pattern with the enlarged wiring pattern and the planarizing-pattern generating step preferably includes the steps of: reducing the dummy pattern by a second specified amount to generate a reduced dummy pattern; and enlarging the reduced dummy pattern by the second specified amount to generate the planarizing pattern.

By thus deleting the overlapping portion of the dummy original pattern with the enlarged wiring pattern obtained by enlarging the wiring pattern by the first specified amount, the dummy pattern composed of the group of simple geometric figures can surely be generated in the region at the specified distance or further away from the wiring-pattern formation region in which the wiring pattern is to be formed.

Moreover, since the planarizing pattern is thus generated by reducing the dummy pattern by the second specified amount to generate the reduced dummy pattern and enlarging the reduced dummy pattern by the second specified amount, the number of the simple geometric figures composing the planarizing pattern and the amount of data on the planarizing pattern can surely be reduced.

In the first method of generating a planarizing pattern, the dummy-pattern generating step preferably includes the steps of: graphically inverting the wiring pattern to generate an inverted wiring pattern; reducing the inverted wiring pattern by a first specified amount to generate a reduced inverted wiring pattern; consecutively placing the simple geometric figures to generate a dummy original pattern; and generating the dummy pattern by figure logical-AND operation for leaving only an overlapping portion of the dummy original pattern with the reduced inverted wiring pattern and the planarizing-pattern generating step includes preferably the steps of: reducing the dummy pattern by a second specified amount to generate a reduced dummy pattern; and enlarging the reduced dummy pattern by the second specified amount to generate the planarizing pattern.

By thus leaving only the overlapping portion of the dummy original pattern with the reduced inverted wiring pattern obtained by graphically inverting the wiring pattern and reducing the resulting inverted wiring pattern by the first specified amount, the dummy pattern composed of the group of simple geometric figures can surely be generated in the region at the specified distance or further way from the wiring-pattern formation region in which the wiring pattern is to be formed.

Moreover, since the planarizing pattern is thus generated by reducing the dummy pattern by the second specified amount to generate the reduced dummy pattern and then enlarging the reduced dummy pattern by the second specified amount, the number of the simple geometric figures composing the planarizing pattern and the amount of data planarizing pattern can surely be reduced.

A second method of generating a planarizing pattern according to the present invention comprises: a first-dummy-pattern generating step of generating a first dummy pattern composed of a group of identical simple geometric figures in a region of a wiring layer lying at a first specified distance or further away from a wiring-pattern formation region of the wiring layer in which a wiring pattern is to be formed; a second-dummy-pattern generating step of reducing the first dummy pattern and enlarging a geometric pattern left by reducing the first dummy pattern to generate a second dummy pattern; a third-dummy-pattern generating step of generating a third dummy pattern composed of the group of simple geometric figures that have been parallel-shifted in a region of the wiring layer lying at the first specified distance or further away from the wiring-pattern formation region and at a second specified distance or further away from the first dummy pattern; a fourth-dummy-pattern generating step of reducing the third dummy pattern and enlarging a geometric pattern left by reducing the third dummy pattern to generate a fourth dummy pattern; and a planarizing-pattern generating step of combining the second dummy pattern with the fourth dummy pattern to generate a planarizing pattern.

In accordance with the second method of generating a planarizing pattern, the planarizing pattern is generated by reducing the first or third dummy pattern composed of the group of identical simple geometric figures parallel-shifted or not parallel-shifted and then enlarging the remaining geometric pattern, similarly to the first method of generating a planarizing pattern. Consequently, the planarizing pattern is composed only of the simple geometric figures parallel-shifted or not parallel-shifted each having a specified or larger size. Therefore, the number of the geometric figures composing the planarizing pattern and the amount of data on the planarizing pattern can also be reduced, similarly to the first method of generating a planarizing pattern.

Moreover, since the second dummy original pattern in addition to the first dummy original pattern is used to form the planarizing pattern, the region lying between the adjacent wiring patterns and unfilled with the planarizing pattern is reduced compared with the case where only the first dummy original pattern is used to generate the planarizing pattern. The reduction in the region lying between the adjacent wiring patterns and unfilled with the planarizing pattern allows the formation of a planarizing pattern which imparts a sufficient degree of planarity required by a semiconductor manufacturing process to a wiring layer.

In the second method of generating a planarizing pattern, the first-dummy-pattern generating step preferably includes the steps of: enlarging the wiring pattern by a first specified amount to generate an enlarged wiring pattern; consecutively placing the simple geographic figures in the wiring layer to generate a first dummy original pattern; and generating the first dummy pattern by figure logical-MINUS operation for deleting an overlapping portion of the first dummy original pattern with the enlarged wiring pattern, the second-dummy-pattern generating step preferably includes the steps of: reducing the first dummy pattern by a second specified amount to generate a first reduced dummy pattern; and enlarging the first reduced dummy pattern by the second specified amount to generate the second dummy pattern, the third-dummy-pattern generating step preferably includes the steps of: parallel-shifting the simple geometric figures composing the first dummy original pattern to generate a second dummy original pattern; enlarging the second dummy pattern by a third specified amount to generate an enlarged dummy pattern; and generating the third dummy pattern by figure logical-MINUS operation for deleting an overlapping portion of the second dummy original pattern with the enlarged wiring pattern and with the enlarged dummy pattern, the fourth-dummy-pattern generating step preferably includes the steps of: reducing the third dummy pattern by a fourth specified amount to generate a second reduced dummy pattern; and enlarging the second reduced dummy pattern by the fourth specified amount to generate the fourth dummy pattern, and the planarizing-pattern generating step preferably includes the step of generating the planarizing pattern by figure logical-OR operation for combining the second dummy pattern with the fourth dummy pattern.

Since the fourth dummy pattern is thus generated by deleting the overlapping portion of the second dummy original pattern, which has been obtained by parallel-shifting the simple geometric figures composing the first dummy original pattern, with the enlarged wiring pattern obtained by enlarging the wiring pattern by the first specified amount and with the enlarged dummy pattern obtained by enlarging, by the second specified amount, the first dummy pattern generated from the first dummy original pattern, the region lying between the adjacent wiring patterns and unfilled with the planarizing pattern generated from the first dummy original pattern can be filled with the second dummy original pattern.

A third method of generating a planarizing pattern according to the present invention comprises: a first-dummypattern generating step of generating a first dummy pattern composed of a group of identical simple geometric figures in a region of a wiring layer lying at a first specified distance or further away from a wiring-pattern formation region of the wiring layer in which a wiring pattern is to be formed and at a second specified distance from or closer to the wiring-pattern formation region, the second specified distance being larger than the first specified distance; a second-dummy-pattern generating step of generating a second dummy pattern composed of at least one geometric figure larger than the simple geometric figure in a region of the wiring layer lying at the second specified distance or further away from the wiring-pattern formation region; and a planarizing-pattern generating step of combining the first dummy pattern with the second dummy pattern to generate a planarizing pattern.

In accordance with the third method of generating a planarizing pattern, the first planarizing pattern composed of the group of simple geometric figures is generated in the region lying at the first specified distance or further away from the wiring-pattern formation region and at the second specified distance from or closer to the wiring-pattern formation region, while the second planarizing pattern composed of at least one geometric figure larger than the simple geometric figure is generated, instead of the planarizing pattern composed of the group of simple geometric figures, in the region at the second specified distance or further away from the wiring-pattern formation region. Compared with the case where the planarizing pattern composed only of the group of simple geometric figures is used, the number of the geometric figures composing the planarizing pattern and the amount of data on the planarizing pattern can be reduced.

In the third method of generating a planarizing pattern, the first-dummy-pattern generating step preferably includes the steps of: enlarging the wiring pattern by a first specified amount to generate a first enlarged wiring pattern; enlarging the wiring pattern by a second specified amount larger than the first specified amount to generate a second enlarged wiring pattern; inverting the second enlarged wiring pattern to generate an inverted pattern; consecutively placing the simple geometric figures to generate a dummy original pattern; and generating the first dummy pattern by figure logical-MINUS operation for deleting an overlapping portion of the dummy original pattern with the first enlarged wiring pattern and with the inverted pattern, the second-dummy-pattern generating step preferably includes the step of generating the second dummy pattern composed of the inverted pattern, and the planarizing-pattern generating step preferably includes the step of generating the planarizing pattern by figure logical-OR operation for combining the first dummy pattern with the second dummy pattern.

By thus deleting the overlapping portion of the dummy original pattern with the first enlarged wiring pattern obtained by enlarging the wiring pattern by the first specified amount and with the inverted pattern obtained by enlarging the wiring pattern by the second specified amount and inverting the resulting second enlarged wiring pattern, the first dummy pattern composed of the group of simple geometric figures can surely be generated in the region lying at the first specified distance or further away from the wiring-pattern formation region in which the wiring pattern is to be formed and at the second specified distance larger than the first specified distance from or closer to the wiring-pattern formation region.

Moreover, since the second dummy pattern is thus generated from the inverted pattern, the planarizing pattern composed of at least one geometric figure larger than the simple geometric figure can surely be generated in the region at the second specified distance or further away from the wiring-pattern formation region.

In the third method of generating a planarizing pattern, the first-dummy-pattern generating step preferably includes the steps of: enlarging the wiring pattern by a first specified amount to generate an enlarged wiring pattern; inverting the wiring pattern to generate an inverted pattern; reducing the inverted pattern by a second specified amount larger than the first specified amount to generate a reduced inverted pattern;

consecutively placing the simple geometric figures to generate a dummy original pattern; and generating the first dummy pattern by figure logical-MINUS operation for deleting an overlapping portion of the dummy original pattern with the enlarged wiring pattern and with the reduced inverted pattern, the second-dummy-pattern generating step preferably includes the step of generating the second dummy pattern composed of the reduced inverted pattern, and the planarizing-pattern generating step preferably includes the step of generating the planarizing pattern by figure logical-OR operation for combining the first dummy pattern with the second dummy pattern.

By thus deleting the overlapping portion of the dummy original pattern with the first enlarged wiring pattern obtained by enlarging the wiring pattern by the first specified amount and with the reduced inverted pattern obtained by inverting the wiring pattern and reducing the resulting inverted pattern by the second specified amount, the first dummy pattern composed of the group of simple geometric figures can surely be generated in the region lying at the first specified distance or further away from the wiring-pattern formation region in which the wiring pattern is to be formed and at the second specified distance larger than the first specified distance from or closer to the wiring-pattern formation region.

Moreover, since the second dummy pattern is thus generated from the reduced inverted pattern, the planarizing pattern composed of at least one geometric figure larger than the simple geometric figure can surely be generated in the region at the second specified distance or further away from the wiring-pattern formation region.

In the third method of generating a planarizing pattern, the first-dummy-pattern generating step preferably includes the steps of: enlarging the wiring pattern by a first specified amount to generate a first enlarged wiring pattern; enlarging the wiring pattern by a second specified amount larger than the first specified amount to generate a second enlarged wiring pattern; inverting the second enlarged wiring pattern to generate a first inverted pattern; reducing the first inverted pattern by a third specified amount to generate a reduced inverted pattern; enlarging the reduced inverted pattern by the third specified amount to generate a second inverted pattern; consecutively placing the simple geometric figures to generate a dummy original pattern; and generating the first dummy pattern by figure logical-MINUS operation for deleting an overlapping portion of the dummy original pattern with the first enlarged wiring pattern and with the second inverted pattern, the second-dummy-pattern generating step preferably includes the step of generating the second dummy pattern composed of the second inverted pattern, and the planarizing-pattern generating step preferably includes the step of generating the planarizing pattern by figure logical-OR operation for combining the first dummy pattern with the second dummy pattern.

By thus deleting the overlapping portion of the dummy original pattern with the first enlarged wiring pattern obtained by enlarging the wiring pattern by the first specified amount and with the second inverted pattern obtained by enlarging the wiring pattern by the second specified amount and inverting the resulting second enlarged wiring pattern, the first dummy pattern composed of the group of simple geometric figures can surely be generated in the region lying at the first specified distance or further away from the wiring-pattern formation region in which the wiring pattern is to be formed and at the second specified distance larger than the first specified distance from or closer to the wiring-pattern formation region.

Moreover, since the second dummy pattern is thus generated from the second inverted pattern, the planarizing pattern composed of at least one geometric figure larger than the simple geometric figure can surely be generated in the region at the second specified distance or further away from the wiring-pattern formation region.

A fourth method of generating a planarizing pattern according to the present invention comprises: a first-dummy-pattern generating step of generating a first dummy pattern composed of a group of first identical simple geometric figures in a region of a wiring layer lying at a first specified distance or further away from a wiring-pattern formation region of the wiring layer in which a wiring pattern is to be formed and at a second specified distance from or closer to the wiring-pattern formation region, the second specified distance being larger than the first specified distance; a second-dummy-pattern generating step of generating a second dummy pattern composed of a group of second identical simple geometric figures larger than the first simple geometric figures in a region of the wiring layer lying at the second specified distance or further away from the wiring-pattern formation region; and a planarizing-pattern generating step of combining the first dummy pattern with the second dummy pattern to generate a planarizing pattern.

In accordance with the fourth method of generating a planarizing pattern, the planarizing pattern composed of the group of second simple geometric figures larger than the first simple geometric figures is formed, instead of the planarizing pattern composed of the group of first simple geometric figures, in the region at the second specified distance or further away from the wiring-pattern formation region. Consequently, the number of the geometric figures composing the planarizing pattern and the amount of data on the planarizing pattern can be reduced.

With the planarizing pattern composed of the group of second simple geometric figures and generated in the region at the second specified distance or further away from the wiring-pattern formation region, parasitic capacitance resulting from the planarizing pattern in the wiring layer overlying or underlying the wiring layer in which the wiring pattern is formed is prevented from being increased.

Consequently, there can be achieved the reduction in the number of geometric figures composing the planarizing pattern and the reduction in the amount of data on the planarizing pattern simultaneously with the suppression of increased parasitic capacitance in the second wiring layer.

In the fourth method of generating a planarizing pattern, the first-dummy-pattern generating step preferably includes the steps of: enlarging the wiring pattern by a first specified amount to generate a first enlarged wiring pattern; enlarging the wiring pattern by a second specified amount larger than the first specified amount to generate a second enlarged wiring pattern; inverting the second enlarged wiring pattern to generate an inverted pattern; consecutively placing the first simple geometric figures to generate a first dummy original pattern; and generating the first dummy pattern by figure logical-MINUS operation for deleting an overlapping portion of the first dummy original pattern with the first enlarged wiring pattern and with the inverted pattern, the second-dummy-pattern generating step preferably includes the steps of: consecutively placing the second simple geometric figures to generate a second dummy original pattern; and generating the second dummy pattern by figure logical-AND operation for leaving only an overlapping portion of the second dummy original pattern with the inverted pattern, and the planarizing-pattern generating step preferably includes the step of generating the planarizing pattern by figure logical-OR operation for combining the first dummy pattern with the second dummy pattern.

Since the second dummy pattern is thus generated by leaving only the overlapping portion of the second dummy original pattern composed of the group of second simple geometric figures larger than the first simple geometric figures with the inverted pattern obtained by enlarging the wiring pattern by the second specified amount and inverting the resulting second enlarged wiring pattern, the planarizing pattern composed of the group of second simple geometric figures can surely be generated in the region at the second specified distance or further away from the wiring-pattern formation region.

A fifth method of generating a planarizing pattern according to the present invention comprises: a first-dummy-pattern generating step of generating a first dummy pattern composed of a group of identical simple geometric figures in a region of a first wiring layer lying at a first specified distance or further away from a first-wiring-pattern formation region of the first wiring layer in which a first wiring pattern is to be formed, at a second specified distance from or closer to the first-wiring-pattern formation region, the second specified distance being larger than the first specified distance, and at a third specified distance from or closer to a second-wiring-pattern formation region of a second wiring layer overlying or underlying the first wiring layer in which a second wiring pattern is to be formed; a second-dummy-pattern generating step of generating a second dummy pattern composed of at least one geometric figure larger than the simple geometric figure in a region of the first wiring layer lying at the second specified distance or further away from the first-wiring-pattern formation region and at the third specified distance from or further away from the second-wiring-pattern formation region; and a planarizing-pattern generating step of combining the first dummy pattern with the second dummy pattern to generate a planarizing pattern.

In accordance with the fifth method of generating a planarizing pattern, the first planarizing pattern composed of the group of simple geometric figures is generated in the region lying at the first specified distance or further away from the first-wiring-pattern formation region, at the second specified distance from or closer to the first-wiring-pattern formation region, and at the third specified distance or closer to the second-wiring-pattern formation region, while the second planarizing pattern composed of at least one geometric figure larger than the simple geometric figure is generated, instead of the planarizing pattern composed of the group of simple geometric figures, in the region lying at the second specified distance or further away from the first-wiring-pattern formation region and at the third specified distance or further away from the second-wiring-pattern formation region. Consequently, there can be achieved the reduction in the number of the geometric figures composing the planarizing pattern and the reduction in the amount of data on the planarizing pattern simultaneously with the suppression of increased parasitic capacitance.

In the fifth method of generating a planarizing pattern, the first-dummy-pattern generating step preferably includes the steps of: enlarging the first wiring pattern by a first specified amount to generate a first enlarged wiring pattern; enlarging the second wiring pattern by a second specified amount to generate a second enlarged wiring pattern; generating a synthetical pattern by figure logical-OR operation for combining the first enlarged wiring pattern with the second enlarged wiring pattern; inverting the synthetical pattern to generate an inverted pattern; consecutively placing the simple geometric figures to generate a dummy original pattern; and generating the first dummy pattern by figure logical-MINUS operation for deleting an overlapping portion of the dummy original pattern with the first enlarged wiring pattern and with the inverted pattern, the second-dummy-pattern generating step preferably includes the step of generating the second dummy pattern composed of the inverted pattern, and the planarizing-pattern generating step preferably includes the step of generating the planarizing pattern by figure logical-OR operation for combining the first dummy pattern with the second dummy pattern.

Since the second dummy pattern is thus generated by inverting the synthetical pattern obtained by combining the first enlarged wiring pattern obtained by enlarging the first wiring pattern by the first specified amount with the second enlarged wiring pattern obtained by enlarging the second wiring pattern by the second specified amount, the planarizing pattern composed of at least one geometric figure larger than the simple geometric figure can surely be generated in the region lying at the second specified distance or further away from the first-wiring-pattern formation region and at the third specified distance or further away from the second-wiring-pattern formation region.

A sixth method of generating a planarizing pattern according to the present invention comprises: a first-dummy-pattern generating step of generating a first dummy pattern composed of a group of first identical simple geometric figures in a region of a first wiring layer lying at a first specified distance or further away from a first-wiring-pattern formation region of the first wiring layer in which a first wiring pattern is to be formed, at a second specified distance from or closer to the first-wiring-pattern formation region, and at a third specified distance from or closer to a second-wiring-pattern formation region of a second wiring layer overlying or underlying the first wiring layer in which a second wiring pattern is to be formed; a second-dummy-pattern generating step of generating a second dummy pattern composed of a group of second identical simple geometric figures larger than the first simple geometric figures in a region of the first wiring layer lying at the second specified distance or further away from the first-wiring-pattern formation region and at the third specified distance or further away from the second-wiring-pattern formation region; and a planarizing-pattern generating step of combining the first dummy pattern with the second dummy pattern to generate a planarizing pattern.

In accordance with the sixth method of generating a planarizing pattern, the first planarizing pattern composed of the group of first simple geometric figures is formed in the region lying at the first specified distance or further away from the first-wiring-pattern formation region, at the second specified distance from or closer to the first-wiring-pattern formation region, and at the third specified distance from or closer to the second-wiring-pattern formation region, while the second planarizing pattern composed of the group of second simple geometric figures larger than the first simple geometric figures is formed in the region lying at the second specified distance or further from the first-wiring-pattern formation region and at the third specified distance or further away from the second-wiring-pattern formation region. Consequently, there can be achieved the reduction in the number of geometric figures composing the planarization pattern and the reduction in the amount of data on the planarizing pattern simultaneously with the suppression of increased parasitic capacitance.

In the sixth method of generating a planarizing pattern, the first-dummy-pattern generating step includes the steps of: enlarging the first wiring pattern by a first specified amount to generate a first enlarged wiring pattern; enlarging the second wiring pattern by a second specified amount to generate a second enlarged wiring pattern; generating a synthetical pattern by figure logical-OR operation for combining the first enlarged wiring pattern with the second enlarged wiring pattern; inverting the synthetical pattern to generate an inverted pattern; consecutively placing the first simple geometric figures to generate a first dummy original pattern; and generating the first dummy pattern by figure logical-MINUS operation for deleting an overlapping portion of the first dummy original pattern with the first enlarged wiring pattern and with the inverted pattern, the second-dummy-pattern generating step includes the steps of: consecutively placing the second simple geometric figures to generate a second dummy original pattern; and generating the second dummy pattern by figure logical-AND operation for leaving only an overlapping portion of the second dummy original pattern with the inverted pattern, and the planarizing-pattern generating step includes the step of generating the planarizing pattern by figure logical-OR operation for combining the first dummy pattern with the second dummy pattern.

Since the second dummy pattern is thus generated by leaving only the overlapping portion of the second dummy original pattern composed of the second simple geometric figures larger than the first simple geometric figures with the inverted pattern obtained by inverting the synthetical pattern obtained by combining the first enlarged wiring pattern obtained by enlarging the first wiring pattern by the first specified amount with the second enlarged wiring pattern obtained by enlarging the second wiring pattern by the second specified amount, the planarizing pattern composed of the group of second simple geometric figures larger than the first simple geometric figures can surely be generated in the region lying at the second specified distance or further away from the first-wiring-pattern formation region and at the third specified distance or further away from the second-wiring-pattern formation region.

A first apparatus for generating a planarizing pattern according to the present invention comprises: first graphic enlarging means for enlarging a wiring pattern in a wiring layer by a first specified amount to generate an enlarged wiring pattern; dummy-original-pattern generating means for consecutively placing identical simple geometric figures to generate a dummy original pattern; figure logical-MINUS operating means for deleting an overlapping portion of the dummy original pattern with the enlarged wiring pattern to generate a dummy pattern; graphic reducing means for reducing the dummy pattern by a second specified amount to generate a reduced dummy pattern; and second graphic enlarging means for enlarging the reduced dummy pattern by the second specified amount to generate a planarizing pattern.

A second apparatus for generating a planarizing pattern according to the present invention comprises: first graphic enlarging means for enlarging a wiring pattern in a wiring layer by a first specified amount to generate an enlarged wiring pattern; first-dummy-original-pattern generating means for consecutively placing identical simple geometric figures to generate a first dummy original pattern; figure logical-MINUS operating means for deleting an overlapping portion of the first dummy original pattern with the enlarged wiring pattern to generate a first dummy pattern; first graphic reducing means for reducing the first dummy pattern by a second specified amount to generate a first reduced dummy pattern; second graphic enlarging means for enlarging the first reduced dummy pattern by the second specified amount to generate a second dummy pattern; second-dummy-original-pattern generating means for parallel-shifting the simple geometric figures composing the first dummy original pattern to generate a second dummy original pattern; third graphic enlarging means for enlarging the second dummy pattern by a third specified amount to generate an enlarged dummy pattern; figure logical-MINUS operating means for deleting an overlapping portion of the second dummy original pattern with the enlarged wiring pattern and with the enlarged dummy pattern to generate a third dummy pattern; second graphic reducing means for reducing the third dummy pattern by a fourth specified amount to generate a second reduced dummy pattern; fourth graphic enlarging means for enlarging the second reduced dummy pattern by the fourth specified amount to generate a fourth dummy pattern; and figure logical-OR operating means for combining the second dummy pattern with the fourth dummy pattern to generate a planarizing pattern.

A third apparatus for generating a planarizing pattern according to the present invention comprises: first graphic enlarging means for enlarging a wiring pattern in a wiring layer by a first specified amount to generate a first enlarged wiring pattern; second graphic enlarging means for enlarging the wiring pattern by a second specified amount larger than the first specified amount to generate a second enlarged wiring pattern; graphic inverting means for inverting the second enlarged wiring pattern to generate an inverted pattern; dummy-original-pattern generating means for consecutively placing identical simple geometric figures in the wiring layer to generate a dummy original pattern; figure logical-MINUS operating means for deleting an overlapping portion of the dummy original pattern with the first enlarged wiring pattern and with the inverted pattern to generate a dummy pattern; and figure logical-OR operating means for combining the dummy pattern with the inverted pattern to generate a planarizing pattern.

A fourth apparatus for generating a planarizing pattern according to the present invention comprises: first graphic enlarging means for enlarging a wiring pattern in a wiring layer by a first specified amount to generate a first enlarged wiring pattern; second graphic enlarging means for enlarging the wiring pattern by a second specified amount larger than the first specified amount to generate a second enlarged wiring pattern; graphic inverting means for inverting the second enlarged wiring pattern to generate an inverted pattern; first-dummy-original-pattern generating means for consecutively placing first identical simple geometric figures to generate a first dummy original pattern; figure logical-MINUS operating means for deleting an overlapping portion of the first dummy original pattern with the first enlarged wiring pattern and with the inverted pattern to generate a first dummy pattern; second-dummy-original-pattern generating means for consecutively placing second identical simple geometric figures larger than the first simple geometric figures to generate a second dummy original pattern; figure logical-AND operating means for leaving only an overlapping portion of the second dummy original pattern with the inverted pattern to generate a second dummy pattern; and figure logical-OR operating means for combining the first dummy pattern with the second dummy pattern to generate a planarizing pattern.

A fifth apparatus for generating a planarizing pattern according to the present invention comprises: first graphic enlarging means for enlarging a first wiring pattern in a first wiring layer by a first specified amount to generate a first enlarged wiring pattern; second graphic enlarging means for enlarging a second wiring pattern in a second wiring layer overlying or underlying the first wiring layer by a second specified amount to generate a second enlarged wiring pattern; figure logical-OR operating means for combining the first enlarged wiring pattern with the second enlarged wiring pattern to generate a synthetical pattern; graphic inverting means for inverting the synthetical pattern to generate an inverted pattern; dummy-original-pattern generating means for consecutively placing identical simple geometric figures to generate a dummy original pattern; figure logical-MINUS operating means for deleting an overlapping portion of the dummy original pattern with the first enlarged wiring pattern and with the inverted pattern to generate a first dummy pattern; and figure logical-OR operating means for combining the first dummy pattern with the inverted pattern to generate a planarizing pattern.

A sixth apparatus for generating a planarizing pattern according to the present invention comprises: first graphic enlarging means for enlarging a first wiring pattern in a first wiring layer by a first specified amount to generate a first enlarged wiring pattern; second graphic enlarging means for enlarging a second wiring pattern in a second wiring layer overlying or underlying the first wiring layer by a second specified amount to generate a second enlarged wiring pattern; figure logical-OR operating means for combining the first enlarged wiring pattern with the second enlarged wiring pattern to generate a synthetical pattern; graphic inverting means for inverting the synthetical pattern to generate an inverted pattern; first-dummy-original-pattern generating means for consecutively placing first identical simple geometric figures to generate a first dummy original pattern; figure logical-MINUS operating means for deleting an overlapping portion of the first dummy original pattern with the first enlarged wiring pattern and with the inverted pattern to generate a first dummy pattern; second-dummy-original-pattern generating means for consecutively placing second identical simple geometric figures larger than the first simple geometric figures to generate a second dummy original pattern; figure logical-AND operating means for leaving only an overlapping portion of the second dummy original pattern with the inverted pattern to generate a second dummy pattern; and figure logical-OR operating means for combining the first dummy pattern with the second dummy pattern to generate a planarizing pattern.

With the first apparatus for generating a planarizing pattern, the first method of generating a planarizing pattern can surely be implemented. With the second apparatus for generating a planarizing pattern, the second method of generating a planarizing pattern can surely be implemented. With the third apparatus for generating a planarizing pattern, the third method of generating a planarizing pattern can surely be implemented. With the fourth apparatus for generating a planarizing pattern, the fourth method of generating a planarizing pattern can surely be implemented. With the fifth apparatus for generating a planarizing pattern, the fifth method of generating a planarizing pattern can surely be implemented. With the sixth apparatus for generating a planarizing pattern, the sixth method of generating a planarizing pattern can surely be implemented.

A first semiconductor integrated circuit device according to the present invention comprises: a wiring pattern formed in a wiring layer on a semiconductor substrate; a first planarizing pattern composed of a group of identical simple geometric figures and formed in a region of the wiring layer lying at a first specified distance or further away from the wiring pattern and at a second specified distance from or closer to the wiring pattern, the second specified distance being larger than the first specified distance; a second planarizing pattern composed of at least one geometric figure larger than the simple geometric figure and formed in a region of the wiring layer lying at the second specified distance or further away from the wiring pattern; and an interlayer insulating film formed over the wiring pattern, the first planarizing pattern, and the second planarizing pattern.

In the first semiconductor integrated circuit device, the first planarizing pattern composed of the group of simple geometric figures is generated in the region of the wiring layer lying at the first specified distance or further away from the wiring pattern and at the second specified distance from or closer to the wiring pattern, while the second planarizing pattern composed of at least one geometric figure larger than the simple geometric figure is formed in the region of the wiring layer at the second specified distance or further away from the wiring pattern. Compared with the case where the planarizing pattern composed only of the group of simple geometric figures is used, the number of the geometric figures composing the planarizing pattern and the amount of data on the planarizing pattern can be reduced.

A second semiconductor integrated circuit device according to the present invention comprises: a first wiring pattern formed in a first wiring layer on a semiconductor substrate; a second wiring pattern formed in a second wiring layer overlying or underlying the first wiring layer on the semiconductor substrate; a first planarizing pattern composed of a group of identical simple geometric figures and formed in a region of the first wiring layer lying at a first specified distance or further away from the first wiring pattern, at a second specified distance from or closer to the first wiring pattern, the second specified distance being larger than the first specified distance, and at a third specified distance from or closer to the second wiring pattern; a second planarizing pattern composed of at least one geometric figure larger than the simple geometric figure and formed in a region of the first wiring layer lying at the second specified distance or further away from the first wiring pattern and at the third specified distance or further away from the second wiring pattern; and an interlayer insulating film formed between the first wiring pattern, the first planarizing pattern, and the second planarizing pattern each formed in the first wiring layer and the second wiring pattern formed in the second wiring layer.

In the second semiconductor integrated circuit device, the first planarizing pattern composed of the group of simple geometric figures is formed in the region of the first wiring layer lying at the first specified distance or further away from the first wiring pattern in the first wiring layer, at the second specified distance or closer to the first wiring pattern, and at the third specified distance or closer to the second wiring pattern, while the second planarization pattern composed of at least one geometric figure larger than the simple geometric figure is formed, instead of the planarization pattern composed of the group of simple geometric figures, in the region of the second wiring layer lying at the second specified distance or further away from the first wiring pattern and at the third specified distance or further away from the second wiring pattern. Consequently, there can be achieved the reduction in the number of the geometric figures composing the planarizing pattern and the reduction in the amount of data on the planarizing pattern simultaneously with the suppression of increased parasitic capacitance.

BRIEF DESCRIPTION OF THE DRAWINGS

FIGS. 8(a) to 8(d) are plan views illustrating individual process steps in the method of generating a planarizing pattern according to the second embodiment of the present invention;

FIGS. 11(a) and 11(b) are plan views illustrating individual process steps in the method of generating a planarizing pattern according to the third embodiment of the present invention;

FIGS. 12(a) and 12(b) are plan views illustrating individual process steps in the method of generating a planarizing pattern according to the third embodiment of the present invention;

FIGS. 13(a) and 13(b) are plan views illustrating the individual process steps in a method of generating a planarizing pattern according to a fourth embodiment of the present invention;

FIGS. 15(a) and 15(b) are plan views illustrating individual process steps in a method of generating a planarizing pattern according to a fifth embodiment of the present invention;

FIGS. 16(a) and 16(b) are plan views illustrating individual process steps in the method of generating a planarizing pattern according to the fifth embodiment of the present invention;

FIGS. 17(a) and 17(b) are plan views illustrating individual process steps in the method of generating a planarizing pattern according to the fifth embodiment of the present invention;

FIGS. 18(a) and 18(b) are plan views illustrating individual process steps in a method of generating a planarizing pattern according to a sixth embodiment of the present invention;

DETAILED DESCRIPTION OF THE INVENTION

Figure 1B:
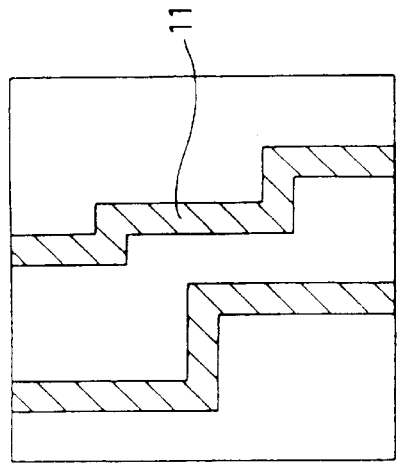
FIGS. 1(a) to 1(d) are plan views illustrating individual process steps in a method of generating a planarizing pattern according to a first embodiment of the present invention.

Referring now to the drawings, a method and apparatus for generating a planarizing pattern according to the individual embodiments of the present invention will be described.

First Embodiment

Figure 28:
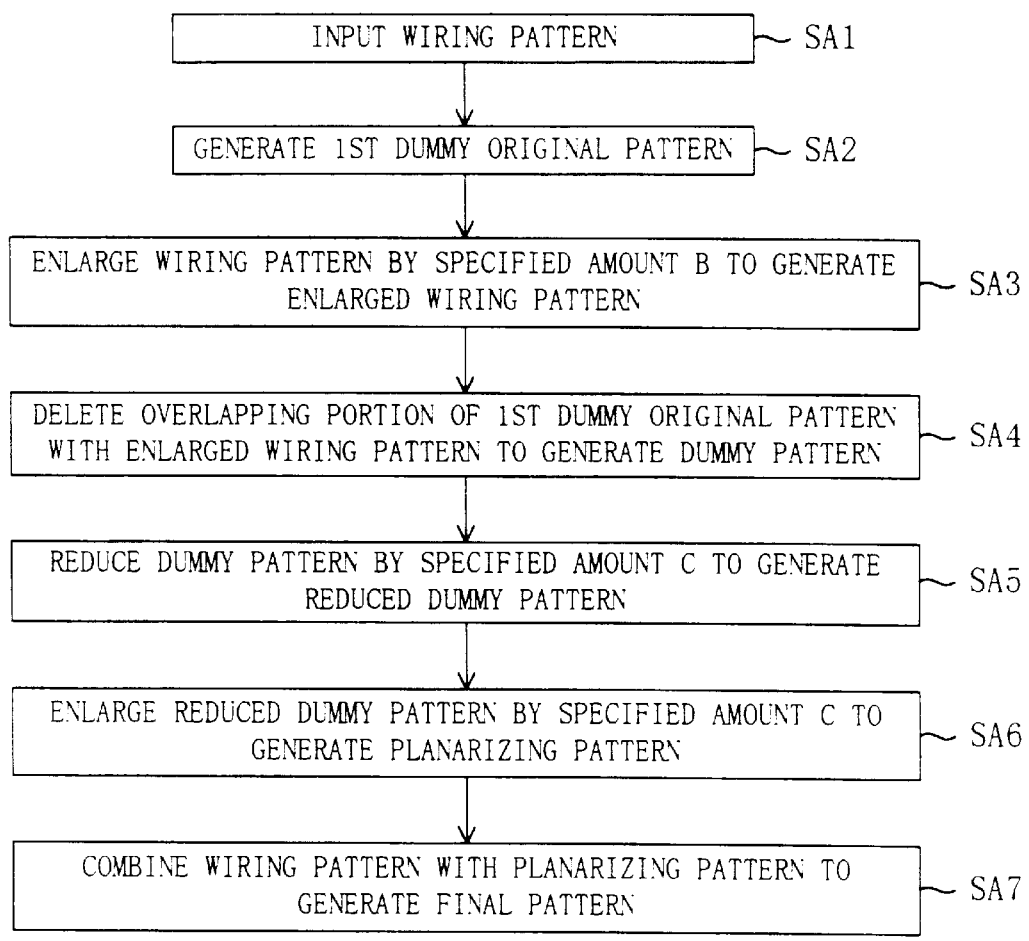
FIG. 28 is a flow chart showing a process in the method of generating a planarizing pattern according to the first embodiment.

A method of generating a planarizing pattern according to a first embodiment of the present invention will be described with reference to FIGS. 1(a) to 1(d), FIGS. 2(a) to 2(c), and the flow chart of FIG. 28, while a first apparatus for generating a planarizing pattern which is used in the method of generating a planarizing pattern according to the first embodiment will be described with reference to FIG. 35.

First, a wiring pattern is inputted in Step SA1. Then, in Step SA2, a first dummy original pattern 10 which is a geometric pattern composed of an array of identical simple geometric figures, such as squares, is generated, as shown in FIG. 1(a). In this case, the length A of one side of each square composing the first dummy original pattern 10 is adjusted to be equal to or larger than a minimum value compliant with design rules for a wiring pattern in accordance with a semiconductor manufacturing process, while the spacing a between the adjacent squares composing the first dummy original pattern 10 is adjusted to be equal to or larger than the minimum value compliant with design rules for the spacing between adjacent wiring patterns in accordance with the semiconductor manufacturing process.

Figure 1D:
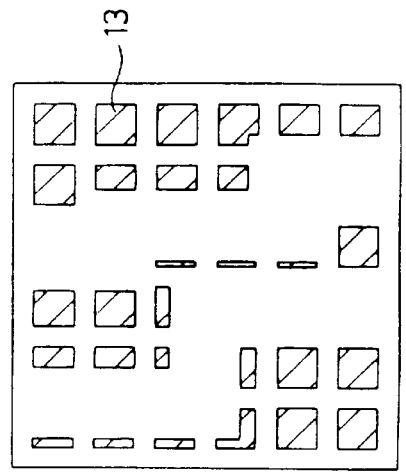
Figure 1A:
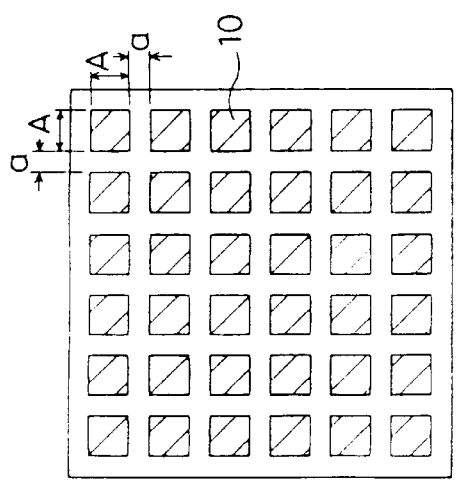
Figure 1C:
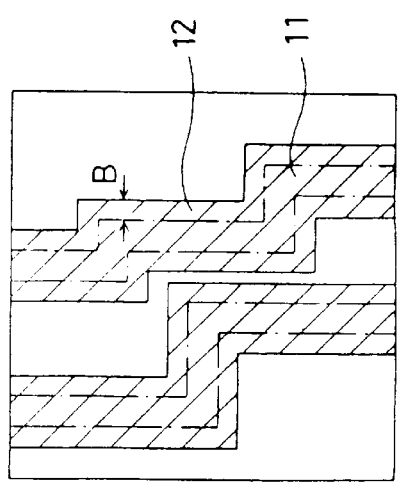
Figure 35:
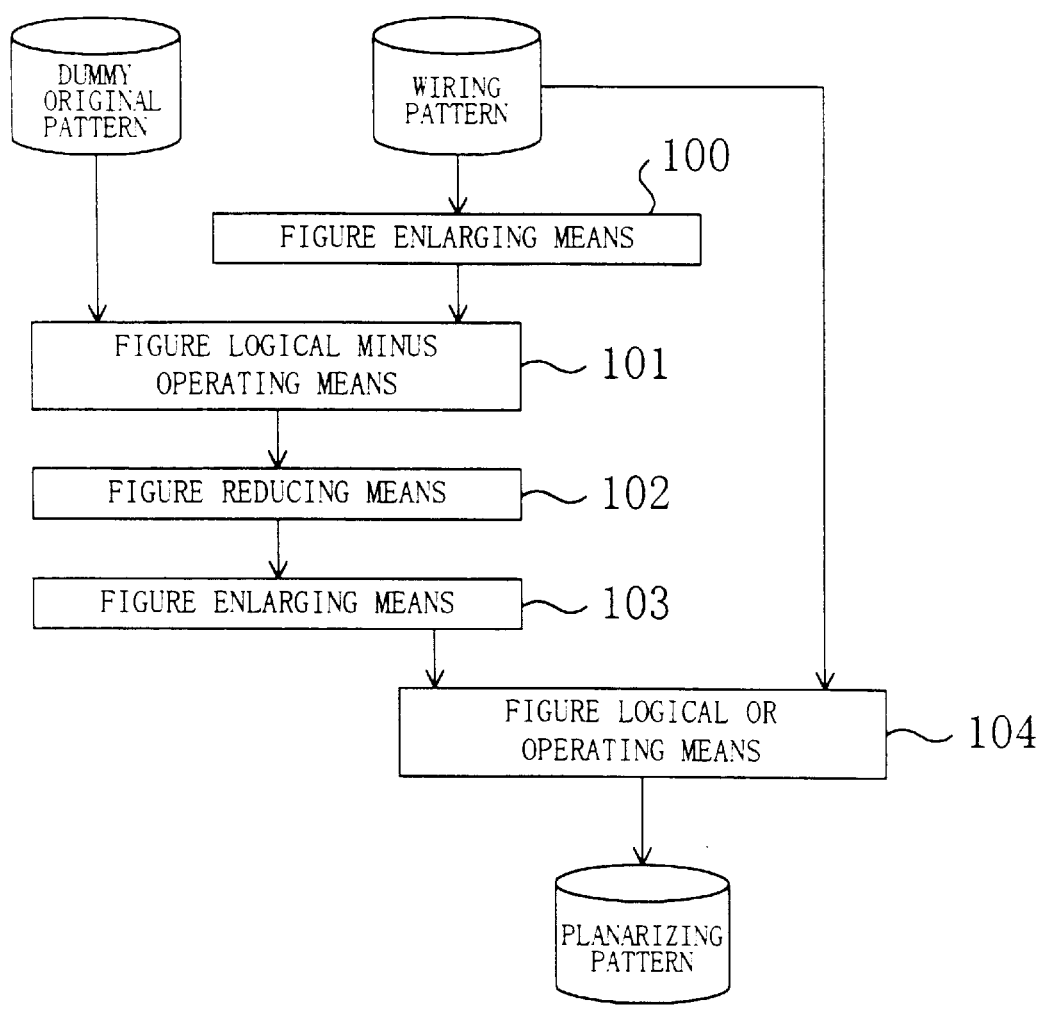
FIG. 35 is a block diagram of an apparatus for generating a first planarizing pattern which is used in the method of generating a planarizing pattern according to the first embodiment.

Next, in Step SA3, graphic enlarging means 100 shown in FIG. 35 enlarges a wiring pattern 11 shown in FIG. 1(b) by a specified amount B to generate an enlarged wiring pattern 12 shown in FIG. 1(c). In this case, the value of the specified amount B corresponds to the minimum spacing between the wiring pattern 11 and a planarizing pattern 15 (see FIG. 2(b)) finally obtained. The enlarged wiring pattern 12 corresponds to a region in the vicinity of the wiring pattern 11 in which the placement of the planarizing pattern 15 is prohibited.

Next, in Step SA4, figure logical-MINUS operating means 101 shown in FIG. 35 performs figure logical-MINUS operation (subtraction) for deleting the overlapping portion of the first dummy original pattern 10 with the enlarged wiring pattern 12 to generate a dummy pattern 13 as shown in FIG. 1(d).

Next, in Step SA5, graphic reducing means 102 shown in FIG. 35 reduces the dummy pattern 13 by a specified amount C to generate a reduced dummy pattern 14. In this case, the specified amount C is set to a value corresponding to ½ of the minimum value compliant with design rules for the wiring pattern in accordance with a semiconductor manufacturing process and smaller than ½ of the length A of one side of each square.

Next, in Step SA6, graphic enlarging means 103 shown in FIG. 35 enlarges the reduced dummy pattern 14 by the specified amount C to generate the planarizing pattern 15. The planarizing pattern 15 corresponds to the dummy pattern 13 from which geometric figures smaller than design rules for the wiring pattern in accordance with the semiconductor manufacturing process have been deleted.

Figure 2A:
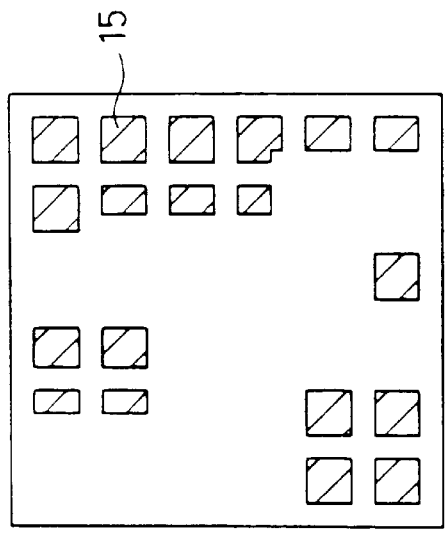
FIGS. 2(a) to 2(c) are plan views illustrating individual process steps in the method of generating a planarizing pattern according to the first embodiment of the present invention.
Figure 2B:
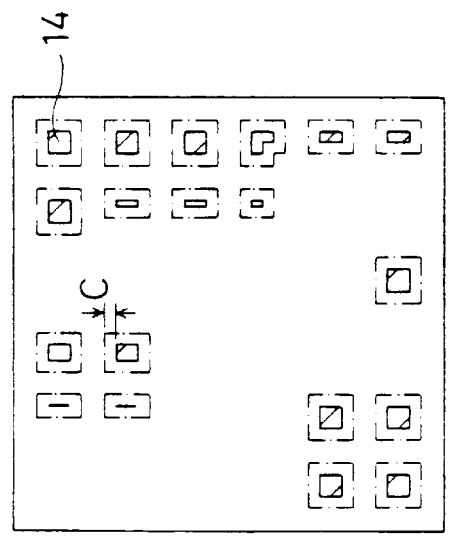
Figure 2C:
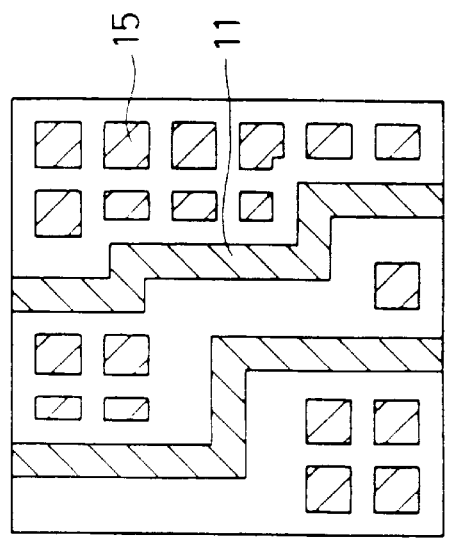

Next, in Step SA7, figure logical-OR operating means 104 shown in FIG. 35 performs figure logical-OR operation between the wiring pattern 11 and the planarizing pattern 15 to generate a final pattern as shown in FIG. 2(c).

Thus, in the process of generating the planarizing pattern 15 according to the first embodiment, the reduced dummy pattern 14 is generated by reducing the dummy pattern 13 by the specified amount C and the remaining reduced dummy pattern 14 is enlarged by the specified amount C to generate the planarizing pattern 15, so that no planarizing pattern 15 smaller than design rules for the wiring pattern in accordance with the semiconductor manufacturing process is generated.

Moreover, since the length A of one side of each square composing the first dummy original pattern 10 has been adjusted to be equal to or higher than the minimum value compliant with design rules for the wiring pattern in accordance with the semiconductor manufacturing process and the foregoing reducing and enlarging steps have been performed, the planarizing pattern 15 can be increased in size, which allows a reduction in the number of figures composing the planarizing pattern 15 and a reduction in the amount of data on the planarizing pattern 15.

Instead of using the method described above, the dummy pattern 13 shown in FIG. 1(d) may also be generated by inverting the wiring pattern 11 to generate an inverted wiring pattern, reducing the inverted wiring pattern by a specified amount to generate a reduced inverted wiring pattern, and performing figure logical-MINUS operation to delete the overlapping portion of the first dummy original pattern 10 with the reduced inverted wiring pattern.

Second Embodiment

Figure 29:
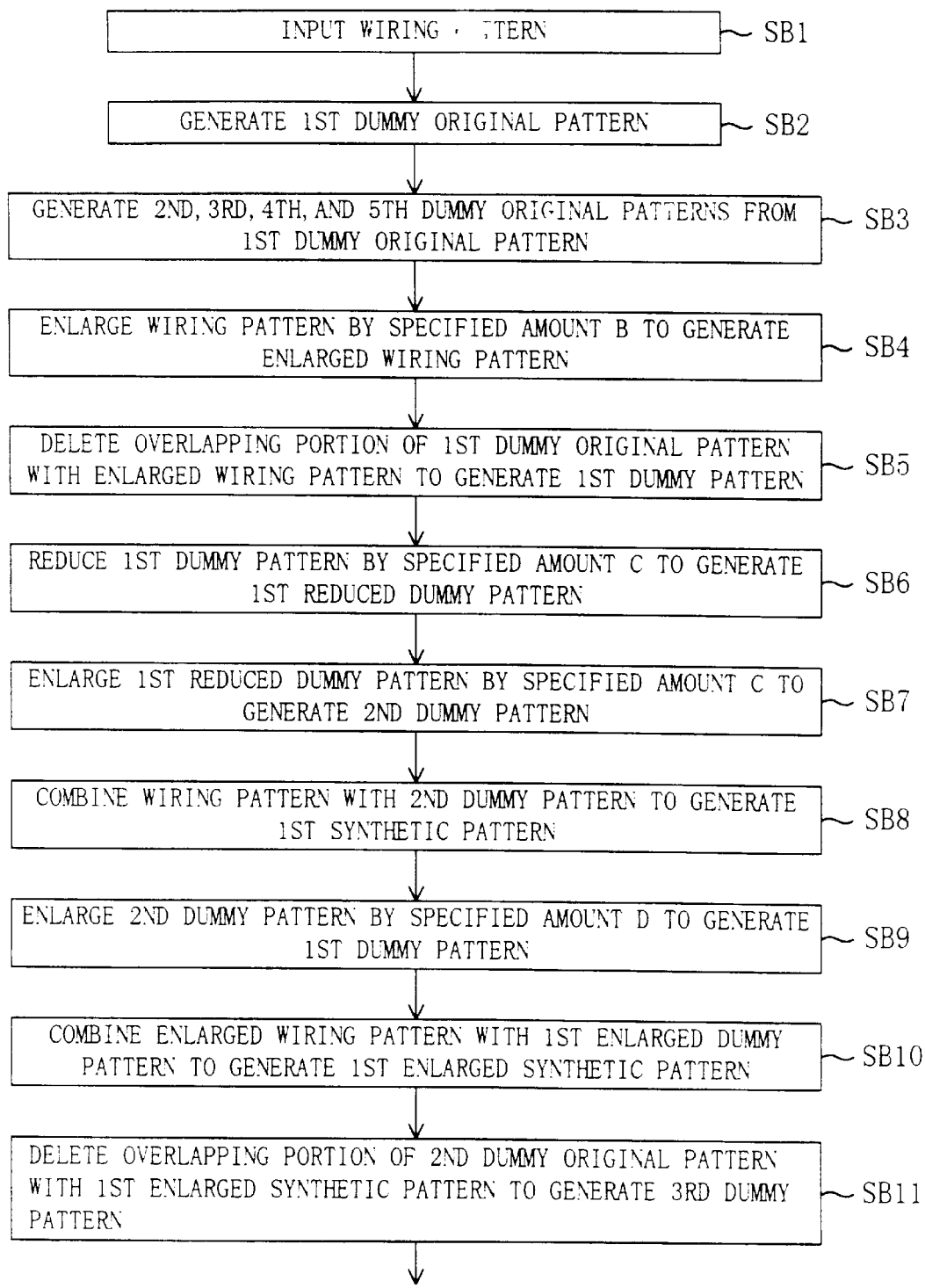
FIG. 29 is a flow chart showing the first-half process in the method of generating a planarizing pattern according to the second embodiment.
Figure 30:
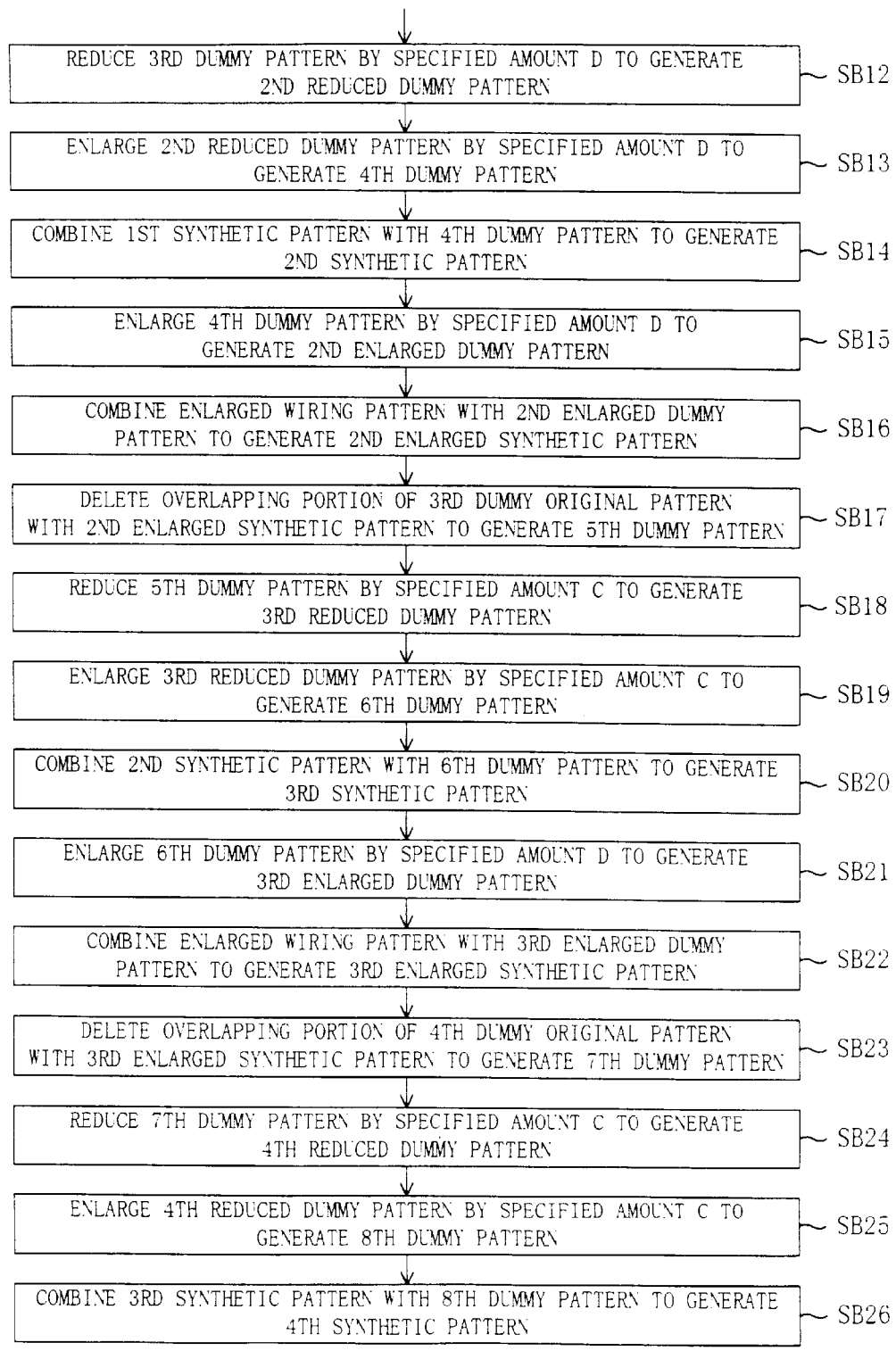
FIG. 30 is a flow chart showing the second-half process in the method of generating a planarizing pattern according to the second embodiment.
Figure 31:
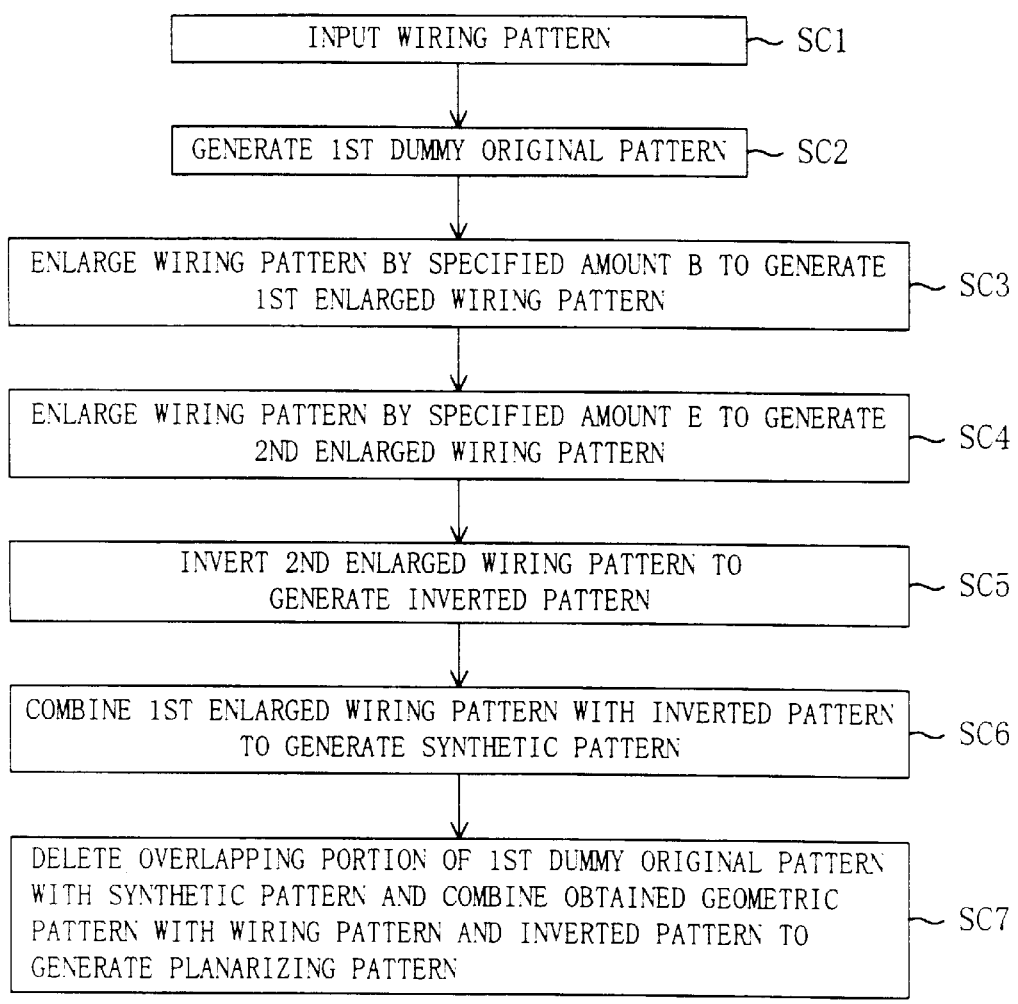
FIG. 31 is a flow chart showing a process in the method of generating a planarizing pattern according to the third embodiment.

A method of generating a planarizing pattern according to a second embodiment of the present invention will be described with reference to FIG. 1(a), FIGS. 3(a) to 3(d), FIGS. 4(a) to 4(d), FIGS. 5(a) to 5(d), FIGS. 6(a) to 6(d), FIGS. 7(a) to 7(d), FIGS. 8(a) to 8(d), FIGS. 9(a) to 9(d), and the flow charts of FIGS. 29 and 30, while a second apparatus for generating a planarizing pattern which is used in the method of generating a planarizing pattern according to the second embodiment will be described with reference to FIG. 36.

First, a wiring pattern is inputted in Step SB1. Then, a first dummy original pattern 10 is generated in Step SB2.

Figure 3A:
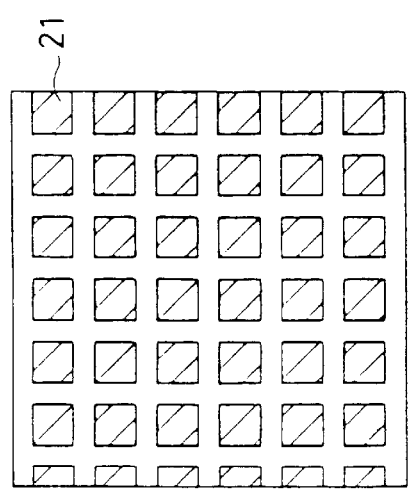
FIGS. 3(a) to 3(d) are plan views illustrating individual process steps in a method of generating a planarizing pattern according to a second embodiment of the present invention.
Figure 3B:
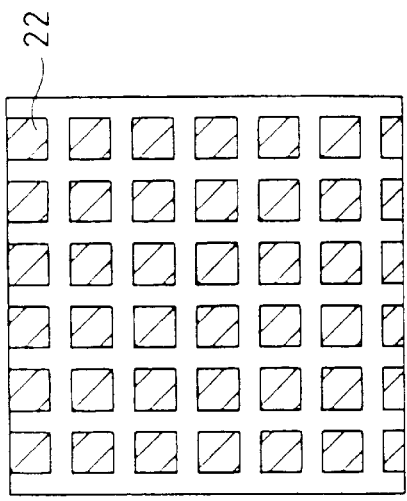
Figure 3C:
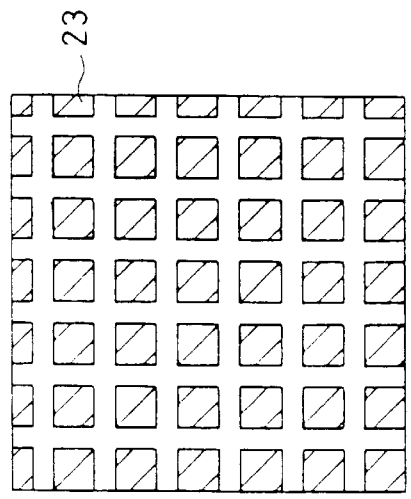
Figure 3D:
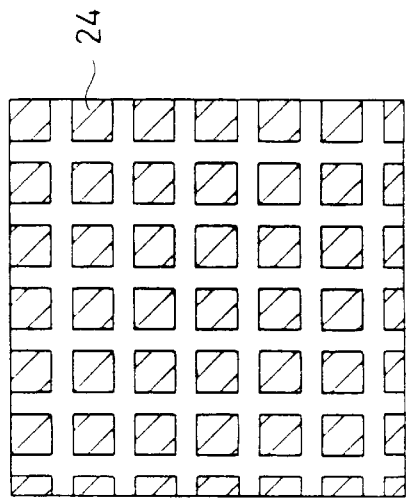

Next, in Step SB3, the first dummy original pattern 10 shown in FIG. 1(a) is moved vertically or horizontally by different amounts to generate a second dummy original pattern 21 shown in FIG. 3(a), a third dummy original pattern 22 shown in FIG. 3(b), a fourth dummy original pattern 23 shown in FIG. 3(c), an d a fifth dummy original pattern 24 shown in FIG. 3(d). The first to fifth dummy original patterns 10 and 21 to 24 are selectively outputted by a switching operation performed by data switching means 200 shown in FIG. 36.

Figure 4A:
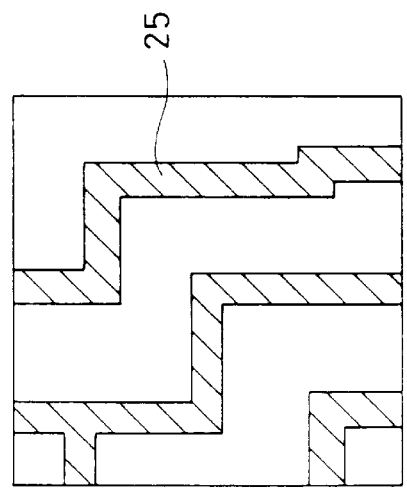
FIGS. 4(a) to 4(d) are plan views illustrating individual process steps in the method of generating a planarizing pattern according to the second embodiment of the present invention.
Figure 4B:
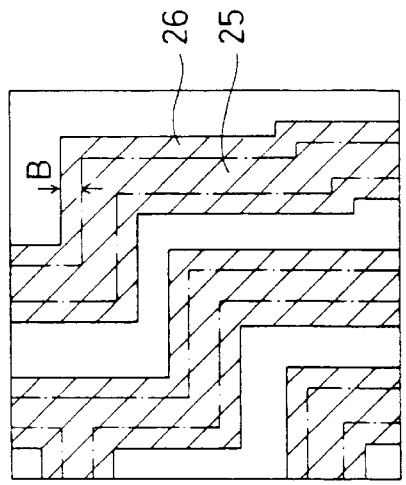
Figure 4C:
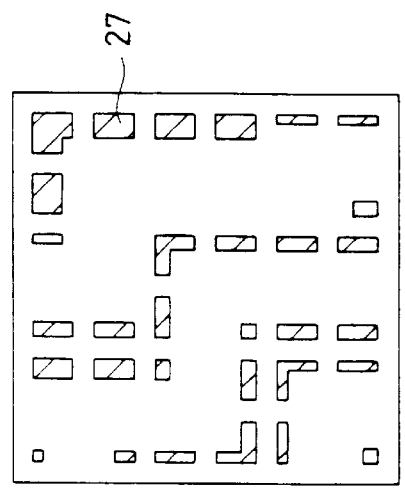
Figure 9B:
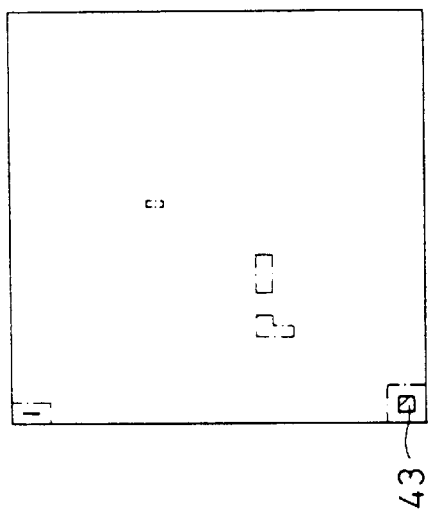
FIGS. 9(a) to 9(d) are plan views illustrating individual process steps in the method of generating a planarizing pattern according to the second embodiment of the present invention.
Figure 9D:
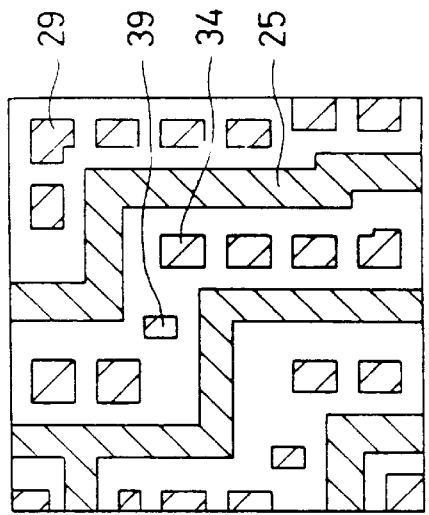
Figure 36:
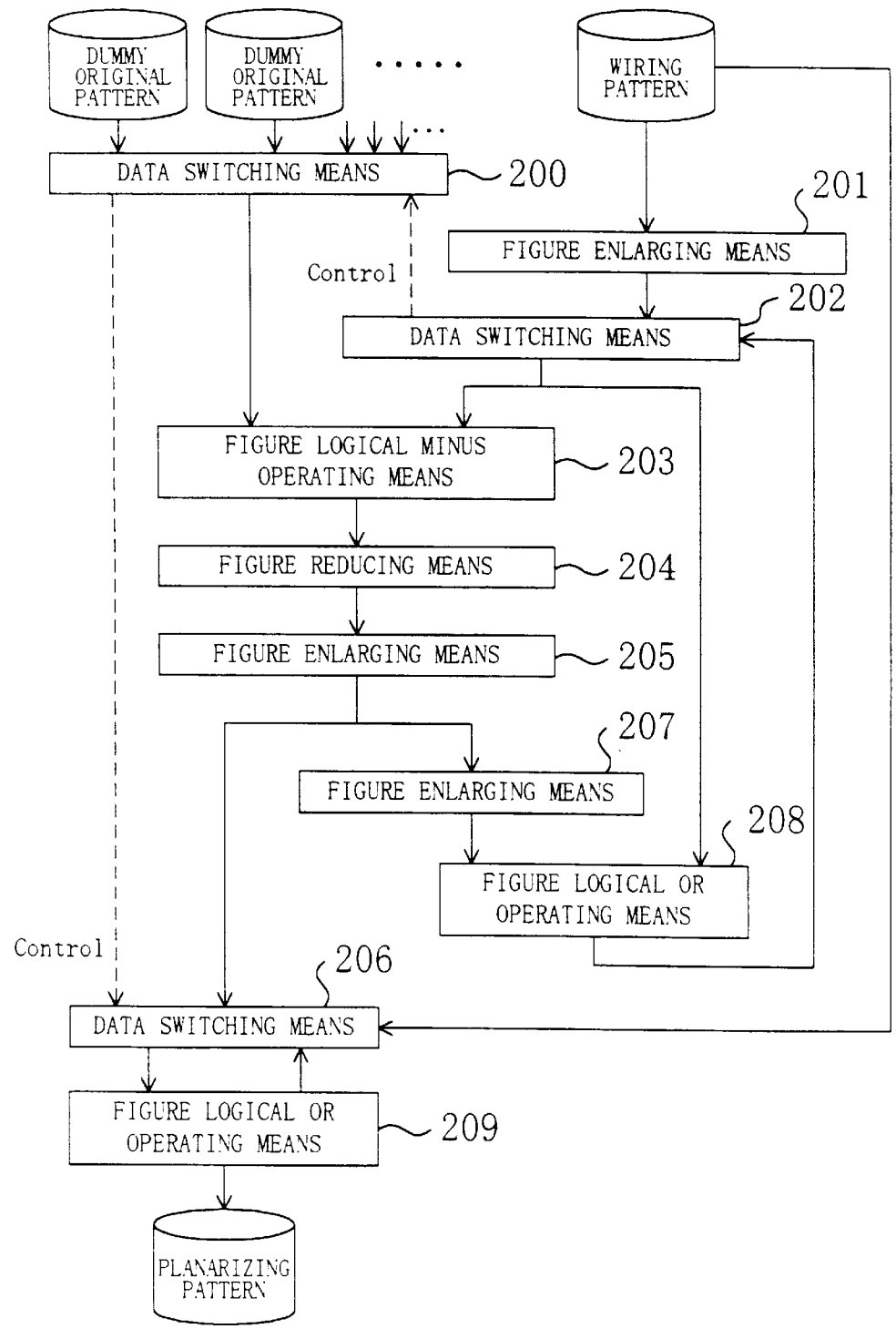
FIG. 36 is a block diagram of an apparatus for generating a second planarizing pattern which is used in the method of generating a planarizing pattern according to the second embodiment.

Next, in Step SB4, graphic enlarging means 201 shown in FIG. 36 enlarges a wiring pattern 25 shown in FIG. 4(a) by a specified amount B to generate an enlarged wiring pattern 26 shown in FIG. 4(b), which is outputted to data switching means 202 shown in FIG. 36. The value of the specified amount B corresponds to the minimum spacing between the wiring pattern 25 and a planarizing pattern (see FIG. 9(d)) finally obtained. The enlarged wiring pattern 26 corresponds to a region in the vicinity of the wiring pattern 25 in which the placement of the planarizing pattern shown in FIG. 9(d) is prohibited.

Figure 4D:
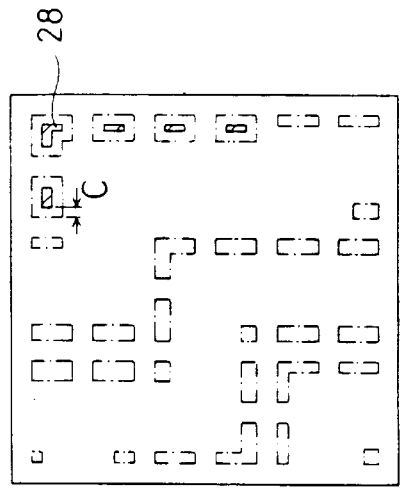

Next, in Step SB5, figure logical-MINUS operating means 203 shown in FIG. 36 performs figure logical-MINUS operation for deleting the overlapping portion of the first dummy original pattern 10 shown in FIG. 1(a) with the enlarged wiring pattern 26 to generate a first dummy pattern 27 shown in FIG. 4(d).

Next, in Step SB6, graphic reducing means 204 shown in FIG. 36 reduces the first dummy pattern 27 by a specified amount C to generate a first reduced dummy pattern 28. In this case, the specified amount C is set to a value corresponding to ½ of the minimum value compliant with design rules for a wiring pattern in accordance with a semiconductor manufacturing process and smaller than ½ of the length A of one side of each square.

Figure 5A:
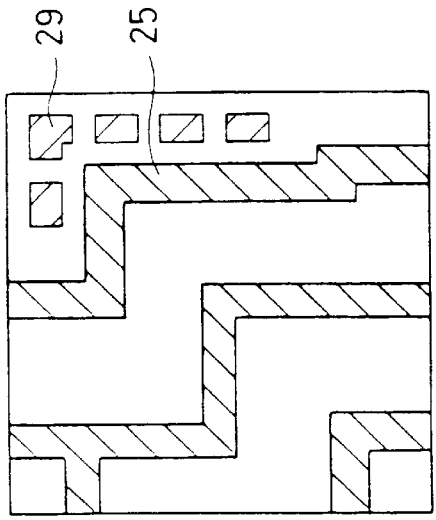
FIGS. 5(a) to 5(d) are plan views illustrating individual process steps in the method of generating a planarizing pattern according to the second embodiment of the present invention.

Next, in Step SB7, graphic enlarging means 205 shown in FIG. 36 enlarges the first reduced dummy pattern 28 by a specified amount C to generate a second dummy pattern 29 shown in FIG. 5(a). The second dummy pattern 29 corresponds to the first dummy pattern 27 from which figures smaller than design rules for the wiring pattern in accordance with the semiconductor manufacturing process have been deleted. The second dummy pattern 29 is outputted to data switching means 206, while it is outputted to figure logical-OR operating means 208 via graphic enlarging means 207.

Figure 5B:
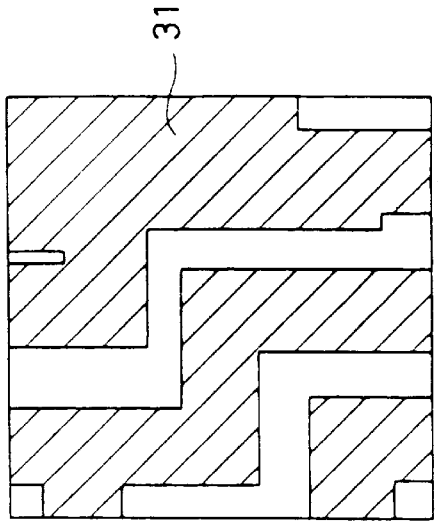

Next, in Step SB8, the figure logical-OR operating means 208 shown in FIG. 36 performs figure logical-OR operation between the wiring pattern 25 and the second dummy pattern 29 to generate a first synthetical pattern as shown in FIG. 5(b), which is composed of the wiring pattern 25 and the second dummy pattern 29 combined with each other.

Figure 5C:
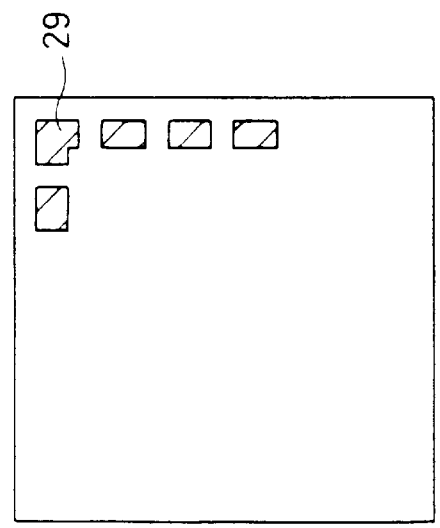

Next, in Step SB9, the graphic enlarging means 207 shown in FIG. 36 enlarges the second dummy pattern 29 by a specified amount D to generate a first enlarged dummy pattern 30 shown in FIG. 5(c). In this case, the value of the specified amount D corresponds to the minimum spacing between the wiring pattern 25 and the planarizing pattern (see FIG. 9(d)) finally obtained.

Figure 5D:
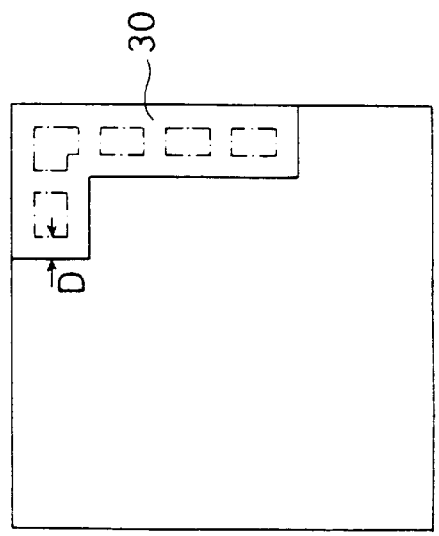

Next, in Step SB10, the figure logical-OR operating means 208 shown in FIG. 36 performs figure local-OR operation between the enlarged wiring pattern 26 and the first enlarged dummy pattern 30 to generate a first enlarged synthetical pattern 31 as shown in FIG. 5(d). The first enlarged synthetical pattern 31 corresponds to a region in the vicinity of each of the wiring pattern 25 and the second dummy pattern 29 in which the placement of the planarizing pattern shown in FIG. 9(d) is prohibited.

Figure 6A:
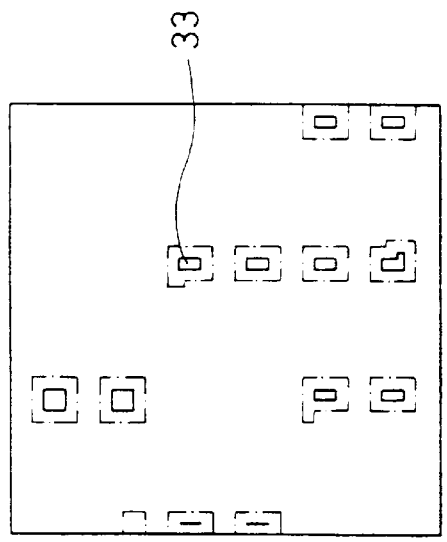
FIGS. 6(a) to 6(d) are plan views illustrating individual process steps in the method of generating a planarizing pattern according to the second embodiment of the present invention.
Figure 6B:
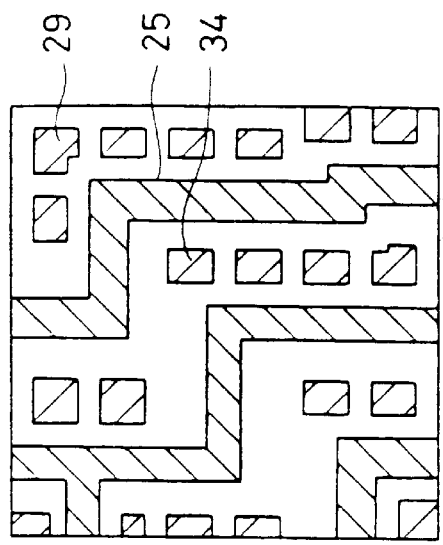

Next, in Step SB11, the figure logical-MINUS operating means 203 shown in FIG. 36 performs figure logical-MINUS operation for deleting the overlapping portion of the second dummy original pattern 21 shown in FIG. 3(a) with the first enlarged synthetical pattern 31 to generate a third dummy pattern 32 as shown in FIG. 6(a).

Next, in Step SB12, the graphic reducing means 204 shown in FIG. 36 reduces the third dummy pattern 32 by a specified amount D to generate a second reduced dummy pattern 33.

Figure 6C:
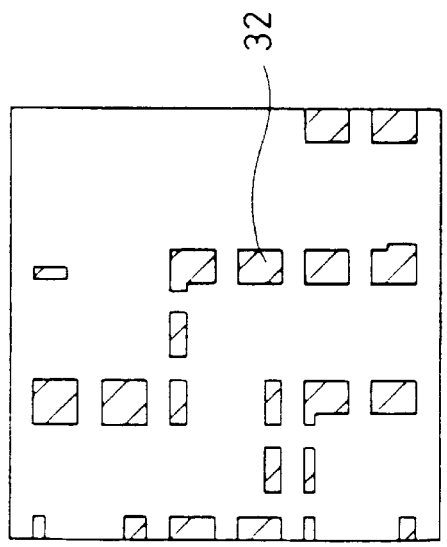

Next, in Step SB13, the graphic enlarging means 205 shown in FIG. 36 enlarges the second reduced dummy pattern 33 by a specified amount D to generate a fourth dummy pattern 34 shown in FIG. 6(c). The fourth dummy pattern 34 corresponds to the second dummy pattern 21 from which figures smaller than design rules for the wiring pattern in accordance with the semiconductor manufacturing process have been deleted.

Figure 6D:
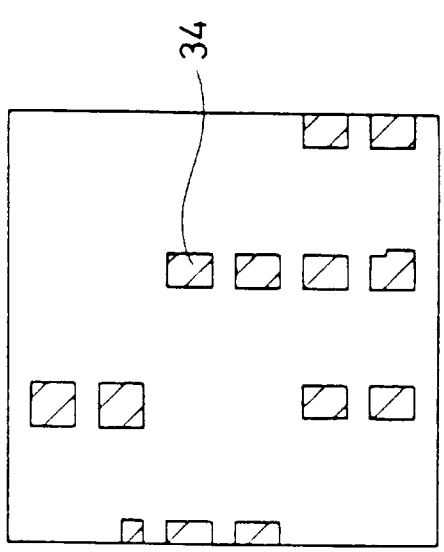

Next, in Step SB14, the figure logical-OR operating means 208 shown in FIG. 36 performs figure logical-OR operation between the first synthetical pattern shown in FIG. 5(b) and the fourth dummy pattern 34 to generate a second synthetical pattern as shown in FIG. 6(d), which is composed of the wiring pattern 25, the second dummy pattern 25, and the fourth dummy pattern 34 combined with each other.

Figure 7A:
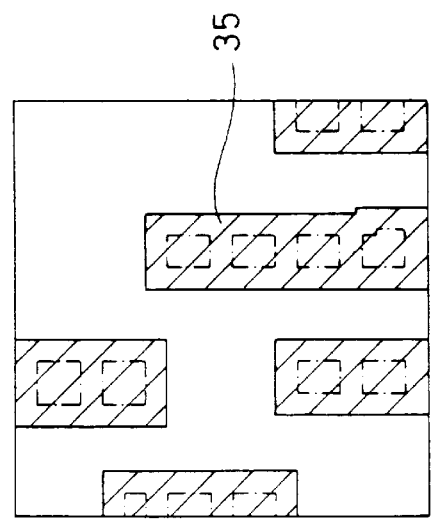
FIGS. 7(a) to 7(d) are plan views illustrating individual process steps in the method of generating a planarizing pattern according to the second embodiment of the present invention.
Figure 7B:
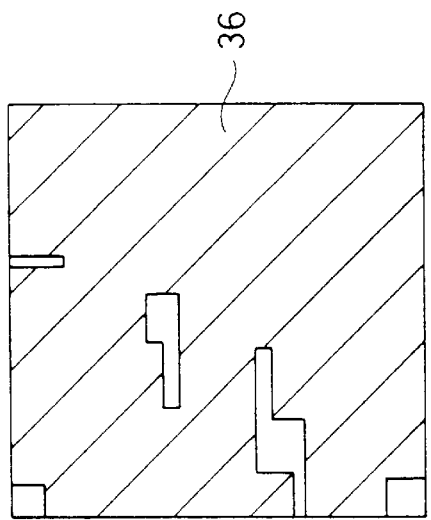

Next, in Step SB15, the graphic enlarging means 207 shown in FIG. 36 enlarges the fourth dummy pattern 34 by a specified amount D to generate a second enlarged dummy pattern 35. Thereafter, in Step SB16, figure logical-OR operation is performed between the enlarged wiring pattern 26 and the second enlarged dummy pattern 35 to generate a second enlarged synthetical pattern 36 as shown in FIG. 7(b).

Figure 7C:
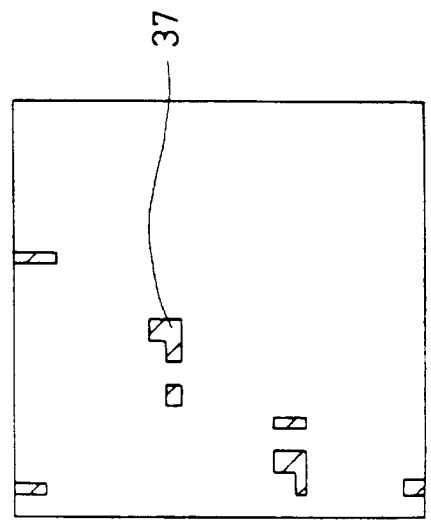
Figure 7D:
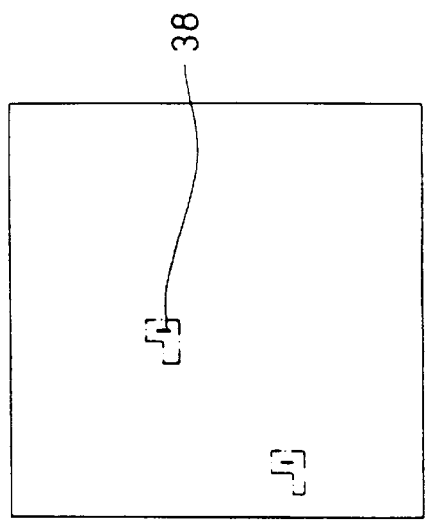

Next, in Step SB17, the figure logical-MINUS operating means 203 shown in FIG. 36 performs figure logical-MINUS operation for deleting the overlapping portion of the third dummy original pattern 22 shown in FIG. 3(b) with the second enlarged synthetical pattern 36 to generate a fifth dummy pattern 37 as shown in FIG. 7(c).

Next, in Step SB18, the graphic reducing means 204 shown in FIG. 36 reduces the fifth dummy pattern 37 by a specified amount C to generate a third reduced dummy pattern 38.

Next, in Step SB19, the graphic enlarging means 205 shown in FIG. 36 enlarges the third reduced dummy pattern 38 by the specified amount C to generate a sixth dummy pattern 39 shown in FIG. 8(a).

Next, in step SB20, the figure logical-OR operating means 208 shown in FIG. 36 performs figure logical-OR operation between the second synthetical pattern shown in FIG. 6(d) and the sixth dummy pattern 39 to generate a third synthetical pattern composed of the wiring pattern 25 as shown in FIG. 8(b), the second dummy pattern 29, the fourth dummy pattern 34, and the sixth dummy pattern 39 combined with each other.

Next, in Step SB21, the graphic enlarging means 207 shown in FIG. 36 enlarges the sixth dummy pattern 39 by the specified amount D to generate a third enlarged dummy pattern 40 shown in FIG. 8(c). Thereafter, in Step SB22, the figure logical-OR operating means 208 shown in FIG. 36 performs figure logical-OR operation between the enlarged wiring pattern 26 and the third enlarged dummy pattern 40 to generate a third enlarged synthetical pattern 41 as shown in FIG. 8(d).

Figure 9A:
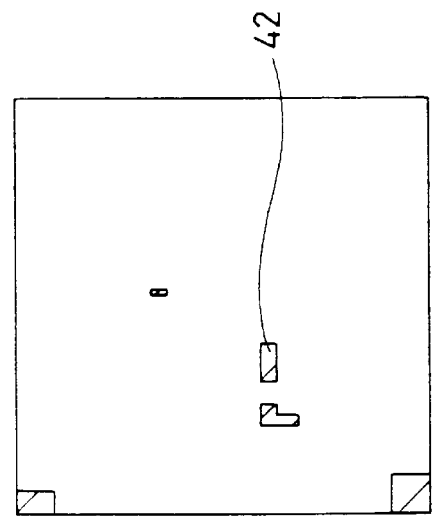

Next, in Step SB23, the figure logical-MINUS operating means 203 shown in FIG. 36 performs figure logical-MINUS operation for deleting the overlapping portion of the fourth dummy original pattern 23 shown in FIG. 3(c) with the third enlarged synthetical pattern 41 to generate a seventh dummy pattern 42 as shown in FIG. 9(a).

Next, in Step SB24, the graphic reducing means 204 shown in FIG. 36 reduces the seventh dummy pattern 42 by the specified amount C to generate a fourth reduced dummy pattern 43.

Figure 9C:
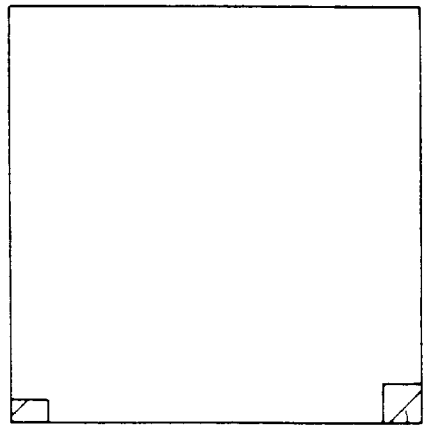

Next, in Step SB25, the graphic enlarging means 205 shown in FIG. 36 enlarges the fourth reduced dummy pattern 43 by the specified amount C to generate an eighth dummy pattern 44 shown in FIG. 9(c).

Next, in Step SB26, figure logical-OR operating means 209 shown in FIG. 36 performs figure logical-OR operation between the third synthetical pattern shown in FIG. 8(b) and the eighth dummy pattern 44 to generate a fourth synthetical pattern composed of the wiring pattern as shown in FIG. 9(d), the second dummy pattern 29, the fourth dummy pattern 34, the sixth dummy pattern 39, and the eighth dummy pattern 44. Although the fourth synthetical pattern is the final planarizing pattern generated from the dummy pattern 10 shown in FIG. 1(a), the second dummy original pattern 21 shown in FIG. 3(a), the third dummy original pattern 22 shown in FIG. 3(b), and the fourth dummy original pattern 23 shown in FIG. 3(c), the planarizing pattern may also be generated in consideration of the fifth dummy original pattern 23 shown in FIG. 3(d) in addition to the foregoing patterns by the same process as described above.

Thus, according to the second embodiment, no planarizing pattern smaller than design rules for the wiring pattern in accordance with the semiconductor manufacturing process is generated, similarly to the first embodiment.

Moreover, the planarizing pattern is formed in the second embodiment by using, in addition to the first dummy original pattern 10, the second to fourth dummy original patterns 21 to 23 obtained by parallel-shifting the first dummy original pattern 10, so that the simple geometric figure composing the planarizing pattern becomes larger in size than in the first embodiment, resulting in a reduced number of figures composing the planarizing pattern and a reduced amount of data on the planarizing pattern.

Furthermore, the planarizing pattern is formed in the second embodiment by using the first to fourth dummy original patterns 10 and 21 to 23, so that a region lying between the adjacent wiring patterns and unfilled with the planarizing pattern becomes smaller than in the first embodiment. Consequently, there can be formed a planarizing pattern which imparts a sufficient degree of planarity required by the semiconductor manufacturing process to a wiring layer.

Third Embodiment

A method of generating a planarizing pattern according to a third embodiment of the present invention will be described with reference to FIGS. 1(a) and 1(b), FIGS. 11(a) and 11(b), FIGS. 12(a) and 12(b), and the flow chart of FIG.

31, while a third apparatus for generating a planarizing pattern which is used in the method of generating a planarizing pattern according to the third embodiment will be described with reference to FIG. 37.

Figure 37:
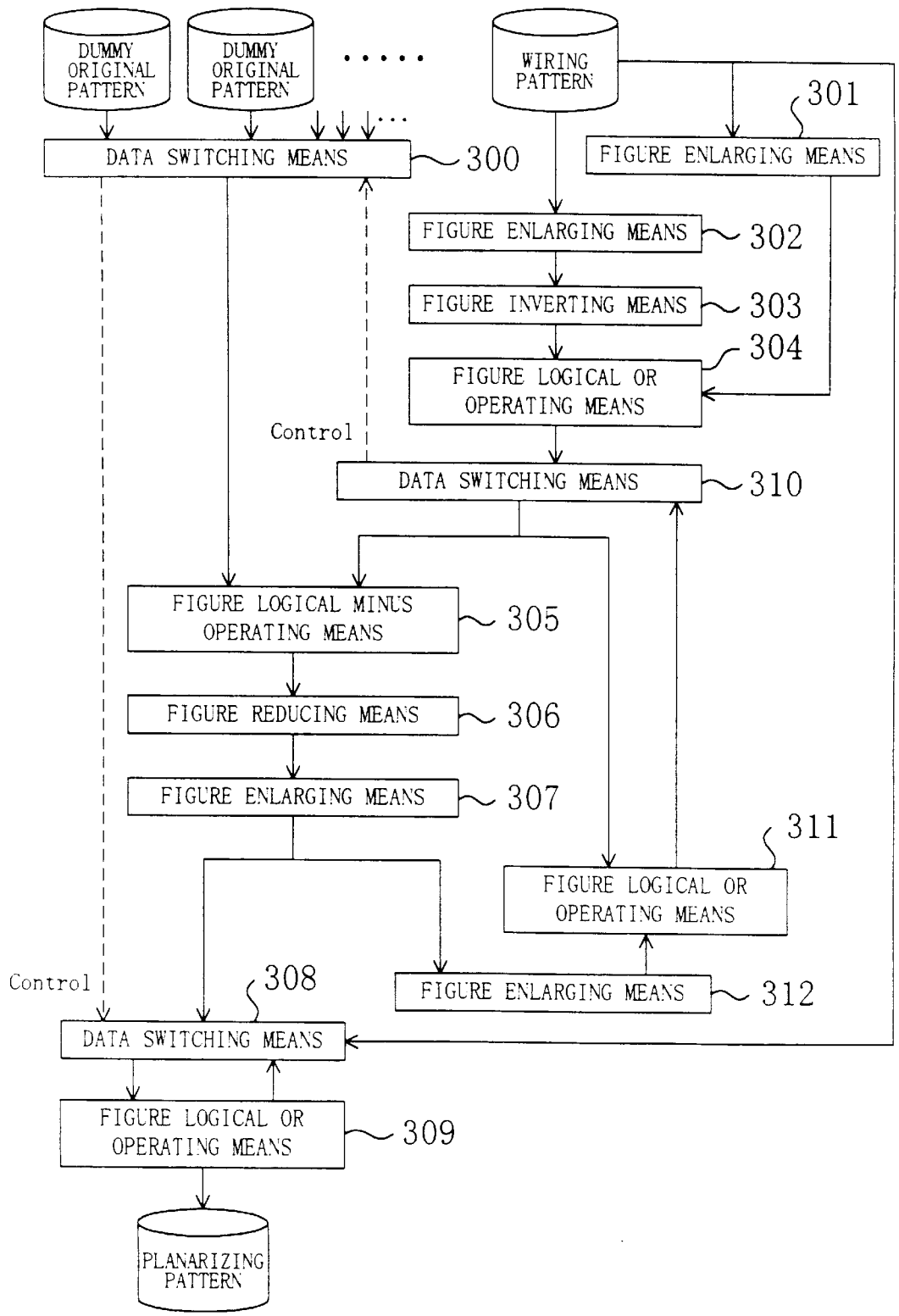
FIG. 37 is a block diagram of an apparatus for generating a third planarizing pattern which is used in the method of generating a planarizing pattern according to the third embodiment.

Although the first to fifth dummy original patterns 10 and 21 to 24 mentioned above are selectively outputted by a switching operation performed by data switching means 300 shown in FIG. 37 to be used properly, the third embodiment will describe the case where the first dummy original pattern 10 is used.

First, a wiring pattern is inputted in Step SC1. Then, a first dummy original pattern 10 is generated in Step SC2.

Figure 10B:
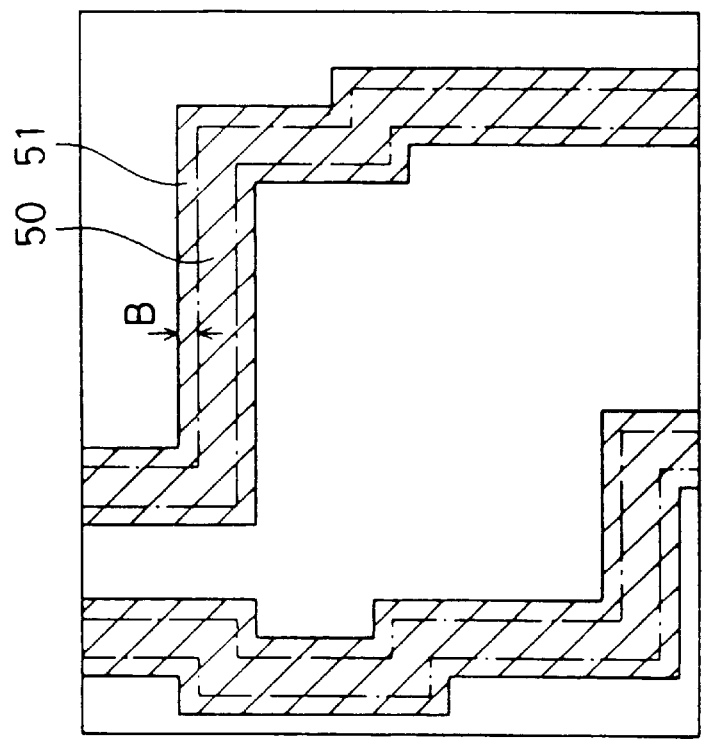
FIGS. 10(a) and 10(b) are plan views illustrating individual process steps in a method of generating a planarizing pattern according to a third embodiment of the present invention.
Figure 10A:
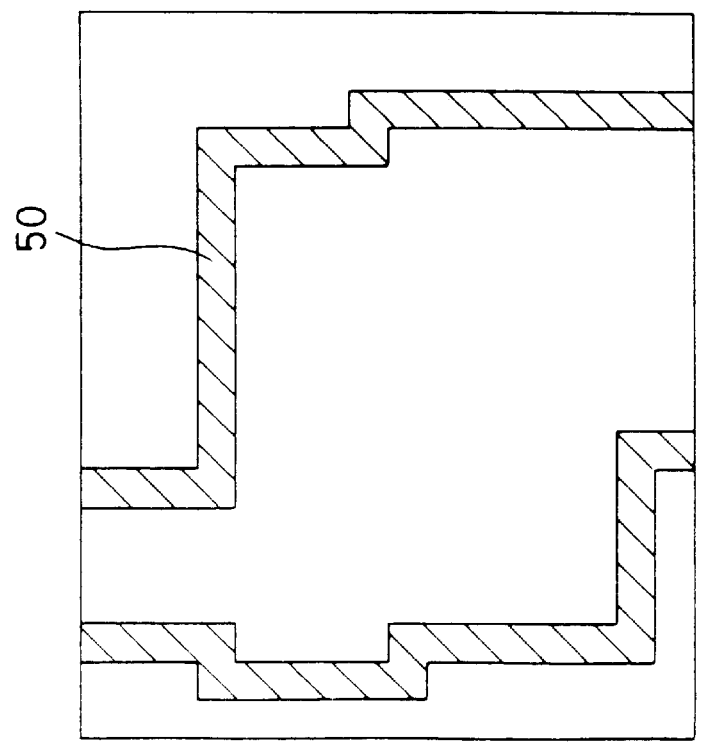

Next, in Step SC3, graphic enlarging means 301 shown in FIG. 37 enlarges a wiring pattern 50 shown in FIG. 10(a) by a specified amount B to generate a first enlarged wiring pattern 51 shown in FIG. 10(b). In this case, the value of the specified amount B corresponds to the minimum spacing between the wiring pattern 50 and a planarizing pattern (see FIG. 12(b)) finally obtained. The first enlarged wiring pattern 51 corresponds to a region in the vicinity of the wiring pattern 50 in which the placement of the planarizing pattern is prohibited.

Next, in Step SC4, graphic enlarging means 302 shown in FIG. 37 enlarges the wiring pattern 50 shown in FIG. 10(a) by a specified amount E to generate a second enlarged wiring pattern 52 shown in FIG. 11(a). The specified amount E is equal to or larger than the sum of the length A of one side of each square as the simple geometric figure composing the wiring pattern 50 used in the first embodiment, the spacing a between the adjacent squares, and the specified amount B corresponding to the width of the region in the vicinity of the wiring pattern 50 in which the placement of the planarization is prohibited.

Next, in Step SC5, graphic inverting means 303 shown in FIG. 37 performs graphic inversion with respect to the second enlarged wiring pattern 52 to generate an inverted pattern 53 shown in FIG. 11(b).

Next, in Step SC6, figure logical-OR operating means 304 shown in FIG. 37 performs figure logical-OR operation between the first enlarged wiring pattern 51 and the inverted pattern 53 to generate a synthetical pattern shown in FIG. 12(a). The synthetical pattern corresponds to the region in the vicinity of the wiring pattern 50 in which the placement of the planarizing pattern generated from the first dummy original pattern 10 is prohibited. The synthetical pattern shown in FIG. 12(a) is outputted to figure logical-MINUS operating means 305 shown in FIG. 37 via data switching means 305 shown in FIG. 37.

Next, in Step SC7, the figure logical-MINUS operating means 305 performs figure logical-MINUS operation for deleting the overlapping portion of the first dummy original pattern 10 shown-in FIG. 1(a) with the synthetical pattern shown in FIG. 12(a). The geometric pattern obtained is outputted to figure logical-OR operating means 309 via graphic reducing means 306, graphic enlarging means 307, and data switching means 308 each shown in FIG. 37.

Next, in the same Step SC7, the figure logical-OR operating means 309 shown in FIG. 37 performs figure logical-OR operation between the wiring pattern 50, the inverted pattern 53, and the graphic pattern obtained by figure logical-MINUS operation for deleting the overlapping portion of the first dummy original pattern 10 with the synthetical pattern shown in FIG. 12(a) to generate the final planarizing pattern shown in FIG. 12(b).

Although the graphic reducing means 306, the graphic enlarging means 307, data switching means 310, figure logical-OR operating means 311, and graphic enlarging means 312 each shown in FIG. 37 are not used in the third embodiment, they have similar functions to those of the graphic reducing means 204, graphic enlarging means 205, data switching means 202, figure logical-OR operating means 208, and graphic enlarging means 207 shown in FIG. 35.

Thus, according to the third embodiment, the planarizing pattern composed of an indiscrete pattern corresponding to the inverted pattern 53 is formed in the region other than the vicinity of the wiring pattern 50, so that the number of the figures composing the planarizing pattern and the amount of data on the planarizing pattern is reduced compared with the case where the planarizing pattern composed of the simple geometric figures is formed.

Instead of using the foregoing method, the planarizing pattern may also be generated by inverting the wiring pattern 50 to generate an inverted pattern, reducing the inverted pattern by a specified amount to generate a reduced inverted pattern, and performing the figure logical-OR operation between the reduced inverted pattern and a dummy pattern obtained by figure logical-MINUS operation for deleting the overlapping portion of the first dummy original pattern 10 with the first enlarged wiring pattern 51 and with the reduced inverted pattern. Alternatively, the planarizing pattern may be generated by inverting the second enlarged wiring pattern 52 to generate a first inverted pattern, reducing the first inverted pattern by a specified amount to generate a reduced inverted pattern, enlarging the reduced inverted pattern by a specified amount to generate a second inverted pattern, and performing figure logical-OR operation between the second inverted pattern and a dummy pattern obtained by figure logical-MINUS operation for deleting the overlapping portion of the first dummy original pattern 10 with the first enlarged wiring pattern 52 and with the second inverted pattern.

Fourth Embodiment

Figure 32:
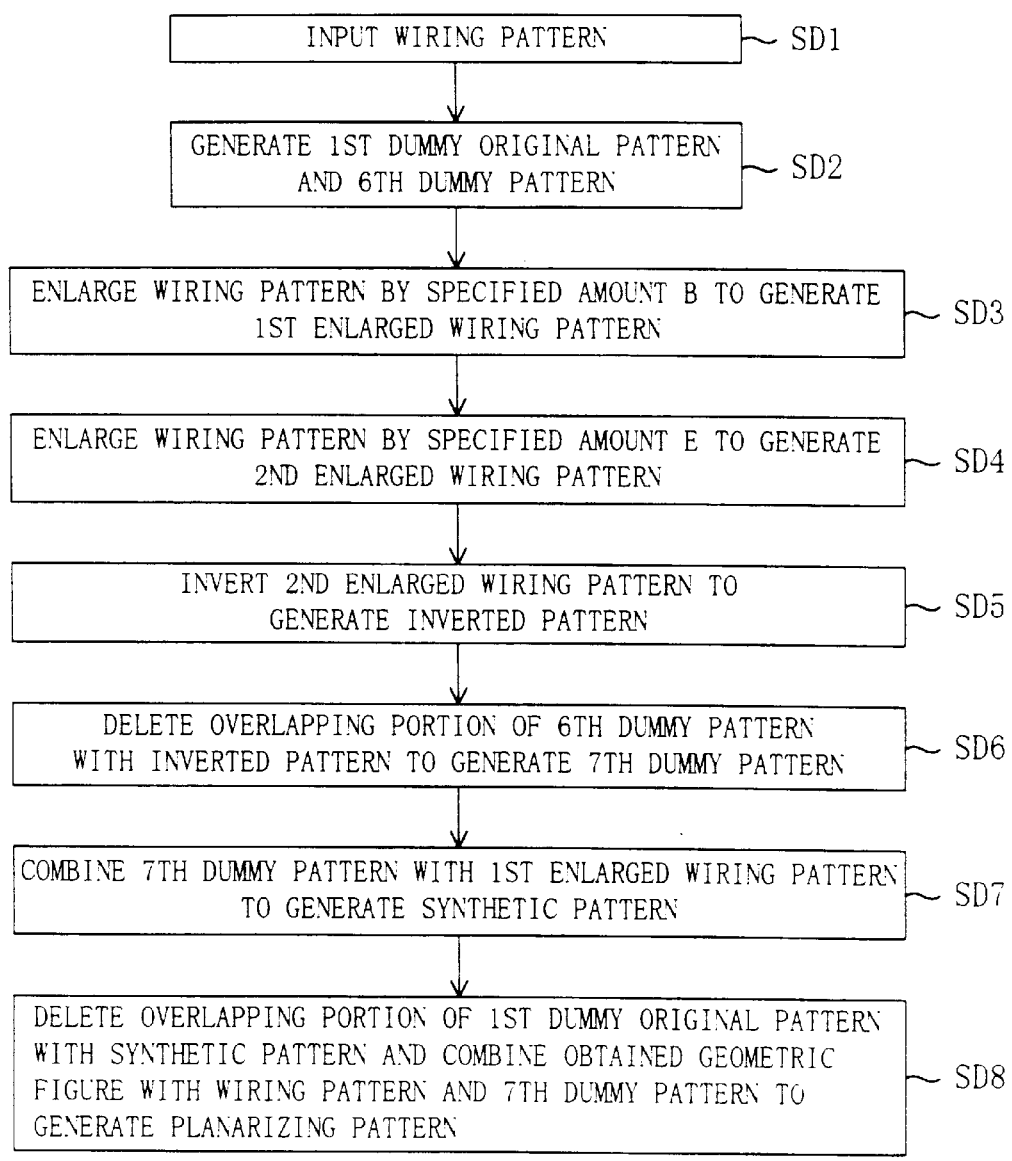
FIG. 32 is a flow chart showing a process in the method of generating a planarizing pattern according to the fourth embodiment.

A method of generating a planarizing pattern according to a fourth embodiment of the present invention will be described with reference to FIGS. 13(a) and 13(b), FIGS. 14(a) and 14(b), and the flow chart of FIG. 32, while a fourth apparatus for generating a planarizing pattern which is used in the method of generating a planarizing pattern according to the fourth embodiment will be described with reference to FIG. 38.

Figure 38:
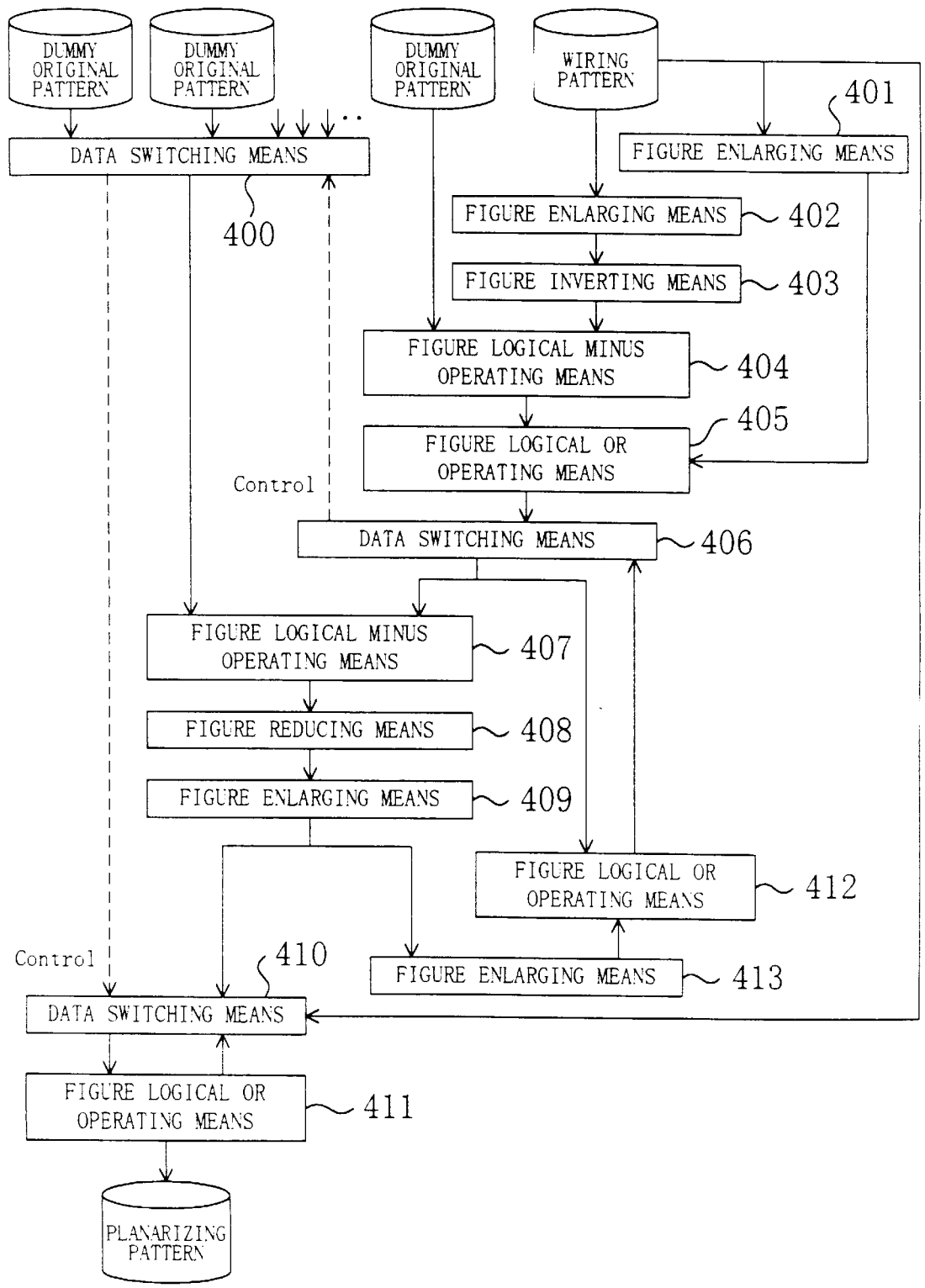
FIG. 38 is a block diagram of an apparatus for generating a fourth planarizing pattern which is used in the method of generating a planarizing pattern according to the fourth embodiment.

Although the first to fifth dummy original patterns 10 and 21 to 24 mentioned above are selectively outputted by a switching operation performed by data switching means 400 shown in FIG. 38 to be used properly, the fourth embodiment will describe the case where the first dummy original pattern 10 is used.

First, a wiring pattern is inputted in Step SD1. Then, in Step SD2, a first dummy original pattern 10 is generated, while a sixth dummy pattern 55 composed of simple geometric figures larger than the simple geometric figures composing the first dummy original pattern 10, such as squares, shown in FIG. 13(a) is generated.

Next, in Step SD3, graphic enlarging means 401 shown in FIG. 38 enlarges the wiring pattern 50 shown in FIG. 10(a) by a specified amount B to generate a first enlarged wiring pattern 51 shown in FIG. 10(b), similarly to the third embodiment. Subsequently, in Step SD4, graphic enlarging means 402 shown in FIG. 38 enlarges the wiring pattern 50 by a specified amount to generate a second enlarged wiring pattern 52. Thereafter, in Step SD5, graphic inverting means 403 shown in FIG. 38 inverts the second enlarged wiring pattern 52 to generate an inverted pattern 53 shown in FIG. 11(b).

Next, in Step SD6, figure logical-MINUS operating means 404 shown in FIG. 38 performs figure logical-MINUS operation for deleting the overlapping portion of the sixth dummy pattern 55 with the inverted pattern 53 shown in FIG. 11(b) to generate a seventh dummy pattern 56 as shown in FIG. 13(b).

Figures 14A, 14B:
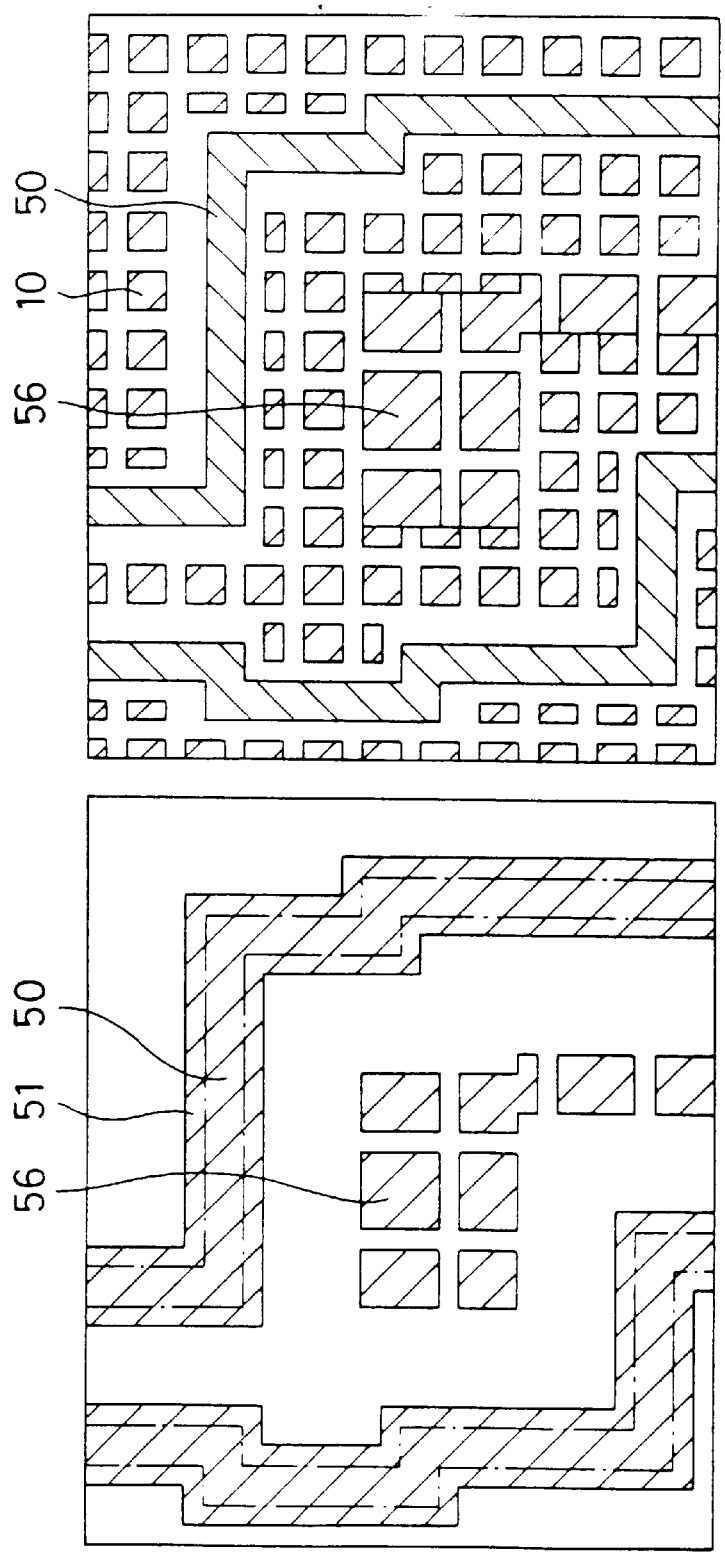
FIGS. 14(a) and 14(b) are plan views illustrating individual process steps in the method of generating a planarizing pattern according to the fourth embodiment of the present invention.

Next, in Step SD7, figure logical-OR operating means 405 shown in FIG. 38 performs figure logical-OR operation between the seventh dummy pattern 56 and the first enlarged wiring pattern 51 shown in FIG. 10(b) to generate a synthetical pattern as shown in FIG. 14(a). The synthetical pattern of FIG. 14(a) corresponds to a region in the vicinity of the wiring pattern 50 shown in FIG. 10(a) in which the placement of the planarization generated from the first dummy original pattern 10 is prohibited. The synthetical pattern shown in FIG. 14(a) is outputted to figure logical-MINUS operating means 407 shown in FIG. 38 via data switching means 406 shown in FIG. 38.

Next, in Step SD8, the figure logical-MINUS operating means 407 shown in FIG. 38 performs logical-MINUS operation for deleting the overlapping portion of the first dummy original pattern 10 shown in FIG. 1(a) with the synthetical pattern shown in FIG. 14(a). The obtained geometric pattern is outputted to figure logical-OR operating means 411 via graphic reducing means 408, graphic enlarging means 409, and data switching means 410 each shown in FIG. 38.

Next, in the same Step SD8, figure logical-OR operating means 411 shown in FIG. 38 performs figure logical-OR operation between the wiring pattern 50, the seventh dummy pattern 56, and a geometric pattern obtained by figure logical-MINUS operation for deleting the overlapping portion of the first dummy original pattern 10 with the synthetical pattern shown in FIG. 14(a) to generate a final planarizing pattern shown in FIG. 14(b).

Although the graphic reducing means 408, graphic enlarging means 409, figure logical-OR operating means 412, and graphic enlarging means 413 shown in FIG. 38 are not used in the fourth embodiment, they have similar functions to those of the graphic reducing means 204, graphic enlarging means 205, data switching means 202, figure logical-OR operating means 208, and graphic enlarging means 207 shown in FIG. 35.

Thus, according to the fourth embodiment, the planarizing pattern is formed from the sixth dummy original pattern 55 composed of the simple geometric figures larger in size than the simple geometric figures composing the first dummy original pattern 10 in the region other than the vicinity of the wiring pattern 50, so that the number of the figures composing the planarizing pattern and the amount of data on the planarizing pattern is reduced compared with the case where the first dummy original pattern 10 according to the first or second embodiment is used. Since the indiscrete pattern as formed in the third embodiment is not formed in the region other than the vicinity of the wiring pattern 50 in the present embodiment, an increase in parasitic capacitance caused by the planarizing pattern in the wiring layer overlying or underlying the wiring layer in which the wiring pattern 50 is formed can be suppressed. Hence, there can be achieved the reduction in the number of the figures composing the planarizing pattern and the reduction in the amount of data on the planarizing pattern simultaneously with the suppression of increased parasitic capacitance in the upper or lower wiring layer.

Fifth Embodiment

Figure 33:
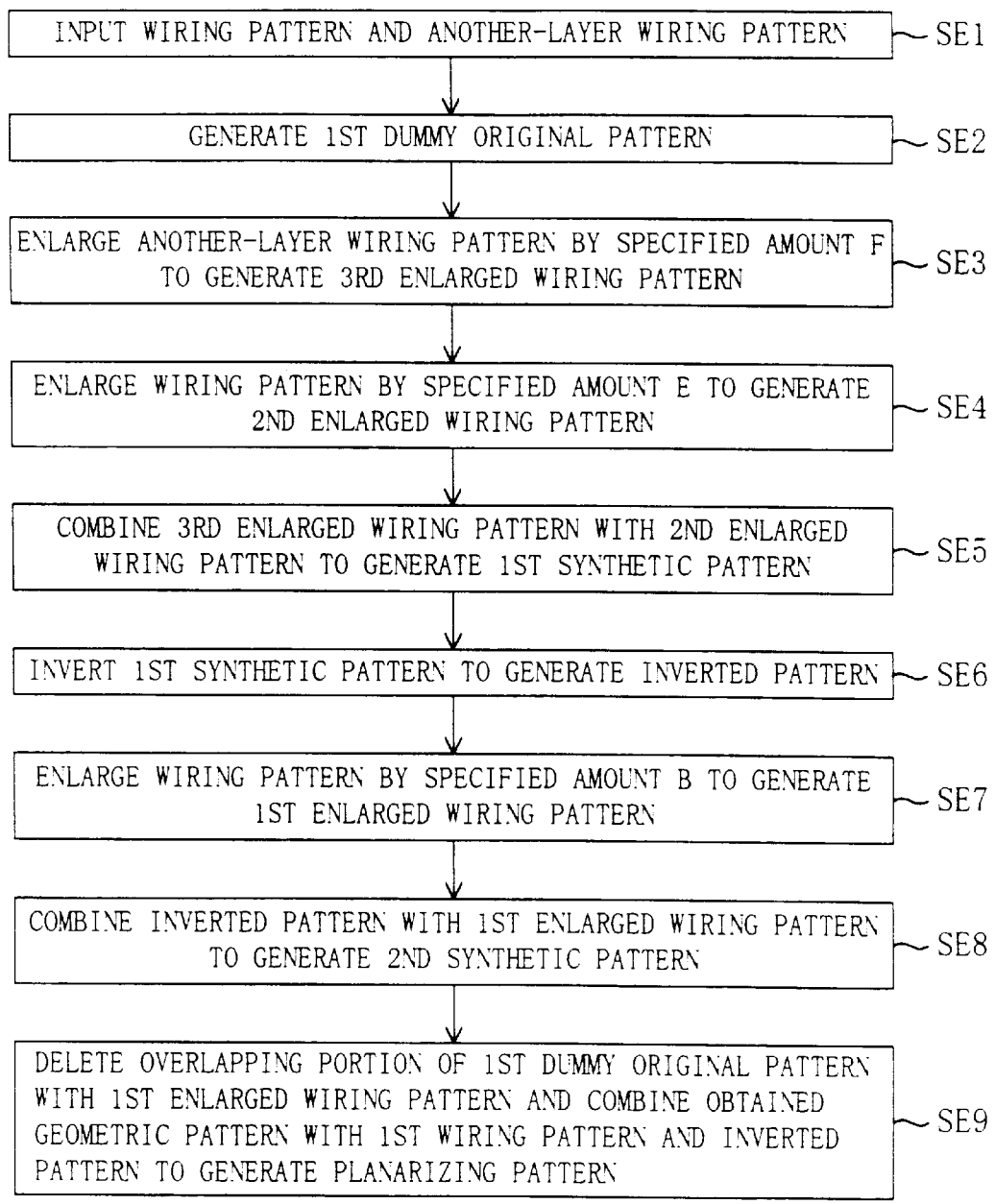
FIG. 33 is a flow chart showing a process in the method of generating a planarizing pattern according to the fifth embodiment.
Figure 34:
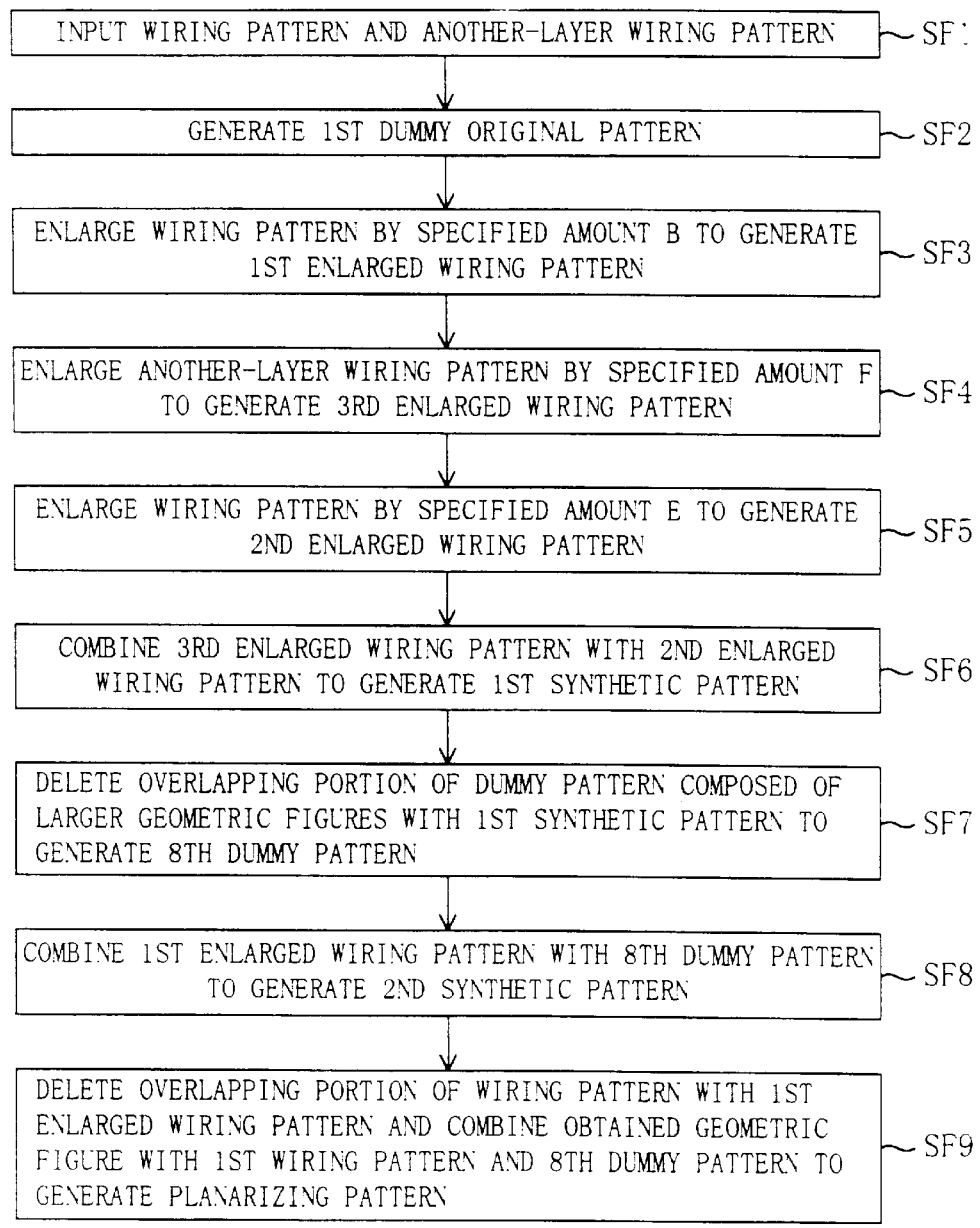
FIG. 34 is a flow chart showing a process in the method of generating a planarizing pattern according to the sixth embodiment.

A method of generating a planarizing pattern according to a fifth embodiment of the present invention will be described with reference to FIGS. 15(a) and 15(b), FIGS. 16(a) and 16(b), FIGS. 17(a) and 17(b), and the flow chart of FIG. 33, while a fifth apparatus for generating a planarizing pattern which is used in the method of generating a planarizing pattern according to the fifth embodiment will be described with reference to FIG. 39.

FIG. 15(a) shows a wiring pattern 50 as a first wiring pattern for generating a planarizing pattern and an another-layer wiring pattern 60 as a second wiring pattern formed in the wiring layer overlying or underlying the wiring pattern 50.

Figure 39:
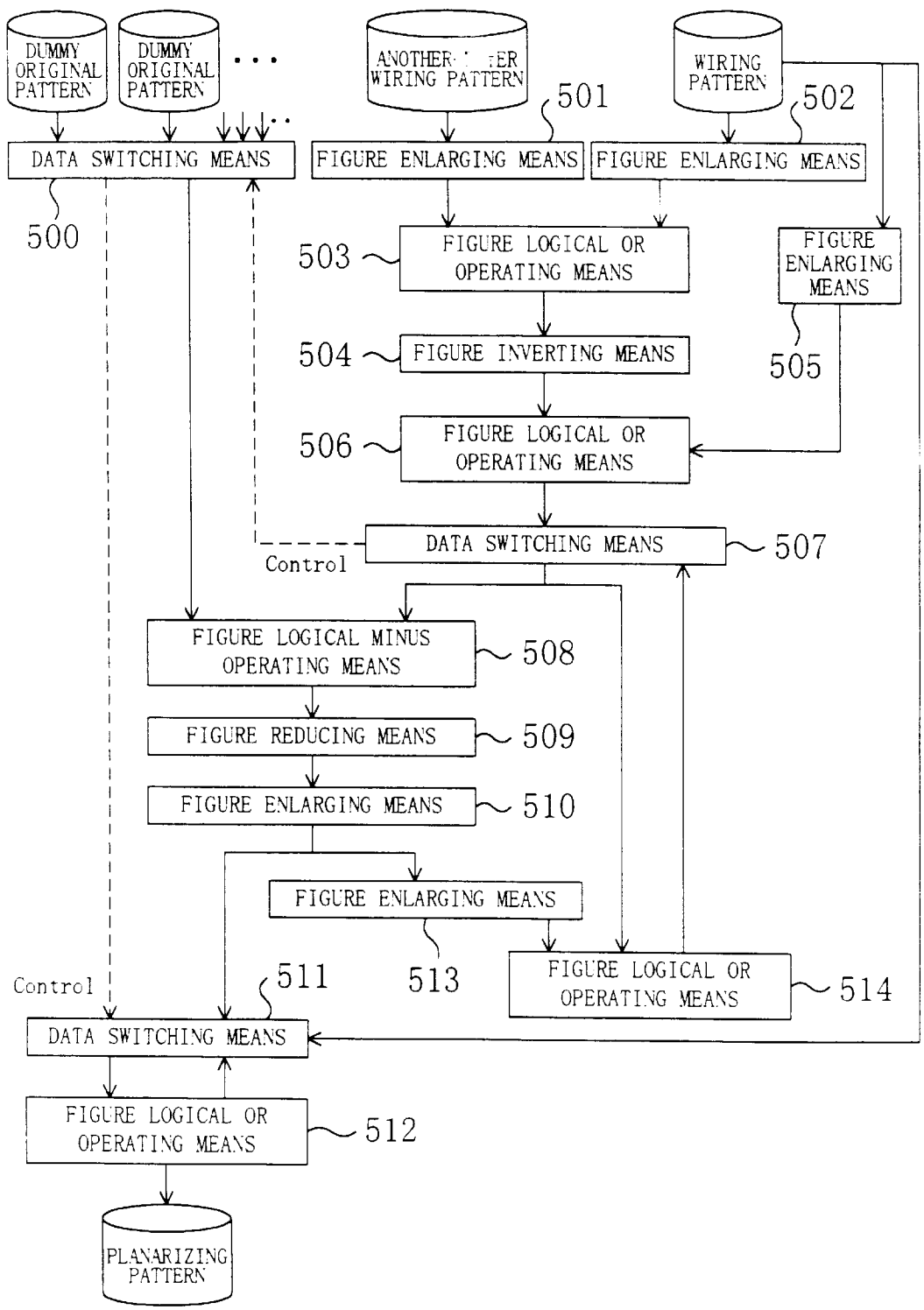
FIG. 39 is a block diagram of an apparatus for generating a fifth planarizing pattern which is used in the method of generating a planarizing pattern according to the fifth embodiment.

Although the first to fifth dummy original patterns 10 and 21 to 24 mentioned above are selectively outputted by a switching operation performed by data switching means 500 shown in FIG. 39 to be used properly, the fifth embodiment will describe the case where the first dummy original pattern 10 is used.

First, the wiring pattern 50 and the another-layer wiring pattern 60 are outputted in Step SE1. Then, the first dummy original pattern 10 is generated in Step SE2.

Next, in Step SE3, graphic enlarging means 501 shown in FIG. 39 enlarges the another-layer wiring pattern 60 by a specified amount F to generate a third enlarged wiring pattern 61 (numbered "third" for convenience since the first and second enlarged wiring patterns 51 and 52 mentioned above will be used again later). The third enlarged wiring pattern 61 corresponds to a region in which a planarizing pattern for suppressing an increase in parasitic capacitance in the another-layer wiring pattern 60 is to be generated. Hence, the specified amount F is set to such a value as to surely provide the region for suppressing the parasitic capacitance in the another-layer wiring pattern 60 by generating the planarizing pattern in the vicinity of the another-layer wiring pattern 60.

Next, in Step SE4, graphic enlarging means 502 shown in FIG. 39 generates the second enlarged wiring pattern 52 shown in FIG. 11(a), similarly to the third embodiment.

Next, in Step SE5, figure logical-OR operating means 503 shown in FIG. 39 performs figure logical-OR operation between the third enlarged wiring pattern 61 and the second enlarged wiring pattern 52 to generate a first synthetical pattern as shown in FIG. 16(a).

Next, in Step SE6, graphic inverting means 504 shown in FIG. 39 graphically inverts the first synthetical pattern shown in FIG. 16(a) to generate an inverted pattern 62 shown in FIG. 16(b).

Next, in Step SE7, graphic enlarging means 505 shown in FIG. 39 enlarges the wiring pattern 50 shown in FIG. 10(a) by a specified amount B, similarly to the third embodiment, to generate the first enlarged wiring pattern 51 shown in FIG. 10(b).

Next, in Step SE8, figure logical-OR operating means 506 shown in FIG. 39 performs figure logical-OR operation between the inverted pattern 62 and the first enlarged wiring pattern 51 shown in FIG. 10(a) to generate a second synthetical pattern shown in FIG. 17(a). The second synthetical pattern corresponds to a region in the vicinity of the wiring pattern 50 in which the placement of the planarizing pattern generated from the first dummy original pattern 10 is prohibited. The second synthetical pattern is outputted to figure logical-MINUS operating means 508 via data switching means 507 shown in FIG. 39.

Next, in the same Step SE8, the figure logical-MINUS operating means 508 shown in FIG. 39 performs figure logical-MINUS operation for deleting the overlapping portion of the first dummy original pattern 10 shown in FIG. 1(a) with the first enlarged wiring pattern 51. The geometric pattern obtained is outputted to figure logical-OR operating means 512 via graphic reducing means 509, graphic enlarging means 510, and data switching means 511 shown in FIG. 40.

Next, in Step SE9, the figure logical-OR operating means 512 shown in FIG. 39 performs figure logical-OR operation between the first wiring pattern 50, the inverted pattern 62, and the geometric pattern obtained by figure logical-MINUS operation for deleting the overlapping portion of the first dummy original pattern 10 shown in FIG. 1(a) with the first enlarged wiring pattern 51 to generate a final planarizing pattern as shown in FIG. 17(b).

Although the graphic reducing means 509, graphic enlarging means 510, graphic enlarging means 513, and figure logical-OR operating means 514 shown in FIG. 39 are not used in the fifth embodiment, they have similar functions to those of the graphic reducing means 204, graphic enlarging means 205, graphic enlarging means 207, and figure logical-OR operating means 208 shown in FIG. 35.

Thus, according to the fifth embodiment, the planarizing pattern composed of the indiscrete pattern corresponding to the inverted pattern 62 is formed in the region other than the vicinity of the wiring pattern 50 and other than the vicinity of the upper-layer or lower-layer wiring pattern 60. Hence, there can be achieved the reduction in the number of the figures composing the planarizing pattern and the reduction in the amount of data on the planarizing pattern simultaneously with the suppression of increased parasitic capacitance.

Sixth Embodiment

A method of generating a planarizing pattern according to a sixth embodiment of the present invention will be described with reference to FIGS. 18(a) and 18(b), FIG. 19, and the flow chart of FIG. 33, while a sixth apparatus for generating a planarizing pattern which is used in the method of generating a planarizing pattern according to the sixth embodiment will be described with reference to FIG. 40.

Figure 40:
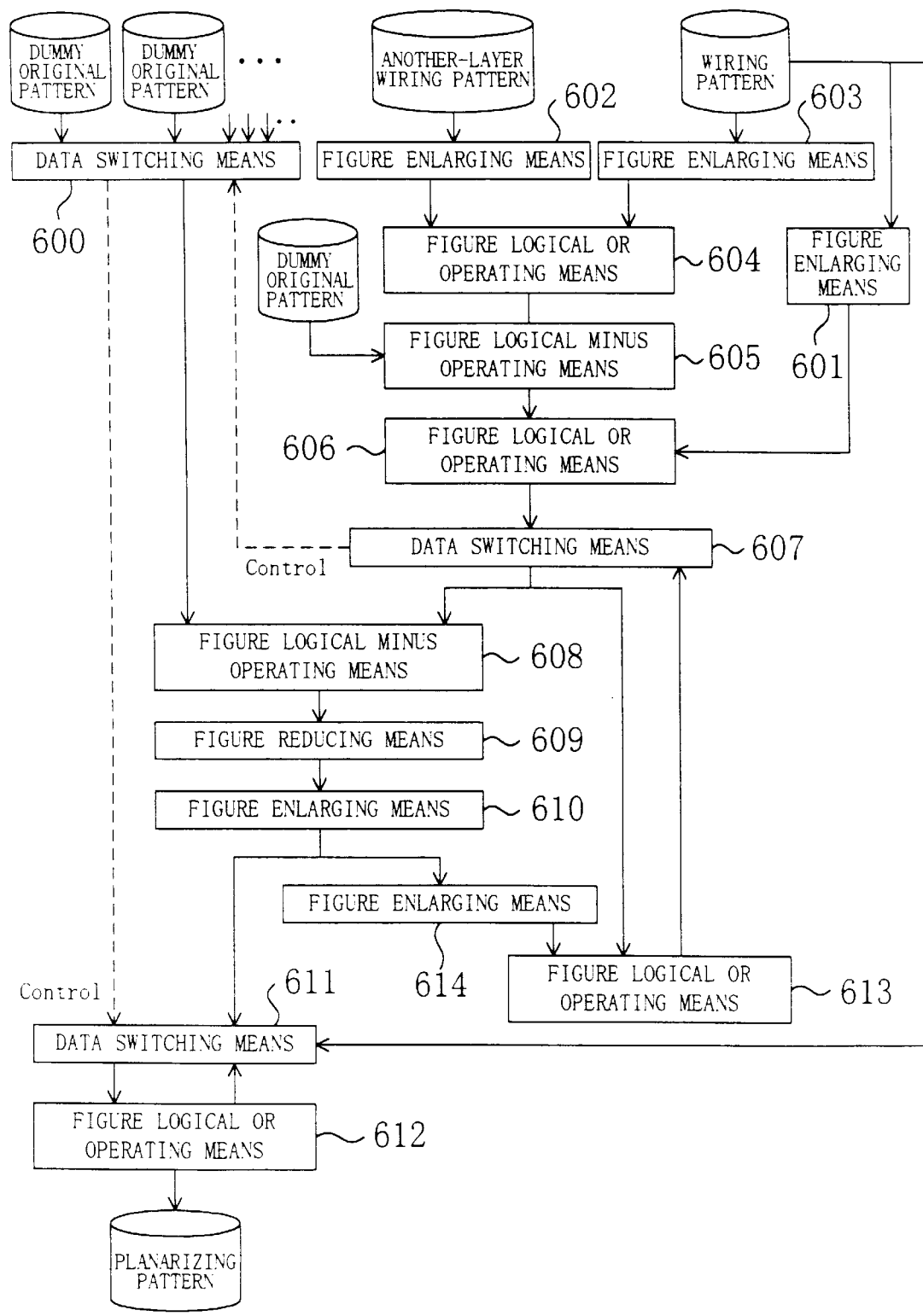
FIG. 40 is a block diagram of an apparatus for generating a sixth planarizing pattern which is used in the method of generating a planarizing pattern according to the sixth embodiment.
Figure 41A:
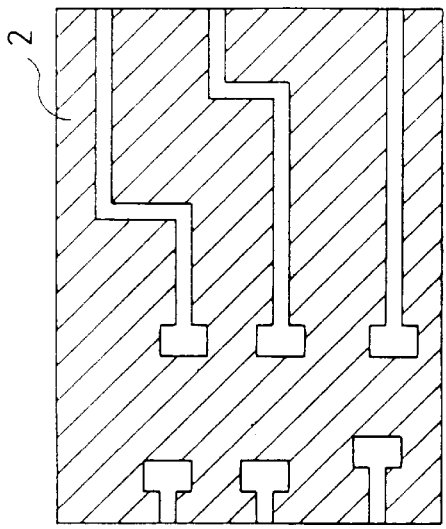
FIGS. 41(a) to 41(d) are plan views illustrating individual process steps in a conventional method of generating a planarizing pattern.
Figure 41B:
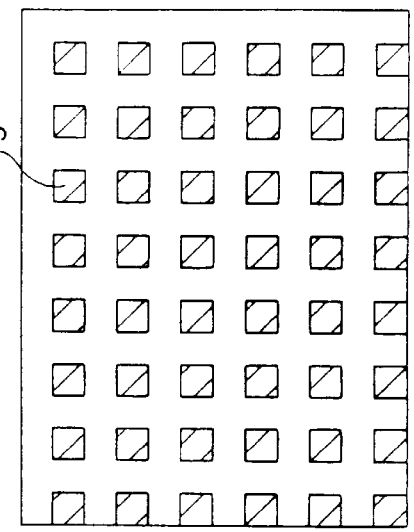
Figure 41C:
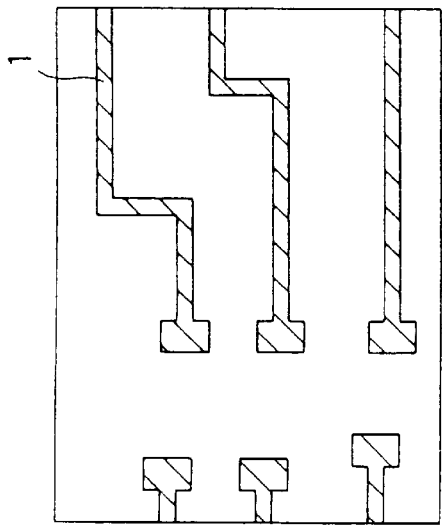
Figure 41D:
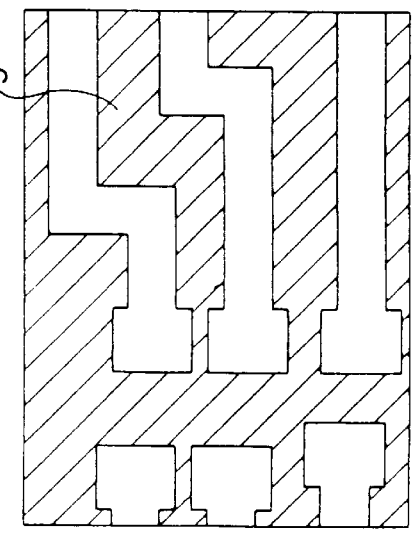
Figure 42B:
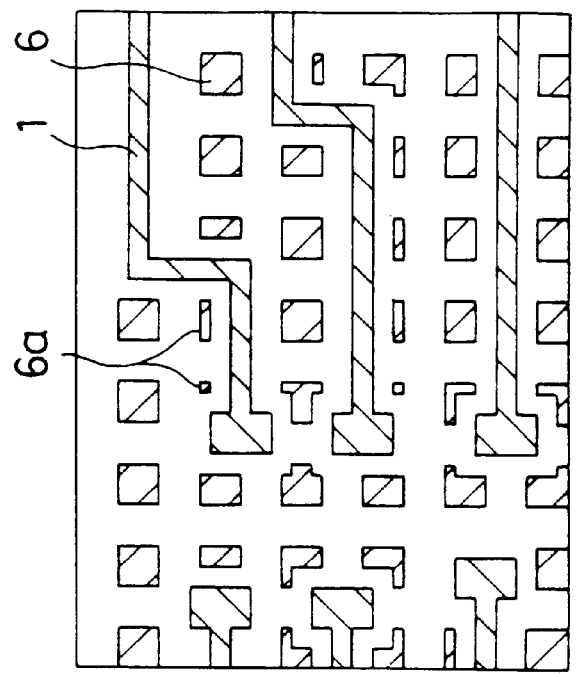
FIGS. 42(a) and 42(b) are plan views illustrating individual process steps in the conventional method of generating a planarizing pattern.
Figure 42A:
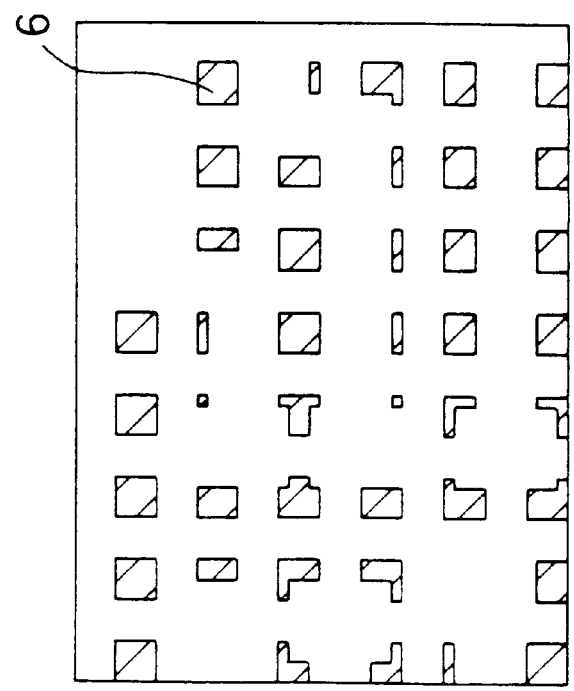

Although the first to fifth dummy original patterns 10 and 21 to 24 mentioned above are selectively outputted by a switching operation performed by data switching means 600 shown in FIG. 40 to be used properly, the sixth embodiment will describe the case where the first dummy original pattern 10 is used.

First, a wiring pattern 50 and an another-layer wiring pattern 60 are inputted in Step SF1. Then, a first dummy original pattern 10 is generated in Step SF2.

Next, in Step SF3, graphic enlarging means 601 shown in FIG. 40 enlarges the wiring pattern 50 shown in FIG. 10(a) by a specified amount B, similarly to the third embodiment, to generate a first enlarged wiring pattern 51 shown in FIG. 10(b).

Next, in Step SF4, graphic enlarging means 602 shown in FIG. 40 enlarges the another-layer wiring pattern 60, similarly to the fifth embodiment, to generate a third enlarged wiring pattern 61 shown in FIG. 15(b).

Next, in Step SF5, graphic enlarging means 603 shown in FIG. 40 enlarges the wiring pattern 50 by a specified amount E to generate a second enlarged wiring pattern 52 shown in FIG. 11(a), similarly to the third embodiment.

Next, in Step SF6, figure logical-OR operating means 604 shown in FIG. 40 performs graphic logical-OR operation between the third enlarged wiring pattern 61 and the second enlarged wiring pattern 52, similarly to the fifth embodiment, to generate a first synthetical pattern as shown in FIG. 16(a).

Next, in Step SF7, figure logical-MINUS operating means 605 shown in FIG. 40 performs figure logical-MINUS operation for deleting the overlapping portion of the dummy pattern 55 composed of the larger squares shown in FIG. 13(a) with the first synthetical pattern to generate an eighth dummy pattern 70 shown in FIG. 18(a).

Next, in Step SF8, figure logical-OR operating means 606 shown in FIG. 40 performs figure logical-OR operation between the first enlarged wiring pattern 51 shown in FIG. 10(b) and the eighth dummy pattern 70 shown in FIG. 18(a) to generate a second synthetical pattern shown in FIG. 18(b). The second synthetical pattern is outputted to figure logical-MINUS operating means 608 via data switching means 607 shown in FIG. 40.

Next, in Step SF9, the figure logical-MINUS operating means 608 shown in FIG. 40 performs figure logical-MINUS operation for deleting the overlapping portion of the wiring pattern 10 shown in FIG. 1(a) with the first enlarged wiring pattern 51. The geometric pattern obtained is outputted to figure logical-OR operating means 612 via graphic reducing means 609, graphic enlarging means 610, and data switching means 611 shown in FIG. 40.

Figure 19:
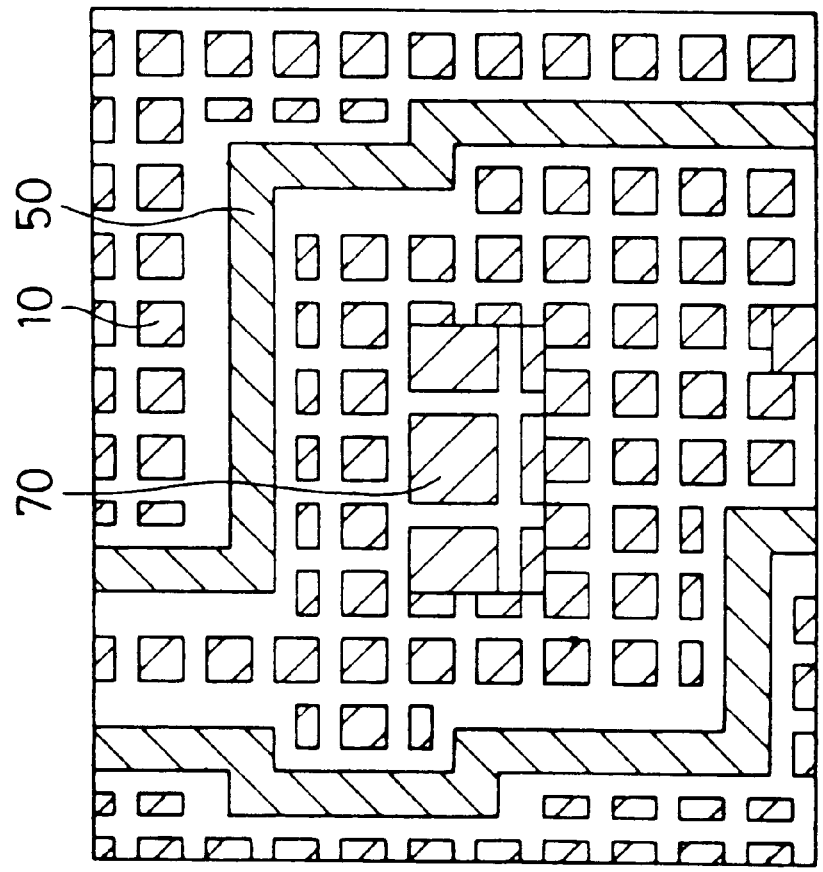
FIG. 19 is a plan view illustrating a process in the method of generating a planarizing pattern according to the sixth embodiment of the present invention.

Next, in the same Step SF9, the figure logical-OR operating means 612 shown in FIG. 40 performs figure logical-OR operation between the first wiring pattern 50, the eighth dummy pattern 70, and a geometric pattern obtained by figure logical-MINUS operation for deleting the overlapping portion of the wiring pattern 10 shown in FIG. 1(a) with the first enlarged wiring pattern 51 to generate a final planarizing pattern as shown in FIG. 19.

Although the graphic reducing means 609, graphic enlarging means 610, figure logical-OR operating means 613, and graphic enlarging means 614 shown in FIG. 40 are not used in the sixth embodiment, they have similar functions to those of the graphic reducing means 204, graphic enlarging means 205, figure logical-OR operating means 208, and graphic enlarging means 207 shown in FIG. 35.

Thus, according to the sixth embodiment, the planarizing pattern generated from the sixth dummy original pattern 55 composed of the simple geometric figures larger in size than the geometric figures composing the first dummy original pattern 55 is formed in the region other than the vicinity of the wiring pattern 50 and other than the vicinity of the upper-layer or lower-layer wiring pattern 60. Hence, there can be achieved the reduction in the number of the figures composing the planarizing pattern and the reduction in the amount of data on the planarizing pattern simultaneously with the suppression of increased parasitic capacitance.

Although the first to sixth embodiments described above have used squares as simple geometric figures, triangles, circles, polygons, stripes, or a grid-like array may be used instead.

Seventh Embodiment

A semiconductor integrated circuit device according to a seventh embodiment of the present invention will be described with reference to FIGS. 20(a) and 20(b).

Figure 20A:
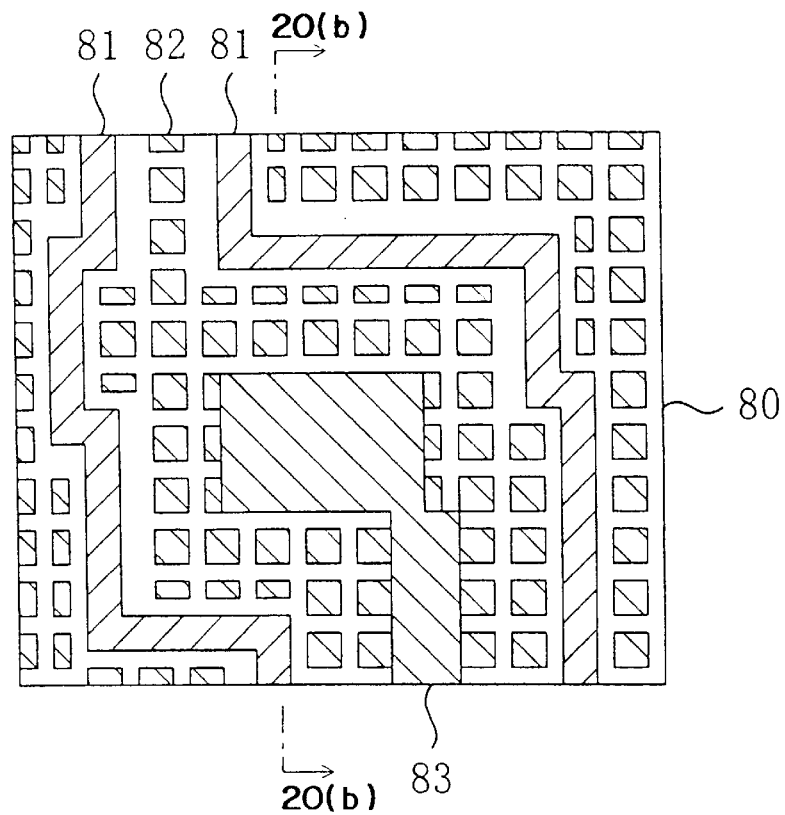
FIG. 20(a) is a plan view of a semiconductor integrated circuit device according to a seventh embodiment of the present invention and FIG. 20(b) is a cross-sectional view taken along the line X—X of FIG. 20(a)
Figure 20B:
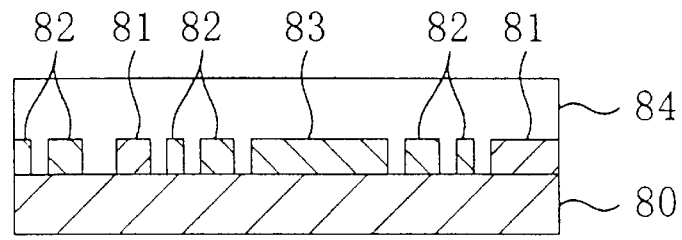

FIG. 20(a) shows a plan structure of the semiconductor integrated circuit device according to the seventh embodiment. FIG. 20(b) shows a cross-sectional structure of the semiconductor integrated circuit device taken along the line X—X of FIG. 20(a). The semiconductor integrated circuit device comprises: a wiring pattern 81 formed in a wiring layer on a semiconductor substrate 80; a first planarizing pattern 82 composed of a group of identical simple geometric figures, such as squares, and formed in a region of the wiring pattern lying at a first specified distance or further away from the wiring pattern 81 and at a second specified distance larger than the first specified distance from or closer to the wiring pattern 81 in the wiring layer; a second planarizing pattern 83 composed of an indiscrete geometric figure; and an interlayer insulating film 84 formed over the entire surfaces of the wiring pattern 81, the first planarizing pattern 82, and the second planarizing pattern 83. On the interlayer insulating film 84, there is formed an upper-layer wiring pattern, though the drawing thereof is omitted.

According to the seventh embodiment, the first and second planarizing patterns 82 and 83 are formed in the region of the wiring layer in which the wiring pattern 81 is not formed, so that the top surface of the interlayer insulating film 84 is substantially planarized. Moreover, since the second planarizing pattern 83 composed of the indiscrete geometric figure is formed in the region at the second specified distance or further away from the wiring pattern 81, the number of the geometric figures composing the planarizing pattern and the amount of data on the planarizing pattern can be suppressed compared with case where the first planarizing pattern 82 composed of the simple geometric figures is used.

A first method of manufacturing the semiconductor integrated circuit device according to the seventh embodiment will be described with reference to FIGS. 21(*a*) to 21(*c*), which correspond to a cross section taken along the line X—X of FIG. 20(*a*).

Figure 21A:
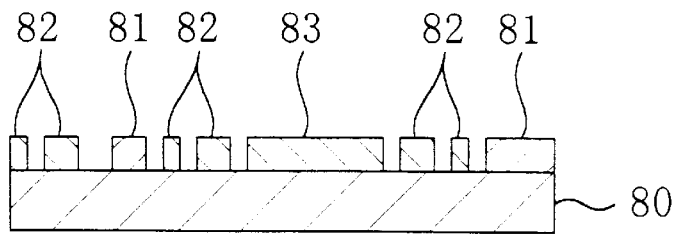
FIGS. 21(a) to 21(c) are cross-sectional views illustrating individual process steps in a first method of manufacturing the semiconductor integrated circuit device according to the seventh embodiment.
Figure 21B:
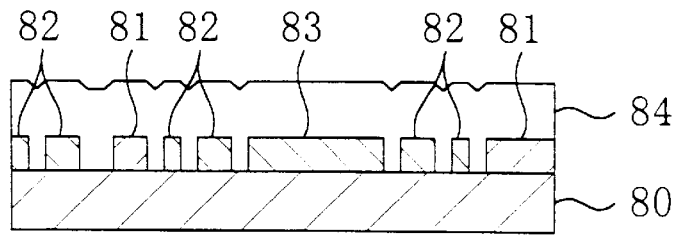
Figure 21C:
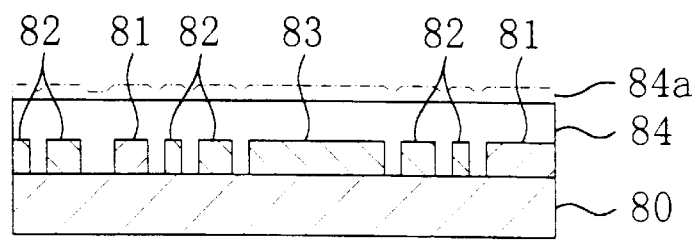
Figure 22A:
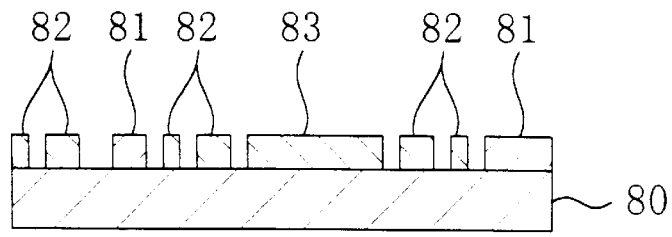
FIGS. 22(a) to 22(d) are cross-sectional views illustrating individual process steps in a second method of manufacturing the semiconductor integrated circuit device according to the seventh embodiment.
Figure 22B:
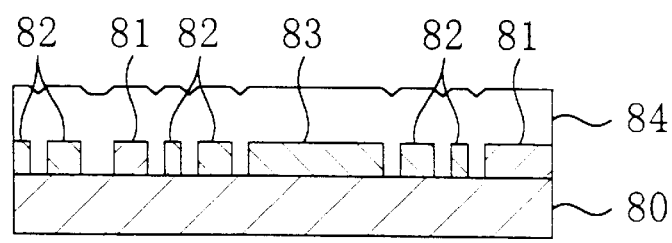
Figure 22C:
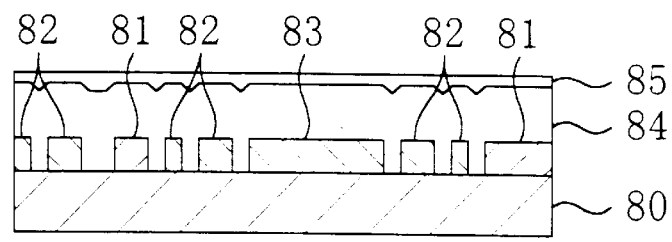
Figure 22D:
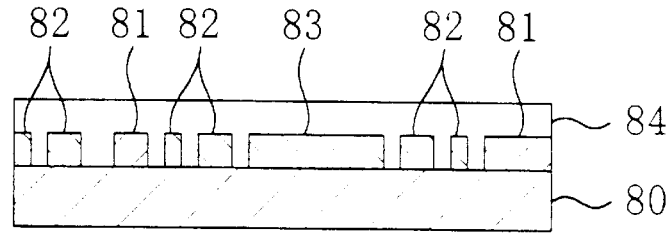
Figure 23A:
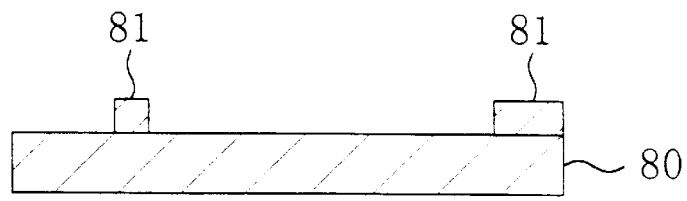
FIGS. 23(a) to 23(d) are cross-sectional views illustrating individual process steps in a third method of manufacturing the semiconductor integrated circuit device according to the seventh embodiment.
Figure 23B:
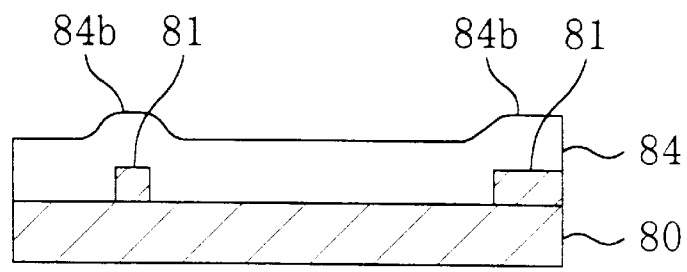
Figure 23C:
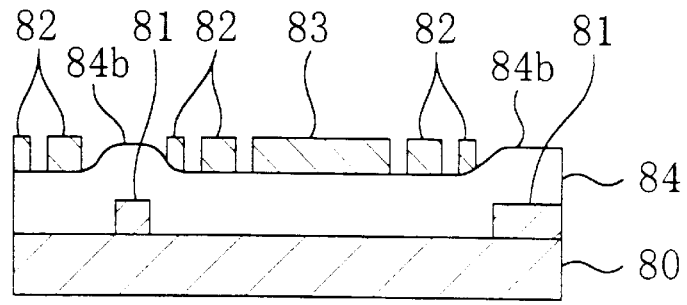
Figure 23D:
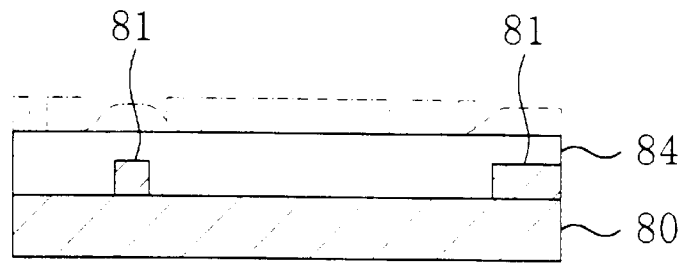
Figure 24A:
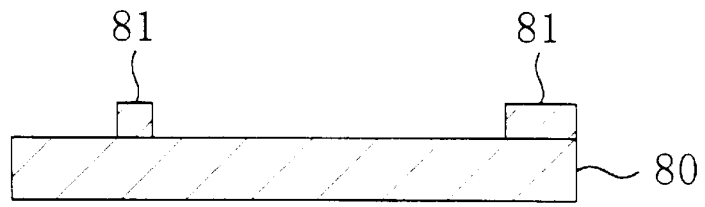
FIGS. 24(a) to 24(d) are cross-sectional views illustrating individual process steps in a fourth method of manufacturing the semiconductor integrated circuit device according to the seventh embodiment.
Figure 24B:
Figure 24C:
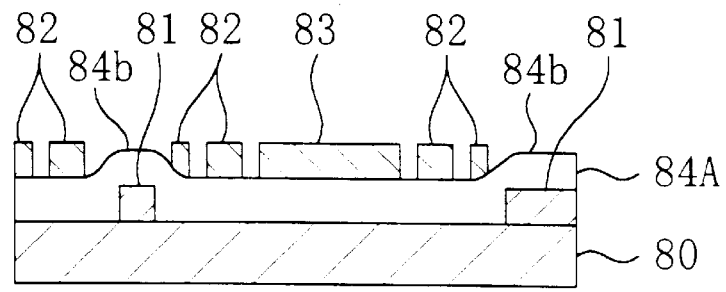
Figure 24D:
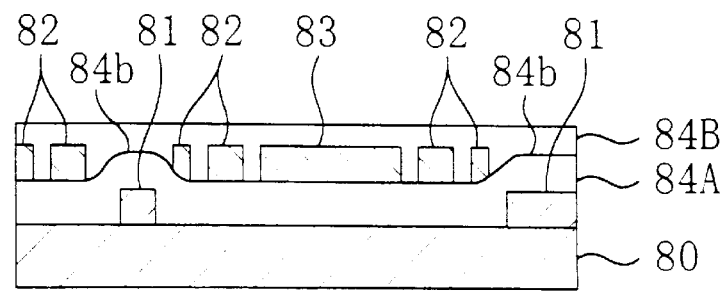

First, as shown in FIG. 21(*a*), the wiring pattern 81 is formed on the semiconductor substrate 80, while the first and second planarizing patterns 82 and 83 are formed in accordance with the method of generating a planarizing pattern of the third embodiment.

Next, as shown in FIG. 21(*b*), the interlayer insulating film 84 is formed over the entire surfaces of the wiring pattern 81, the first planarizing pattern 82, and the second planarizing pattern 83. Although the top surface of the interlayer insulating film 84 is substantially planarized as stated previously, it exhibits slight unevenness resulting from the presence or absence of the wiring pattern 81, first planarizing pattern 82, or second planarizing pattern 83 under the interlayer insulating film 84 when viewed microscopically.

Next, the upper portion 84a of the interlayer insulating film 84 is polished by using a CMP (Chemical Mechanical Polishing) apparatus to completely planarize the top surface of the interlayer insulating film 84, as shown in FIG. 21(*c*). Thereafter, the upper-layer wiring pattern is formed on the planarized interlayer insulating film 84, though the drawing thereof is omitted.

To evaluate the first method of manufacturing a semiconductor integrated circuit device according to the seventh embodiment, a conventional method of manufacturing a semiconductor integrated circuit device will be described for comparison with reference to FIGS. 43(*a*) to 43(*c*).

Figure 43A:
FIGS. 43(a) to 43(c) are cross-sectional views illustrating individual process steps in a conventional method of manufacturing a semiconductor integrated circuit device.
Figure 43B:
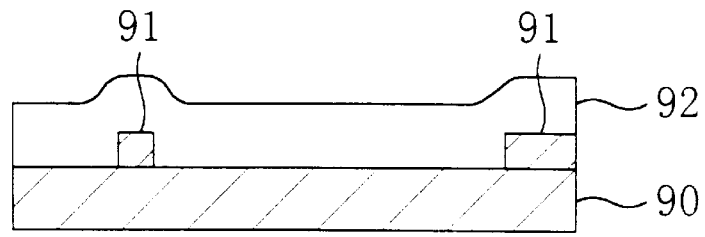
Figure 43C:
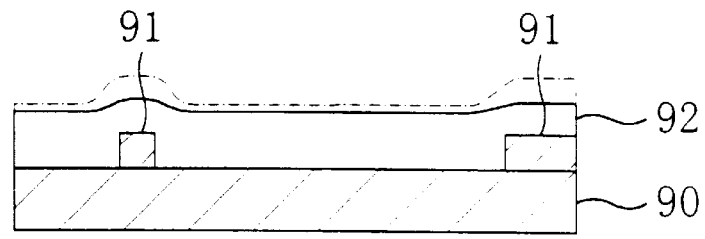

First, as shown in FIG. 43(*a*), a wiring pattern 91 is formed on a semiconductor substrate 90 and then an interlayer insulating film 92 is formed on the wiring pattern 91 as shown in FIG. 43(*b*). As a result, the top surface of the interlayer insulating film 92 exhibits conspicuous unevenness corresponding to the presence or absence of the wiring pattern 91. Thereafter, the surface portion 92a of the interlayer insulating film 92 is polished by using a CMP apparatus as shown in FIG. 43(*c*). Since the speed at which the interlayer insulating film 92 is polished varies depending on the presence or absence of the wiring pattern 91, unevenness remains on the top surface of the polished interlayer insulating film 92 despite the polishing process using the CMP apparatus.

By contrast, the first method of manufacturing the semiconductor integrated circuit device according to the seventh embodiment has substantially planarized the top surface of the interlayer insulating film 84 with the formation of the first and second planarizing patterns 82 and 83 in the wiring layer of the semiconductor substrate 80, so that the top surface of the interlayer insulating film 84 after the CMP process is completely planarized.

A second method of manufacturing the semiconductor integrated circuit device according to the seventh embodiment will be described with reference to FIGS. 22(*a*) to 22(*d*), which correspond to the cross section taken along the line X—X of FIG. 20(*a*).

First, as shown in FIG. 22(*a*), the wiring pattern 81 is formed on the semiconductor substrate 80, while the first and second planarizing patterns 82 and 83 are formed in accordance with the method of generating a planarizing pattern of the third embodiment.

Next, as shown in FIG. 22(*b*), the interlayer insulating film 84 is formed over the entire surfaces of the first and second planarizing patterns 82 and 83. Although the top surface of the interlayer insulating film 84 is substantially planarized as stated previously, it exhibits slight unevenness resulting from the presence or absence of the wiring pattern 81, first planarizing pattern 82, or second planarizing pattern 83 under the interlayer insulating film 84 when viewed microscopically.

Then, resin 85 with viscosity is applied onto the interlayer insulating film 84 to planarize the surface thereof.

Subsequently, the resin 85 and the upper portion of the interlayer insulating film 84 are removed by an etchback process to completely planarize the top surface of the interlayer insulating film 84. Thereafter, the upper-layer wiring pattern is formed on the planarized interlayer insulating film 84, though the drawing thereof is omitted.

A third method of manufacturing the semiconductor integrated circuit device according to the seventh embodiment will be described with reference to FIGS. 23(*a*) to 23(*d*), which correspond to the cross section taken along the line X—X of FIG. 20(*a*).

First, as shown in FIG. 23(*a*), the wiring pattern 81 is formed on the semiconductor substrate 80 and then the interlayer insulating film 84 is formed over the entire surface of the wiring pattern 81, as shown in FIG. 23(*b*). As a result, projections 84b are formed in the regions of the interlayer insulating film 84 overlying the wiring pattern 81.

Next, as shown in FIG. 23(*c*), the first and second planarizing patterns 82 and 83 made of a material different from the material of the wiring pattern 81 are formed on the interlayer insulating film 84 in accordance with the method of generating a planarizing pattern according to the third embodiment. Since the first and second planarizing patterns 82 and 83 are at first and second specified distances away from the wiring pattern 81, respectively, they are formed on the regions of the interlayer insulating film 84 in which the projections 84b are not formed.

Next, the first and second planarizing patterns 82 and 83 and the projections 84b of the interlayer insulating film 84 are polished by means of a CMP apparatus so that the top surface of the interlayer insulating film 84 is completely planarized, as shown in FIG. 22(*d*). Thereafter, the upper-layer wiring pattern is formed on the planarized interlayer insulating film 84, though the drawing thereof is omitted.

A fourth method of manufacturing the semiconductor integrated circuit device according to the seventh embodiment will be described with reference to FIGS. 24(*a*) to 24(*d*), which correspond to the cross section taken along the line X—X of FIG. 20(*a*).

First, as shown in FIG. 24(*a*), the wiring pattern 81 is formed on the semiconductor substrate 80 and then a lower interlayer insulating film 84A is formed over the entire surface of the wiring pattern 81, as shown in FIG. 24(*b*). As a result, the projections 84*b* are formed in the regions of the lower interlayer insulating film 84 overlying the wiring pattern 81.

Next, as shown in FIG. 24(*c*), the first and second planarizing patterns 82 and 83 are formed on the lower interlayer insulating film 84A in accordance with the method of generating a planarizing pattern according to the third embodiment. Since the first and second planarizing patterns 82 and 83 are at first and second specified distances away from the wiring pattern 81, respectively, they are formed in the regions of the lower interlayer insulating film 84A in which the projections 84*b* are not formed.

Next, an upper interlayer insulating film 84B is deposited over the entire surfaces of the first and second planarizing patterns 82 and 83 and the lower interlayer insulating film 84A. As a result, the top surface of the upper interlayer insulating film 84B is substantially planarized since the first and second planarizing patterns 82 and 83 are formed on the regions of the lower interlayer insulating film 84A in which the projections 84*b* are not formed.

Thereafter, the upper-layer wiring pattern is formed on the upper interlayer insulating film 84B substantially planarized, though the drawing thereof is omitted.

Eighth Embodiment

Figure 26:
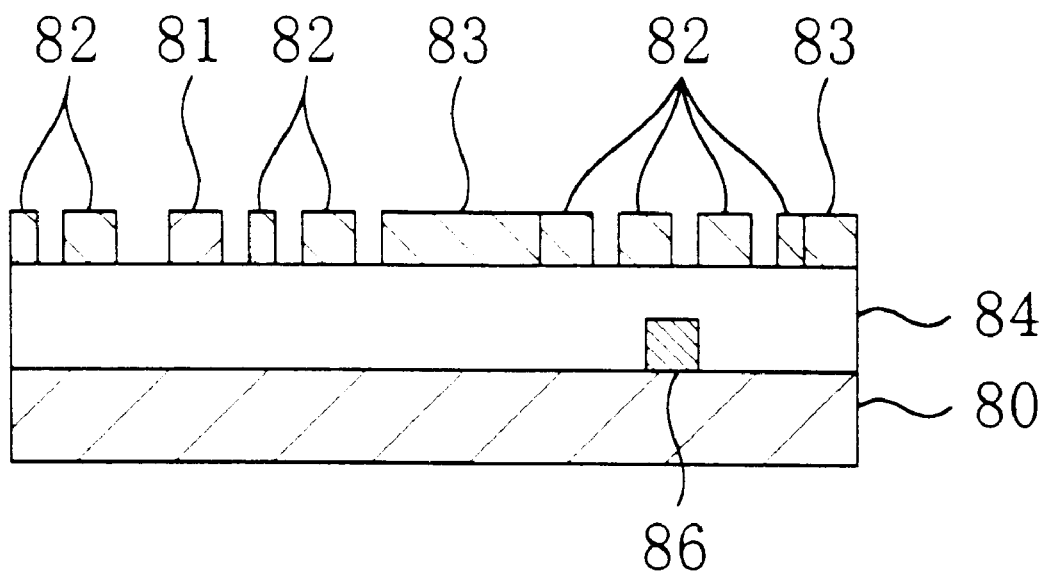
FIG. 26 is a cross-sectional view taken along the line Y—Y of FIG. 25 when a second wiring layer underlies a first wiring layer in the semiconductor integrated circuit device according to the eighth embodiment.
Figure 27:
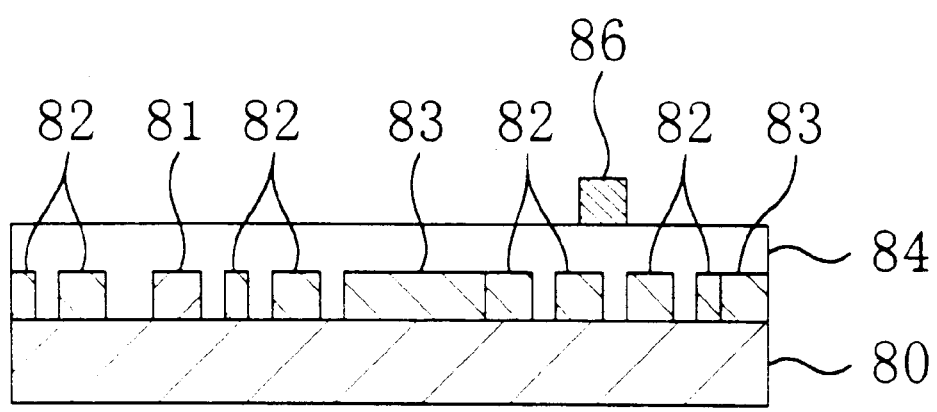
FIG. 27 is a cross-sectional view taken along the line Y—Y of FIG. 25 when the second wiring layer overlies the first wiring layer in the semiconductor integrated circuit device according to the eighth embodiment.

A semiconductor integrated circuit device according to an eighth embodiment of the present invention will be described with reference to FIGS. 25, 26, and 27.

Figure 25:
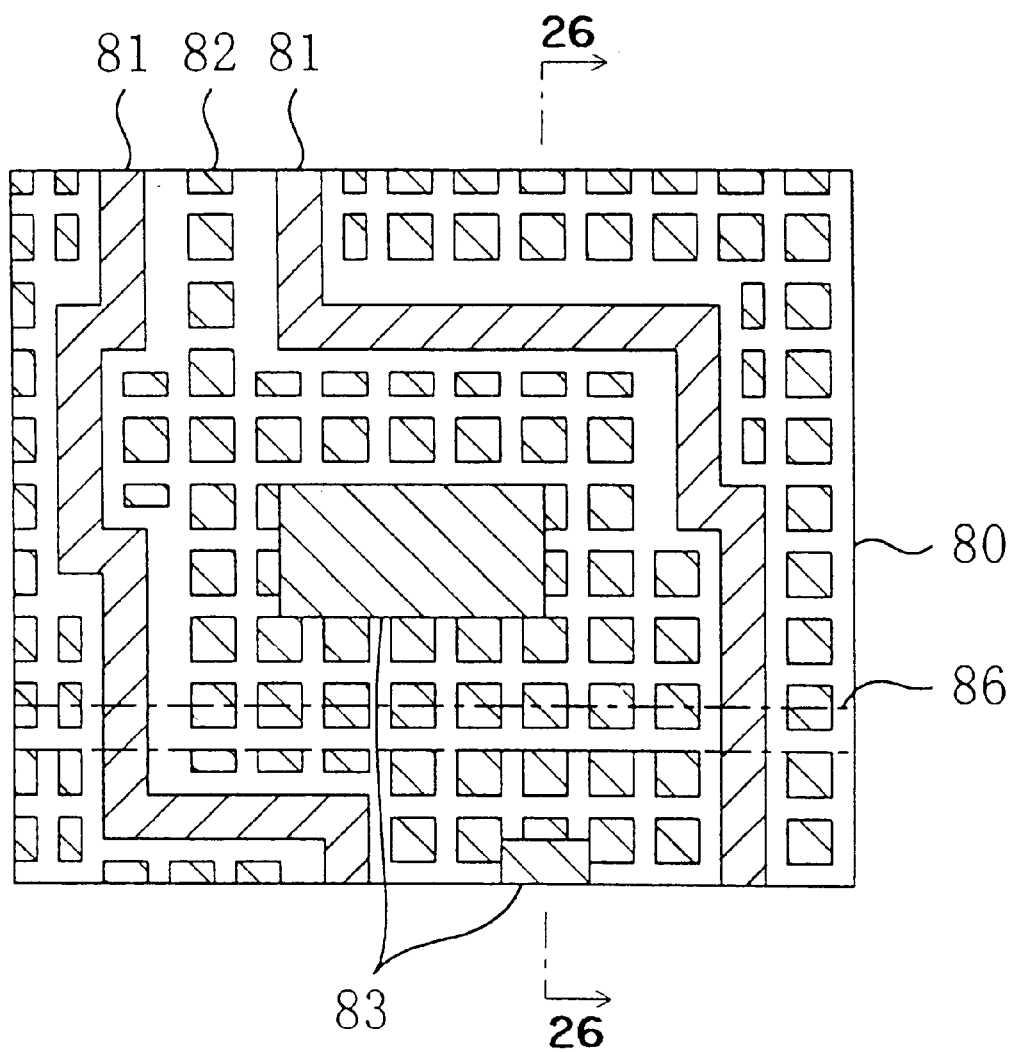
FIG. 25 is a plan view of a semiconductor integrated circuit device according to an eighth embodiment of the present invention.

FIG. 25 shows a plan structure of the semiconductor integrated circuit device according to the eighth embodiment, which comprises: a first wiring pattern 81 formed in a first wiring layer of a semiconductor substrate 80; and a second wiring pattern 85 formed in a second wiring layer overlying or underlying the first wiring layer. FIG. 26 shows a cross-sectional structure taken along the line Y—Y of FIG. 25 in the case where the second wiring layer underlies the first wiring layer. FIG. 27 shows a cross-sectional structure taken along the line Y—Y of FIG. 25 in the case where the second wiring layer overlies the first wiring layer.

In the region of the first wiring layer lying at a first specified distance or further away from the first wiring pattern 81, at a second specified distance larger than the first specified distance from or closer to the first wiring pattern 81, and at a third specified distance from or closer to the second wiring pattern 85, a first planarizing pattern 82 composed of a group of identical simple geometric figures is formed. In the region of the first wiring layer lying at the second specified distance or further away from the first wiring pattern 81 and at the third specified distance or further away from the second wiring pattern 85, a second planarizing pattern 83 composed of a plurality of geometric figures larger than the simple geometric figures is formed.

Between the first wiring pattern 81, first planarizing pattern 82, and second planarizing pattern 83 formed in the first wiring layer and the second wiring pattern 85 formed in the second wiring layer, there is formed an interlayer insulating film 84.

As for a method of manufacturing the semiconductor integrated circuit device according to the eighth embodiment, the description thereof is omitted since it is well known except for the process of forming the first and second planarizing patterns 82 and 83 in accordance with the method of generating a planarizing pattern of the fifth embodiment.

Although the methods of generating planarizing patterns according to the third and fifth embodiments have been used to manufacture the semiconductor integrated circuit devices according to the seventh and eighth embodiments, respectively, it will be appreciated that the planarizing patterns may be formed otherwise by properly using the methods of generating planarizing patterns according to the first to fifth embodiments.

We claim:

1. A method of generating a planarizing pattern, comprising:
    a dummy-pattern generating step of generating a dummy pattern composed of a group of identical simple geometric figures in a region of a wiring layer lying at a specified distance or further away from a wiring-pattern formation region of the wiring layer in which a wiring pattern is to be formed; and
    a planarizing-pattern generating step of reducing said dummy pattern and enlarging a geometric pattern left by reducing the dummy pattern to generate a planarizing pattern.

2. A method of generating a planarizing pattern according to claim 1, wherein
    said dummy-pattern generating step includes the steps of:
        enlarging said wiring pattern by a first specified amount to generate an enlarged wiring pattern;
        consecutively placing said simple geometric figures to generate a dummy original pattern; and
        generating said dummy pattern by figure logical-MINUS operation for deleting an overlapping portion of said dummy original pattern with said enlarged wiring pattern and
    said planarizing-pattern generating step includes the steps of:
        reducing said dummy pattern by a second specified amount to generate a reduced dummy pattern; and
        enlarging said reduced dummy pattern by said second specified amount to generate said planarizing pattern.

3. A method of generating a planarizing pattern according to claim 1, wherein
    said dummy-pattern generating step includes the steps of:
        graphically inverting said wiring pattern to generate an inverted wiring pattern;
        reducing said inverted wiring pattern by a first specified amount to generate a reduced inverted wiring pattern;
        consecutively placing said simple geometric figures to generate a dummy original pattern; and
        generating said dummy pattern by figure logical-AND operation for leaving only an overlapping portion of said dummy original pattern with said reduced inverted wiring pattern and
    said planarizing-pattern generating step includes the steps of:
        reducing said dummy pattern by a second specified amount to generate a reduced dummy pattern; and
        enlarging said reduced dummy pattern by said second specified amount to generate said planarizing pattern.

4. A method of generating a planarizing pattern, comprising:
    a first-dummy-pattern generating step of generating a first dummy pattern composed of a group of identical simple geometric figures in a region of a wiring layer lying at a first specified distance or further away from a wiring-pattern formation region of said wiring layer in which a wiring pattern is to be formed;

a second-dummy-pattern generating step of reducing said first dummy pattern and enlarging a geometric pattern left by reducing the first dummy pattern to generate a second dummy pattern;

a third-dummy-pattern generating step of generating a third dummy pattern composed of said group of simple geometric figures that have been parallel-shifted in a region of said wiring layer lying at said first specified distance or further away from said wiring-pattern formation region and at a second specified distance or further away from said first dummy pattern;

a fourth-dummy-pattern generating step of reducing said third dummy pattern and enlarging a geometric pattern left by reducing the third dummy pattern to generate a fourth dummy pattern; and a planarizing-pattern generating step of combining said second dummy pattern with said fourth dummy pattern to generate a planarizing pattern.

5. A method of generating a planarizing pattern according to claim 4, wherein said first-dummy-pattern generating step includes the steps of:
  enlarging said wiring pattern by a first specified amount to generate an enlarged wiring pattern;
  consecutively placing said simple geographic figures in said wiring layer to generate a first dummy original pattern; and
  generating said first dummy pattern by figure logical-MINUS operation for deleting an overlapping portion of said first dummy original pattern with said enlarged wiring pattern, said second-dummy-pattern generating step includes the steps of:
  reducing said first dummy pattern by a second specified amount to generate a first reduced dummy pattern; and
  enlarging said first reduced dummy pattern by said second specified amount to generate said second dummy pattern, said third-dummy-pattern generating step includes the steps of:
  parallel-shifting the simple geometric figures composing said first dummy original pattern to generate a second dummy original pattern;
  enlarging said second dummy pattern by a third specified amount to generate an enlarged dummy pattern; and
  generating said third dummy pattern by figure logical-MINUS operation for deleting an overlapping portion of said second dummy original pattern with said enlarged wiring pattern and with said enlarged dummy pattern, said fourth-dummy-pattern generating step includes the steps of:
  reducing said third dummy pattern by a fourth specified amount to generate a second reduced dummy pattern; and
  enlarging said second reduced dummy pattern by said fourth specified amount to generate said fourth dummy pattern, and said planarizing-pattern generating step includes the step of
  generating said planarizing pattern by figure logical-OR operation for combining said second dummy pattern with said fourth dummy pattern.

6. A method of generating a planarizing pattern, comprising:

a first-dummy-pattern generating step of generating a first dummy pattern composed of a group of identical simple geometric figures in a region of a wiring layer lying at a first specified distance or further away from a wiring-pattern formation region of said wiring layer in which a wiring pattern is to be formed and at a second specified distance from or closer to said wiring-pattern formation region, said second specified distance being larger than said first specified distance;

a second-dummy-pattern generating step of generating a second dummy pattern composed of at least one geometric Figure. larger than said simple geometric figure in a region of said wiring layer lying at said second specified distance or further away from said wiring-pattern formation region; and a planarizing-pattern generating step of combining said first dummy pattern with said second dummy pattern to generate a planarizing pattern.

7. A method of generating a planarizing pattern according to claim 6, wherein said first-dummy-pattern generating step includes the steps of:
  enlarging said wiring pattern by a first specified amount to generate a first enlarged wiring pattern;
  enlarging said wiring pattern by a second specified amount larger than said first specified amount to generate a second enlarged wiring pattern;
  inverting said second enlarged wiring pattern to generate an inverted pattern;
  consecutively placing said simple geometric figures to generate a dummy original pattern; and
  generating said first dummy pattern by figure logical-MINUS operation for deleting an overlapping portion of said dummy original pattern with said first enlarged wiring pattern and with said inverted pattern, said second-dummy-pattern generating step includes the step of
  generating said second dummy pattern composed of said inverted pattern, and said planarizing-pattern generating step includes the step of
  generating said planarizing pattern by figure logical-OR operation for combining said first dummy pattern with said second dummy pattern.

8. A method of generating a planarizing pattern according to claim 6, wherein said first-dummy-pattern generating step includes the steps of:
  enlarging said wiring pattern by a first specified amount to generate an enlarged wiring pattern;
  inverting said wiring pattern to generate an inverted pattern;
  reducing said inverted pattern by a second specified amount larger than said first specified amount to generate a reduced inverted pattern;
  consecutively placing said simple geometric figures to generate a dummy original pattern; and
  generating said first dummy pattern by figure logical-MINUS operation for deleting an overlapping portion of said dummy original pattern with said enlarged wiring pattern and with said reduced inverted pattern, said second-dummy-pattern generating step includes the step of
  generating said second dummy pattern composed of said reduced inverted pattern, and said planarizing-pattern generating step includes the step of generating said planarizing pattern by figure logical-OR operation for combining said first dummy pattern with said second dummy pattern.

9. A method of generating a planarizing pattern according to claim 6, wherein said first-dummy-pattern generating step includes the steps of:

enlarging said wiring pattern by a first specified amount to generate a first enlarged wiring pattern;

enlarging said wiring pattern by a second specified amount larger than said first specified amount to generate a second enlarged wiring pattern;

inverting said second enlarged wiring pattern to generate a first inverted pattern;

reducing said first inverted pattern by a third specified amount to generate a reduced inverted pattern;

enlarging said reduced inverted pattern by said third specified amount to generate a second inverted pattern;

consecutively placing said simple geometric figures to generate a dummy original pattern; and generating said first dummy pattern by figure logical-MINUS operation for deleting an overlapping portion of said dummy original pattern with said first enlarged wiring pattern and with said second inverted pattern, said second-dummy-pattern generating step includes the step of generating said second dummy pattern composed of said second inverted pattern, and said planarizing-pattern generating step includes the step of generating said planarizing pattern by figure logical-OR operation for combining said first dummy pattern with said second dummy pattern.

10. A method of generating a planarizing pattern, comprising:

a first-dummy-pattern generating step of generating a first dummy pattern composed of a group of first identical simple geometric figures in a region of a wiring layer lying at a first specified distance or further away from a wiring-pattern formation region of said wiring layer in which a wiring pattern is to be formed and at a second specified distance from or closer to said wiring-pattern formation region, said second specified distance being larger than said first specified distance;

a second-dummy-pattern generating step of generating a second dummy pattern composed of a group of second identical simple geometric figures larger than said first simple geometric figures in a region of said wiring layer lying at said second specified distance or further away from said wiring-pattern formation region; and a planarizing-pattern generating step of combining said first dummy pattern with said second dummy pattern to generate a planarizing pattern.

11. A method of generating a planarizing pattern according to claim 10, wherein said first-dummy-pattern generating step includes the steps of:

enlarging said wiring pattern by a first specified amount to generate a first enlarged wiring pattern;

enlarging said wiring pattern by a second specified amount larger than said first specified amount to generate a second enlarged wiring pattern;

inverting said second enlarged wiring pattern to generate an inverted pattern;

consecutively placing said first simple geometric figures to generate a first dummy original pattern; and generating said first dummy pattern by figure logical-MINUS operation for deleting an overlapping portion of said first dummy original pattern with said first enlarged wiring pattern and with said inverted pattern, said second-dummy-pattern generating step includes the steps of:

consecutively placing said second simple geometric figures to generate a second dummy original pattern; and generating said second dummy pattern by figure logical-AND operation for leaving only an overlapping portion of said second dummy original pattern with said inverted pattern, and said planarizing-pattern generating step includes the step of generating said planarizing pattern by figure logical-OR operation for combining said first dummy pattern with said second dummy pattern.

12. A method of generating a planarizing pattern, comprising:

a first-dummy-pattern generating step of generating a first dummy pattern composed of a group of identical simple geometric figures in a region of a first wiring layer lying at a first specified distance or further away from a first-wiring-pattern formation region of said first wiring layer in which a first wiring pattern is to be formed, at a second specified distance from or closer to said first-wiring-pattern formation region, said second specified distance being larger than said first specified distance, and at a third specified distance from or closer to a second-wiring-pattern formation region of a second wiring layer overlying or underlying said first wiring layer in which a second wiring pattern is to be formed;

a second-dummy-pattern generating step of generating a second dummy pattern composed of at least one geometric figure larger than said simple geometric figure in a region of said first wiring layer lying at said second specified distance or further away from said first-wiring-pattern formation region and at said third specified distance from or further away from said second-wiring-pattern formation region; and a planarizing-pattern generating step of combining said first dummy pattern with said second dummy pattern to generate a planarizing pattern.

13. A method of generating a planarizing pattern according to claim 12, wherein said first-dummy-pattern generating step includes the steps of:

enlarging said first wiring pattern by a first specified amount to generate a first enlarged wiring pattern;

enlarging said second wiring pattern by a second specified amount to generate a second enlarged wiring pattern;

generating a synthetical pattern by figure logical-OR operation for combining said first enlarged wiring pattern with said second enlarged wiring pattern;

inverting said synthetical pattern to generate an inverted pattern;

consecutively placing said simple geometric figures to generate a dummy original pattern; and generating said first dummy pattern by figure logical-MINUS operation for deleting an overlapping portion of said dummy original pattern with said first enlarged wiring pattern and with said inverted pattern, said second-dummy-pattern generating step includes the step of generating said second dummy pattern composed of said inverted pattern, and said planarizing-pattern generating step includes the step of generating said planarizing pattern by figure logical-OR operation for combining said first dummy pattern with said second dummy pattern.

14. A method of generating a planarizing pattern, comprising:

a first-dummy-pattern generating step of generating a first dummy pattern composed of a group of first identical simple geometric figures in a region of a first wiring layer lying at a first specified distance or further away from a first-wiring-pattern formation region of said first wiring layer in which a first wiring pattern is to be formed, at a second specified distance from or closer to said first-wiring-pattern formation region, and at a third specified distance from or closer to a second-wiring-pattern formation region of a second wiring layer overlying or underlying said first wiring layer in which a second wiring pattern is to be formed;

a second-dummy-pattern generating step of generating a second dummy pattern composed of a group of second identical simple geometric figures larger than said first simple geometric figures in a region of said first wiring layer lying at said second specified distance or further away from said first-wiring-pattern formation region and at said third specified distance or further away from said second-wiring-pattern formation region; and a planarizing-pattern generating step of combining said first dummy pattern with said second dummy pattern to generate a planarizing pattern.

15. A method of generating a planarizing pattern according to claim 14, wherein said first-dummy-pattern generating step includes the steps of:

enlarging said first wiring pattern by a first specified amount to generate a first enlarged wiring pattern;

enlarging said second wiring pattern by a second specified amount to generate a second enlarged wiring pattern;

generating a synthetical pattern by figure logical-OR operation for combining said first enlarged wiring pattern with said second enlarged wiring pattern;

inverting said synthetical pattern to generate an inverted pattern;

consecutively placing said first simple geometric figures to generate a first dummy original pattern; and generating said first dummy pattern by figure logical-MINUS operation for deleting an overlapping portion of said first dummy original pattern with said first enlarged wiring pattern and with said inverted pattern, said second-dummy-pattern generating step includes the steps of:

consecutively placing said second simple geometric figures to generate a second dummy original pattern; and generating said second dummy pattern by figure logical-AND operation for leaving only an overlapping portion of said second dummy original pattern with said inverted pattern, and said planarizing-pattern generating step includes the step of generating said planarizing pattern by figure logical-OR operation for combining said first dummy pattern with said second dummy pattern.

16. An apparatus for generating a planarizing pattern, comprising:

first graphic enlarging means for enlarging a wiring pattern in a wiring layer by a first specified amount to generate an enlarged wiring pattern;

dummy-original-pattern generating means for consecutively placing identical simple geometric figures to generate a dummy original pattern;

figure logical-MINUS operating means for deleting an overlapping portion of said dummy original pattern with said enlarged wiring pattern to generate a dummy pattern;

graphic reducing means for reducing said dummy pattern by a second specified amount to generate a reduced dummy pattern; and second graphic enlarging means for enlarging said reduced dummy pattern by said second specified amount to generate a planarizing pattern.

17. An apparatus for generating a planarizing pattern, comprising:

first graphic enlarging means for enlarging a wiring pattern in a wiring layer by a first specified amount to generate an enlarged wiring pattern;

first-dummy-original-pattern generating means for consecutively placing identical simple geometric figures to generate a first dummy original pattern;

figure logical-MINUS operating means for deleting an overlapping portion of said first dummy original pattern with said enlarged wiring pattern to generate a first dummy pattern;

first graphic reducing means for reducing said first dummy pattern by a second specified amount to generate a first reduced dummy pattern;

second graphic enlarging means for enlarging said first reduced dummy pattern by said second specified amount to generate a second dummy pattern;

second-dummy-original-pattern generating means for parallel-shifting the simple geometric figures composing said first dummy original pattern to generate a second dummy original pattern;

third graphic enlarging means for enlarging said second dummy pattern by a third specified amount to generate an enlarged dummy pattern;

figure logical-MINUS operating means for deleting an overlapping portion of said second dummy original pattern with said enlarged wiring pattern and with said enlarged dummy pattern to generate a third dummy pattern;

second graphic reducing means for reducing said third dummy pattern by a fourth specified amount to generate a second reduced dummy pattern;

fourth graphic enlarging means for enlarging said second reduced dummy pattern by said fourth specified amount to generate a fourth dummy pattern; and figure logical-OR operating means for combining said second dummy pattern with said fourth dummy pattern to generate a planarizing pattern.

18. An apparatus for generating a planarizing pattern, comprising:

first graphic enlarging means for enlarging a wiring pattern in a wiring layer by a first specified amount to generate a first enlarged wiring pattern;

second graphic enlarging means for enlarging said wiring pattern by a second specified amount larger than said first specified amount to generate a second enlarged wiring pattern;

graphic inverting means for inverting said second enlarged wiring pattern to generate an inverted pattern;

dummy-original-pattern generating means for consecutively placing identical simple geometric figures in said wiring layer to generate a dummy original pattern;

figure logical-MINUS operating means for deleting an overlapping portion of said dummy original pattern with said first enlarged wiring pattern and with said inverted pattern to generate a dummy pattern; and figure logical-OR operating means for combining said dummy pattern with said inverted pattern to generate a planarizing pattern.

19. An apparatus for generating a planarizing pattern, comprising:

first graphic enlarging means for enlarging a wiring pattern in a wiring layer by a first specified amount to generate a first enlarged wiring pattern;

second graphic enlarging means for enlarging said wiring pattern by a second specified amount larger than said first specified amount to generate a second enlarged wiring pattern;

graphic inverting means for inverting said second enlarged wiring pattern to generate an inverted pattern;

first-dummy-original-pattern generating means for consecutively placing first identical simple geometric figures to generate a first dummy original pattern;

figure logical-MINUS operating means for deleting an overlapping portion of said first dummy original pattern with said first enlarged wiring pattern and with said inverted pattern to generate a first dummy pattern;

second-dummy-original-pattern generating means for consecutively placing second identical simple geometric figures larger than said first simple geometric figures to generate a second dummy original pattern;

figure logical-AND operating means for leaving only an overlapping portion of said second dummy original pattern with said inverted pattern to generate a second dummy pattern; and figure logical-OR operating means for combining said first dummy pattern with said second dummy pattern to generate a planarizing pattern.

20. An apparatus for generating a planarizing pattern, comprising:

first graphic enlarging means for enlarging a first wiring pattern in a first wiring layer by a first specified amount to generate a first enlarged wiring pattern;

second graphic enlarging means for enlarging a second wiring pattern in a second wiring layer overlying or underlying said first wiring layer by a second specified amount to generate a second enlarged wiring pattern;

figure logical-OR operating means for combining said first enlarged wiring pattern with said second enlarged wiring pattern to generate a synthetical pattern;

graphic inverting means for inverting said synthetical pattern to generate an inverted pattern;

dummy-original-pattern generating means for consecutively placing identical simple geometric figures to generate a dummy original pattern;

figure logical-MINUS operating means for deleting an overlapping portion of said dummy original pattern with said first enlarged wiring pattern and with said inverted pattern to generate a first dummy pattern; and figure logical-OR operating means for combining said first dummy pattern with said inverted pattern to generate a planarizing pattern.

21. An apparatus for generating a planarizing pattern, comprising:

first graphic enlarging means for enlarging a first wiring pattern in a first wiring layer by a first specified amount to generate a first enlarged wiring pattern;

second graphic enlarging means for enlarging a second wiring pattern in a second wiring layer overlying or underlying said first wiring layer by a second specified amount to generate a second enlarged wiring pattern;

figure logical-OR operating means for combining said first enlarged wiring pattern with said second enlarged wiring pattern to generate a synthetical pattern;

graphic inverting means for inverting said synthetical pattern to generate an inverted pattern;

first-dummy-original-pattern generating means for consecutively placing first identical simple geometric figures to generate a first dummy original pattern;

figure logical-MINUS operating means for deleting an overlapping portion of said first dummy original pattern with said first enlarged wiring pattern and with said inverted pattern to generate a first dummy pattern;

second-dummy-original-pattern generating means for consecutively placing second identical simple geometric figures larger than said first simple geometric figures to generate a second dummy original pattern;

figure logical-AND operating means for leaving only an overlapping portion of said second dummy original pattern with said inverted pattern to generate a second dummy pattern; and figure logical-OR operating means for combining said first dummy pattern with said second dummy pattern to generate a planarizing pattern.

22. A semiconductor integrated circuit device comprising:

a wiring pattern formed in a wiring layer on a semiconductor substrate;

a first planarizing pattern composed of a group of identical simple geometric figures and formed in a region of said wiring layer lying at a first specified distance or further away from said wiring pattern and at a second specified distance from or closer to said wiring pattern, said second specified distance being larger than said first specified distance;

a second planarizing pattern composed of at least one geometric figure larger than said simple geometric figure and formed in a region of said wiring layer lying at said second specified distance or further away from said wiring pattern; and an interlayer insulating film formed over said wiring pattern, said first planarizing pattern, and said second planarizing pattern.

23. A semiconductor integrated circuit device comprising:

a first wiring pattern formed in a first wiring layer on a semiconductor substrate;

a second wiring pattern formed in a second wiring layer overlying or underlying said first wiring layer on said semiconductor substrate;

a first planarizing pattern composed of a group of identical simple geometric figures and formed in a region of said first wiring layer lying at a first specified distance or further away from said first wiring pattern, at a second specified distance from or closer to said first wiring pattern, said second specified distance being larger than said first specified distance, and at a third specified distance from or closer to said second wiring pattern;

a second planarizing pattern composed of at least one geometric figure larger than said simple geometric figure and formed in a region of said first wiring layer lying at said second specified distance or further away from said first wiring pattern and at said third specified distance or further away from said second wiring pattern; and an interlayer insulating film formed between said first wiring pattern, said first planarizing pattern, and said second planarizing pattern each formed in said first wiring layer and said second wiring pattern formed in said second wiring layer.

* * * * *